United States Patent
Yamazaki

(10) Patent No.: US 10,050,152 B2
(45) Date of Patent: Aug. 14, 2018

(54) TRANSISTOR, SEMICONDUCTOR DEVICE, AND ELECTRONIC DEVICE

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/378,143

(22) Filed: Dec. 14, 2016

(65) Prior Publication Data

US 2017/0179293 A1    Jun. 22, 2017

(30) Foreign Application Priority Data

Dec. 16, 2015    (JP) .................................. 2015-245021

(51) Int. Cl.
*H01L 29/786*    (2006.01)
*H01L 27/12*    (2006.01)

(52) U.S. Cl.
CPC ...... *H01L 29/7869* (2013.01); *H01L 27/1225* (2013.01); *H01L 27/1255* (2013.01); *H01L 29/78696* (2013.01)

(58) Field of Classification Search
CPC ......... H01L 29/41733; H01L 29/78618; H01L 29/7869; H01L 29/78693; H01L 29/78696
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Bryan Junge
(74) *Attorney, Agent, or Firm* — Nixon Peabody LLP; Jeffrey L. Costellia

(57) ABSTRACT

To provide a transistor with favorable electrical characteristics, a transistor with stable electrical characteristics, or a highly integrated semiconductor device. An electrode is provided over an oxide semiconductor layer A, the oxide semiconductor layer A and the electrode are covered with a layer C, and then heat treatment is performed; thus, oxidation of the electrode which is caused in the heat treatment is prevented. For the layer C, for example, an oxide semiconductor can be used. By covering a side surface of the oxide semiconductor layer A where a channel is formed with the layer C and the oxide semiconductor layer B, diffusion of impurities from the side surface of the oxide semiconductor layer A into the oxide semiconductor layer A is prevented.

20 Claims, 52 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,547,771 B2 | 10/2013 | Koyama |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0032665 A1* | 2/2010 | Yamazaki ......... H01L 29/78618 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0292610 A1* | 11/2012 | Wang ................ H01L 29/42384 257/43 |
| 2014/0004656 A1* | 1/2014 | Sasagawa ......... H01L 29/66969 438/104 |
| 2014/0332800 A1* | 11/2014 | Hanaoka ............ H01L 29/7869 257/43 |
| 2014/0361293 A1* | 12/2014 | Yamazaki ......... H01L 29/78696 257/43 |
| 2015/0155362 A1* | 6/2015 | Nakazawa ............ H01L 29/45 257/43 |
| 2015/0349131 A1* | 12/2015 | Atsumi .................. G05F 3/262 257/43 |
| 2017/0170211 A1 | 6/2017 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-257187 A | 12/2012 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

(56) References Cited

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

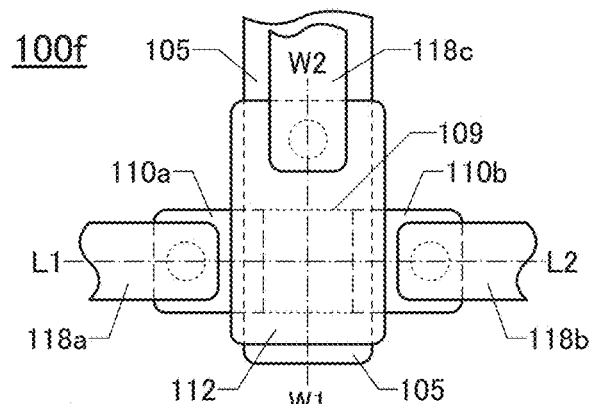
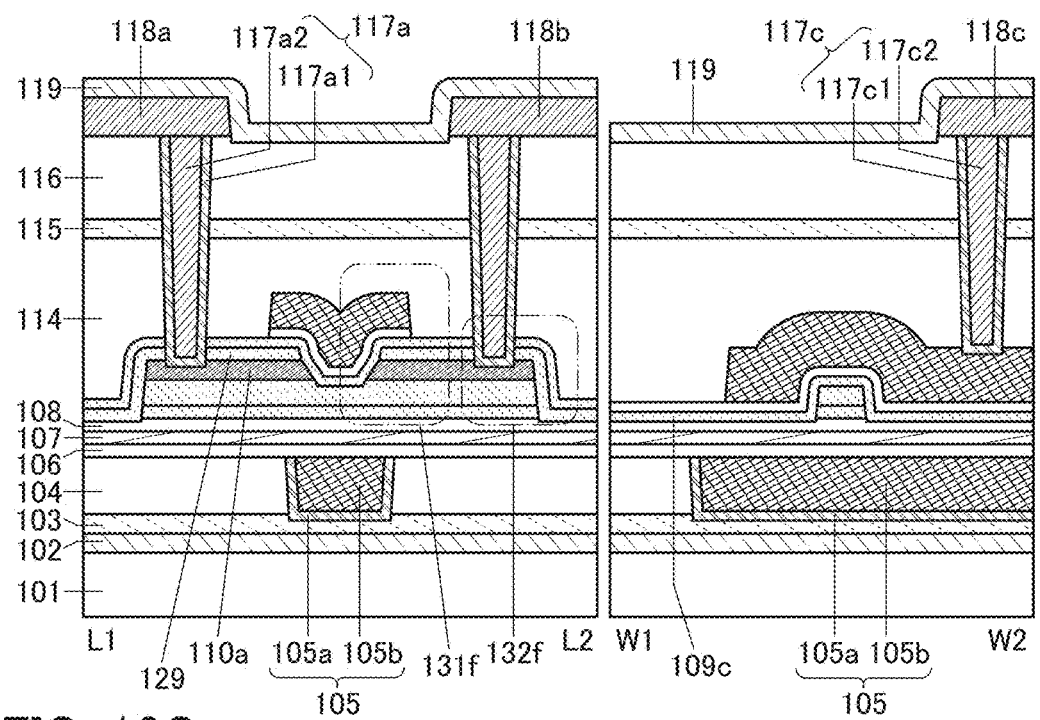
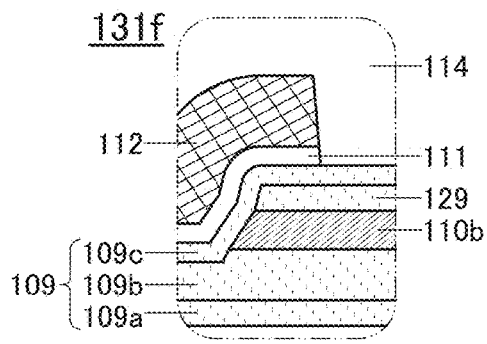
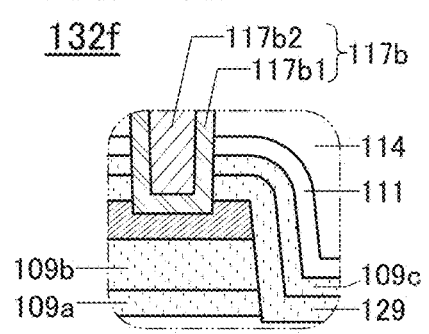

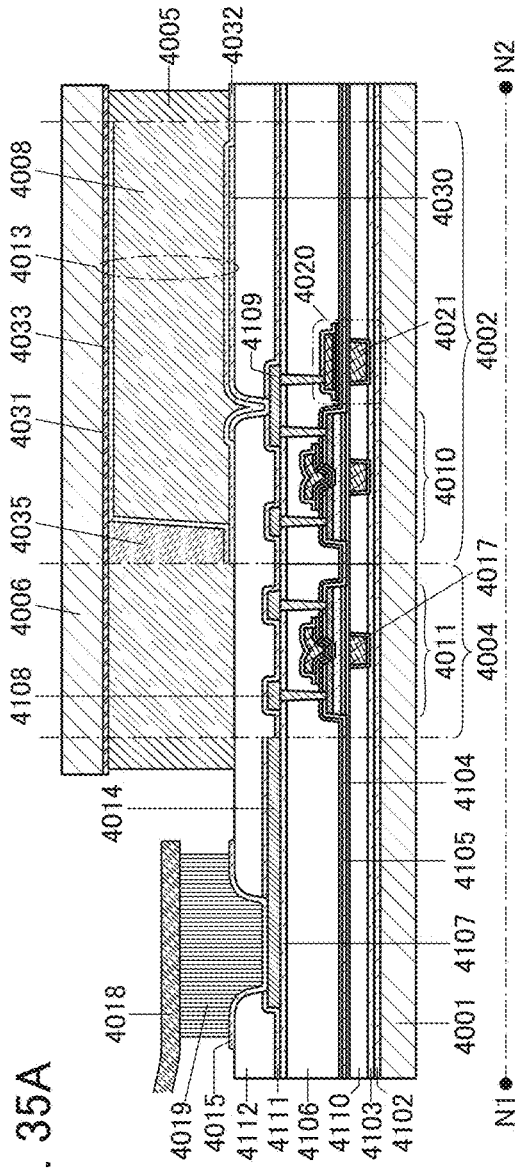
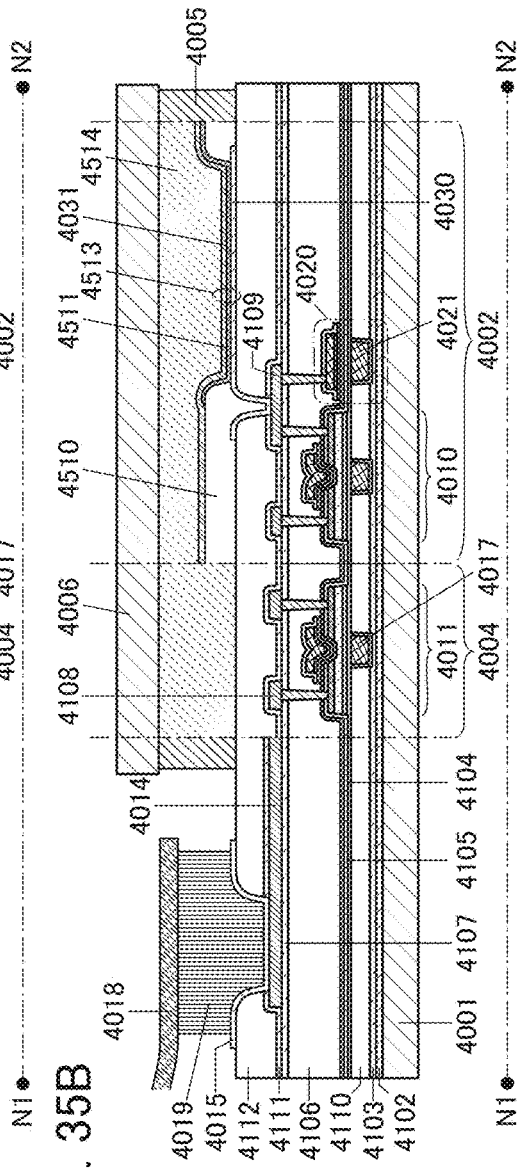
FIG. 35A
FIG. 35B

4000

4000

4000

4000

4000

4000

FIG. 51A
FIG. 51B
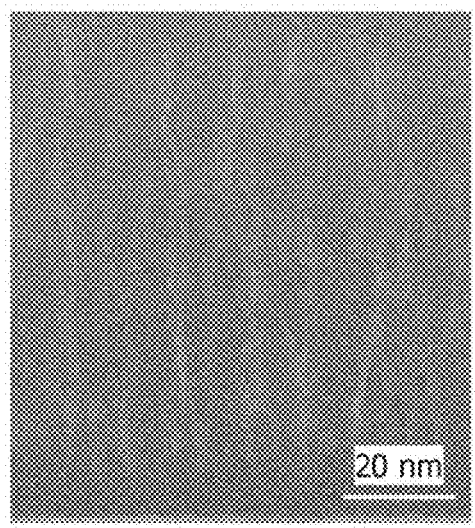
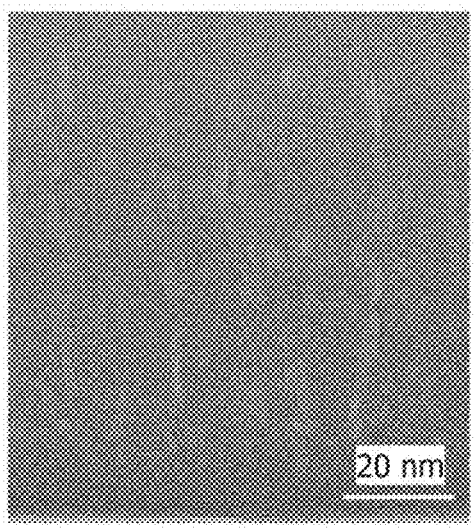

TRANSISTOR, SEMICONDUCTOR DEVICE, AND ELECTRONIC DEVICE

BACKGROUND OF THE INVENTION

1. Field of the Invention

One embodiment of the present invention relates to a transistor, a semiconductor device, and a manufacturing method thereof.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a liquid crystal display device, a light-emitting device, a lighting device, an electro-optical device, a power storage device, a memory device, a semiconductor circuit, an imaging device, an electronic device, and the like may include a semiconductor device.

2. Description of the Related Art

In recent years, a transistor has been developed. A transistor is used in a semiconductor integrated circuit (IC chip) such as an LSI, a CPU, or a memory. A semiconductor integrated circuit is mounted on a circuit board, for example, a printed circuit board, to be used as one of components of a variety of electronic devices.

In recent years, a transistor including an oxide semiconductor in a semiconductor layer where a channel is formed (also referred to as an "OS transistor") has attracted attention. An OS transistor is known to have an extremely low unintended current (also referred to as leakage current) between a source and a drain in an off state. For example, a low-power CPU utilizing a characteristic of low leakage current of the OS transistor is disclosed (see Patent Document 1).

REFERENCE

Patent Document

[Patent Document 1] Japanese Published Patent Application No. 2012-257187

SUMMARY OF THE INVENTION

An object is to provide a transistor with favorable electrical characteristics. Another object is to provide a transistor having stable electrical characteristics. Another object is to provide a transistor with low power consumption. Another object is to provide a transistor with high reliability. Another object is to provide a novel transistor. Another object is to provide a semiconductor device including at least one of these transistors.

Note that the descriptions of these objects do not disturb the existence of other objects. In one embodiment of the present invention, there is no need to achieve all the objects. Other objects will be apparent from and can be derived from the description of the specification, the drawings, the claims, and the like.

An electrode is provided over an oxide semiconductor layer A, the oxide semiconductor layer A and the electrode are covered with a layer C, and then heat treatment is performed; thus, oxidation of the electrode which is caused in the heat treatment is prevented. For the layer C, for example, an oxide semiconductor can be used. By covering a side surface of the oxide semiconductor layer A where a channel is formed with the layer C and the oxide semiconductor layer B, diffusion of impurities from the side surface of the oxide semiconductor layer A into the oxide semiconductor layer A is prevented.

One embodiment of the present invention is a transistor including first to third oxide semiconductor layers, first to third electrodes, a first insulating layer, and a first layer. The first oxide semiconductor layer has an island-like shape. The second oxide semiconductor layer has an island-like shape. The first oxide semiconductor layer and the second oxide semiconductor layer overlap with each other in a region. The second oxide semiconductor layer includes a first region, a second region, and a third region. The third region is located between the first region and the second region. The first electrode is located over the first region. The second electrode is located over the second region. The first layer includes a region in contact with an upper surface of the first electrode, a region in contact with a side surface of the first electrode, a region in contact with an upper surface of the second electrode, and a region in contact with a side surface of the second electrode. The third oxide semiconductor layer includes a region overlapping with the first layer and a region in contact with the third region. The first insulating layer is located over the third oxide semiconductor layer. The third electrode is located over the first insulating layer. The third electrode includes a region overlapping with the third region with the first insulating layer located therebetween.

The first layer preferably includes a region in contact with a side surface of the second oxide semiconductor layer. The first layer preferably includes a region in contact with a side surface of the first oxide semiconductor layer. The second oxide semiconductor layer preferably contains In and/or Zn.

The first oxide semiconductor layer and the third oxide semiconductor layer preferably contain a metal element that is the same kind as at least one metal element contained in the second oxide semiconductor layer. The first layer preferably contains a metal element that is the same kind as at least one metal element contained in the second oxide semiconductor layer.

The transistor of one embodiment of the present invention may further include a second insulating layer under the first oxide semiconductor layer and a fourth electrode under the second insulating layer. The second insulating layer may include a region overlapping with the third region. The fourth electrode may include a region overlapping with the third region.

Another embodiment of the present invention is a semiconductor device including the transistor and a capacitor or a resistor. Another embodiment of the present invention is an electronic device including the semiconductor device and an antenna, a battery, an operation switch, a microphone, or a speaker. Another embodiment of the present invention is an electronic device including the transistor and an antenna, a battery, an operation switch, a microphone, or a speaker.

A transistor with favorable electrical characteristics can be provided. A transistor with stable electrical characteristics can be provided. A transistor with low power consumption can be provided. A transistor with high reliability can be provided. A novel transistor can be provided. A semiconductor device including at least one of these transistors can be provided.

Note that the descriptions of these effects do not disturb the existence of other effects. One embodiment of the present invention does not necessarily achieve all the effects. Other effects will be apparent from and can be derived from the description of the specification, the drawings, the claims, and the like.

BRIEF DESCRIPTION OF THE DRAWINGS

FIGS. 16A to 16D illustrate a transistor of one embodiment of the present invention.

FIGS. 35A and 35B illustrate examples of a display device.

FIGS. 51A and 51B show cross-sectional TEM images of an a-like OS.

DETAILED DESCRIPTION OF THE INVENTION

Figure 1A:
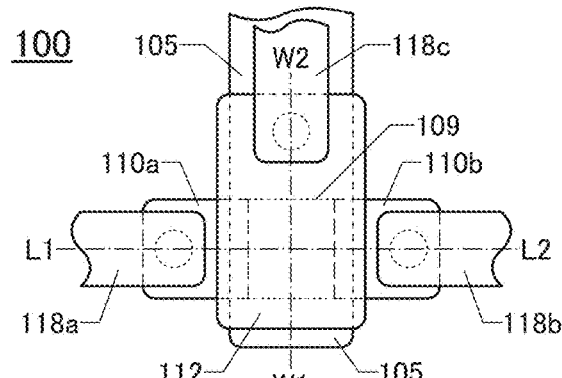
FIGS. 1A to 1D illustrate a transistor of one embodiment of the present invention.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a layer, a resist mask, or the like might be unintentionally reduced in size by treatment such as etching, which is not illustrated in some cases for easy understanding.

Especially in a top view (also referred to as a "plan view"), a perspective view, or the like, some components might not be illustrated for easy understanding of the invention. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. A term with an ordinal number in this specification and the like might not be provided with an ordinal number in a claim and the like.

In addition, in this specification and the like, a term such as an "electrode" or a "wiring" does not limit the function of a component. For example, an "electrode" is used as part of a "wiring" in some cases, and vice versa. Further, the term "electrode" or "wiring" can also mean a combination of a plurality of "electrodes" and "wirings" formed in an integrated manner.

Note that the term "over" or "under" in this specification and the like does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain might be switched depending on operation conditions, e.g., when a transistor having a different polarity is employed or the direction of current flow is changed in circuit operation. Therefore, it is difficult to define which is the source (or the drain). Thus, the terms "source" and "drain" can be used to denote the drain and the source, respectively, in this specification.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

In this specification and the like, the term "electrically connected" includes the case where components are connected through an object having any electric function. There is no particular limitation on an "object having any electric function" as long as electric signals can be transmitted and received between components that are connected through the object. Thus, even when the expression "electrically connected" is used, there is a case in which no physical connection is made and a wiring is just extended in an actual circuit.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value, in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value, in a region where a channel is formed.

Note that depending on transistor structures, a channel width in a region where a channel is actually formed (hereinafter referred to as an "effective channel width") is different from a channel width shown in a top view of a transistor (hereinafter referred to as an "apparent channel width") in some cases. For example, in a transistor having a gate electrode covering side surfaces of a semiconductor layer, an effective channel width is greater than an apparent channel width, and its influence cannot be ignored in some cases. For example, in a miniaturized transistor having a gate electrode covering side surfaces of a semiconductor layer, the proportion of a channel formation region formed in the side surfaces of the semiconductor layer is increased in some cases. In that case, an effective channel width is greater than an apparent channel width.

In such a case, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, an apparent channel width is referred to as a "surrounded channel width (SCW)" in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

Note that impurities in a semiconductor refer to, for example, elements other than the main components of the semiconductor. For example, an element with a concentration of lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; there are hydrogen, lithium, sodium, silicon, boron, phosphorus, carbon, and nitrogen, for example. In the case of an oxide semiconductor, water also serves as an impurity in some cases. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" or "orthogonal" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In the specification and the like, the terms "identical," "the same," "equal," "uniform," and the like (including synonyms thereof) used in describing calculation values and actual measurement values allow for a margin of error of ±20% unless otherwise specified.

In this specification and the like, in the case where an etching step is performed after a resist mask is formed in a photolithography process, the resist mask is removed after the etching step, unless otherwise specified.

In this specification and the like, a high power supply potential $V_{DD}$ (hereinafter also simply referred to as "$V_{DD}$" or "H potential") is a power supply potential higher than a low power supply potential $V_{SS}$. The low power supply potential $V_{SS}$ (hereinafter also simply referred to as "$V_{SS}$" or "L potential") is a power supply potential lower than the high power supply potential $V_{DD}$. In addition, a ground potential (hereinafter also referred to as "GND" or a "GND potential") can be used as $V_{DD}$ or $V_{SS}$. For example, in the case where a ground potential is used as $V_{DD}$, $V_{SS}$ is lower than the ground potential, and in the case where a ground potential is used as $V_{SS}$, $V_{DD}$ is higher than the ground potential.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

(Embodiment 1)

In this embodiment, examples of a structure and a manufacturing method of a transistor 100 of one embodiment of the present invention will be described with reference to drawings.

<Structure of Transistor 100>

Figure 1B:
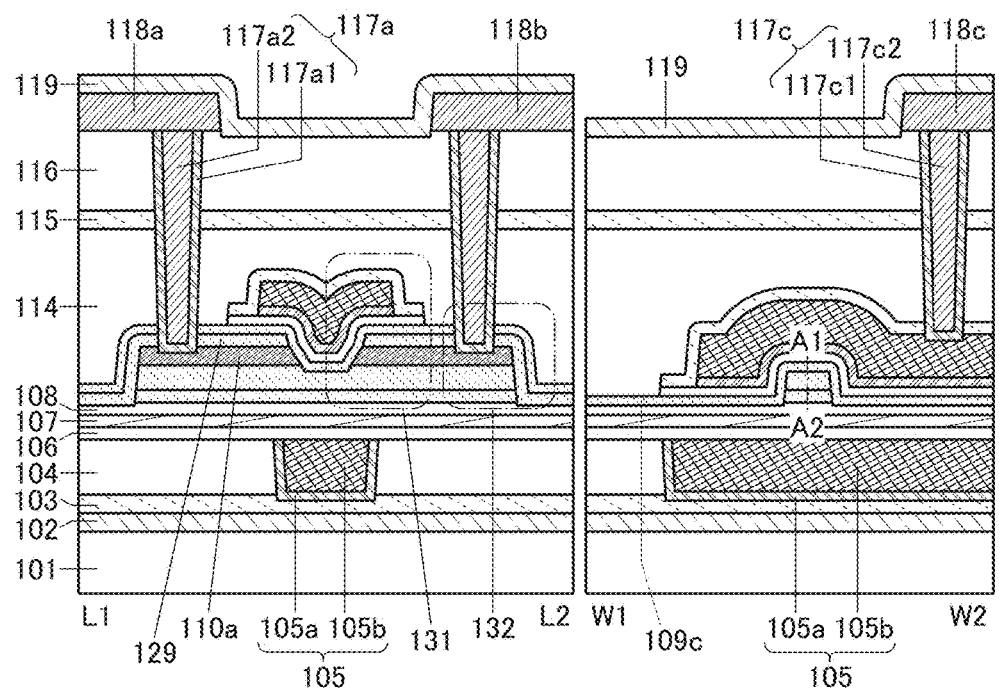
Figure 1C:
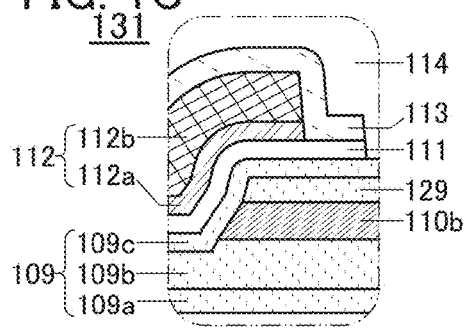
Figure 1D:
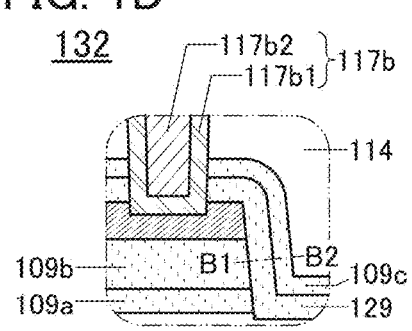

An example of a structure of the transistor 100 will be described with reference to drawings. FIG. 1A illustrates a plan view of the transistor 100. FIG. 1B illustrates a cross-sectional view taken along dashed-dotted line L1-L2 and a cross-sectional view taken along dashed-dotted line W1-W2 in FIG. 1A. In FIG. 1B, the cross-sectional view along L1-L2 is taken in the channel length direction of the transistor 100 and the cross-sectional view along W1-W2 is taken in the channel width direction of the transistor 100. FIG. 1C is an enlarged view of a portion 131 in FIG. 1B. FIG. 1D is an enlarged view of a portion 132 in FIG. 1B.

The transistor 100 is a kind of top-gate transistor. The transistor 100 includes an electrode 105 (an electrode 105a and an electrode 105b are collectively referred to as the "electrode 105".), an insulating layer 106, an insulating layer 107, an insulating layer 108, a semiconductor layer 109 (a semiconductor layer 109a, a semiconductor layer 109b, and a semiconductor layer 109c are collectively referred to as the "semiconductor layer 109".), an electrode 110 (an electrode 110a and an electrode 110b are collectively referred to as the "electrode 110".), a layer 129, an insulating layer 111, an electrode 112 (an electrode 112a and an electrode 112b are collectively referred to as the "electrode 112".), and an insulating layer 113.

Note that one of the electrodes 105a and 105b may be omitted. One of the electrodes 112a and 112b may be omitted.

The transistor 100 illustrated in FIGS. 1A to 1D is provided over a substrate 101 with an insulating layer 102 and an insulating layer 103 located therebetween. Specifically, an insulating layer 104 is provided over the insulating layer 103, and the electrode 105 is embedded in part of the insulating layer 104. The insulating layer 106 is provided over the electrode 105 and the insulating layer 104, the insulating layer 107 is provided over the insulating layer 106, and the insulating layer 108 is provided over the insulating layer 107. The insulating layer 108 has a projection, the semiconductor layer 109a is provided over the projection, and the semiconductor layer 109b is provided over the semiconductor layer 109a.

The semiconductor layer 109b includes a first region, a second region, and a third region. The third region is located between the first region and the second region. The first region (a region 189a), the second region (a region 189b), and the third region (a region 189c) are described later.

The transistor 100 includes the electrode 110a over the first region of the semiconductor layer 109b and the electrode 110b over the second region of the semiconductor layer 109b. One of the electrode 110a and the electrode 110b can function as one of a source electrode and a drain electrode, and the other can function as the other of the source electrode and the drain electrode. Thus, one of the first region and the second region of the semiconductor layer 109b can function as the source region and the other can function as the drain region. Furthermore, the third region of the semiconductor layer 109b can function as a channel formation region.

In the transistor 100, the layer 129 is provided over the electrode 110. The layer 129 is not provided in a region overlapping with the third region and covers the semiconductor layer 109a, the semiconductor layer 109b, and the electrode 110. The layer 129 includes a region in contact with a side surface of the electrode 110a and a region in contact with a side surface of the semiconductor layer 109b. The layer 129 includes a region in contact with a side surface of the electrode 110b and a region in contact with a side surface of the semiconductor layer 109b.

In the transistor 100, the semiconductor layer 109c is provided over the layer 129. The semiconductor layer 109c covers the semiconductor layer 109a, the semiconductor layer 109b, and the electrode 110. The semiconductor layer 109c includes a region in contact with an upper surface of the semiconductor layer 109b and a region in contact with a side surface thereof.

In the transistor 100, the insulating layer 111 is provided over the semiconductor layer 109c, the electrode 112a is provided over the insulating layer 111, and the electrode 112b is provided over the electrode 112a. The insulating layer 111 and the electrode 112 (the electrodes 112a and 112b) include a region overlapping with the third region.

The layer 129 is preferably thicker than the semiconductor layer 109c.

The transistor 100 further includes the insulating layer 113 over the electrode 112. The insulating layers 111 and 113 extend beyond an end portion of the electrode 112 and have a region where the insulating layers 111 and 113 are in contact with each other in the extended portion.

In this embodiment, an insulating layer 114 is provided over the semiconductor layer 109c and the insulating layer 113, an insulating layer 115 is provided over the insulating layer 114, and an insulating layer 116 is provided over the insulating layer 115.

In this embodiment, an electrode 117a is provided in an opening which overlaps with the electrode 110a and which is provided in the insulating layer 116, the insulating layer 115, the insulating layer 114, the semiconductor layer 109c, and the layer 129. In this embodiment, an electrode 117b is provided in an opening which overlaps with the electrode 110b and which is provided in the insulating layer 116, the insulating layer 115, the insulating layer 114, the semiconductor layer 109c, and the layer 129. In this embodiment, an electrode 117c is provided in an opening which overlaps with the electrode 112 and which is provided in the insulating layer 116, the insulating layer 115, the insulating layer 114, and the insulating layer 113.

In this embodiment, an electrode 118a, an electrode 118b, and an electrode 118c are provided over the insulating layer 116. The electrode 118a is electrically connected to the electrode 110a through the electrode 117a (an electrode 117a1 and an electrode 117a2). The electrode 118b is electrically connected to the electrode 110b through the electrode 117b (an electrode 117b1 and an electrode 117b2). The electrode 118c is electrically connected to the electrode 112 through the electrode 117c (an electrode 117c1 and an electrode 117c2).

In this embodiment, an insulating layer 119 is provided over the electrode 118a, the electrode 118b, the electrode 118c, and the insulating layer 116.

[S-Channel Structure]

As illustrated in FIG. 1B, in the transistor 100, the semiconductor layer 109b is located between the electrode 105 and the electrode 112 in a channel width direction. As described above, the insulating layer 108 has the projection. The semiconductor layer 109a and the semiconductor layer 109b are provided over the projection. By providing the projection, a bottom surface of the electrode 112 in a region not overlapping with the projection (a region not overlapping with the semiconductor layer 109b) can be closer to the substrate than a bottom surface of the semiconductor layer 109b is. The height of the projection is preferably larger than or equal to the thickness of the insulating layer 111. Alternatively, the height of the projection is preferably greater than or equal to the sum of the thickness of the insulating layer 111 and the thickness of the semiconductor layer 109c. Thus, the side surface of the semiconductor layer 109b can be covered with the electrode 112.

In other words, the transistor 100 can have a structure in which the semiconductor layer 109b can be electrically surrounded by an electric field between the electrode 105 and the electrode 112. Such a structure of a transistor in which a semiconductor layer in which a channel is formed is electrically surrounded by an electric field between conductive layers (the electrodes 105 and 112 in this embodiment) is called a surrounded channel (s-channel) structure. In the transistor 100 having an s-channel structure, a channel can be formed in the whole (bulk) of the semiconductor layer 109b. In the s-channel structure, the drain current of the transistor is increased, so that a larger amount of on-state current (current which flows between the source and the drain when the transistor is on) can be obtained. Furthermore, the entire channel formation region of the semiconductor layer 109b can be depleted by the electric field between the electrode 105 and the electrode 112. Accordingly, the off-state current of the s-channel transistor can be further reduced. When the channel width is shortened, the effects of the s-channel structure, such as an increase in on-state current and a reduction in off-state current, can be enhanced.

[Gate Electrode and Back Gate Electrode]

One of the electrodes 105 and 112 can function as a gate electrode and the other can function as a back gate electrode. In general, a gate electrode and a back gate electrode are formed using a conductive layer and positioned so that the channel formation region of the semiconductor layer is located between the gate electrode and the back gate electrode. Thus, the back gate electrode can function in a manner similar to that of the gate electrode. The potential of the back gate electrode may be the same as that of the gate electrode or may be a ground potential or a predetermined potential. By changing the potential of the back gate electrode independently of the potential of the gate electrode, the threshold voltage of the transistor can be changed.

The electrode 105 and the electrode 112 can each function as a gate electrode. Thus, the insulating layers 106, 107, 108, and 111 can each function as a gate insulating layer.

In the case where one of the electrode 105 and the electrode 112 is simply referred to as a "gate electrode", the other can be referred to as a "back gate electrode". For example, in the transistor 100, in the case where the electrode 105 is referred to as a "gate electrode", the electrode 112 is referred to as a "back gate electrode". In the case where the electrode 112 is used as a "gate electrode", the transistor 100 can be regarded as a kind of bottom-gate transistor. Alternatively, one of the electrode 105 and the electrode 112 may be referred to as a "first gate electrode", and the other may be referred to as a "second gate electrode".

By providing the electrode 105 and the electrode 112 with the semiconductor layer 109 provided therebetween and setting the potentials of the electrode 105 and the electrode 112 to be the same, a region of the semiconductor layer 109 through which carriers flow is enlarged in the film thickness direction; thus, the number of transferred carriers is increased. As a result, the on-state current and the field-effect mobility of the transistor 100 are increased.

Therefore, the transistor 100 has large on-state current for its area. That is, the area occupied by the transistor 100 can be small for required on-state current. Therefore, a semiconductor device having a high degree of integration can be provided.

Furthermore, the gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer to cover the semiconductor layer in the plan view, the electric field blocking function can be enhanced.

Since the electrode 105 and the electrode 112 each have a function of blocking an electric field from the outside, charges of charged particles and the like generated over the electrode 112 or under the electrode 105 do not influence the channel formation region in the semiconductor layer 109. Thus, degradation by a stress test (e.g., a negative gate bias temperature (−GBT) stress test in which negative charges are applied to a gate) can be reduced. In addition, the electrode 105 and the electrode 112 can block an electric field generated from the drain electrode so as not to affect the semiconductor layer. Thus, changes in the rising voltage of on-state current due to changes in drain voltage can be suppressed. Note that this effect is significant when a potential is applied to the electrodes 105 and 112.

The GBT stress test is one kind of acceleration test and can evaluate, in a short time, a change by long-term use (i.e., a change over time) in characteristics of a transistor. In particular, the amount of change in threshold voltage of the transistor between before and after the GBT stress test is an important indicator when examining the reliability of the transistor. If the amount of change in the threshold voltage between before and after the GBT stress test is small, the transistor has higher reliability.

By providing the electrodes 105 and 112 and setting the potentials of the electrodes 105 and 112 to be the same, the amount of change in threshold voltage is reduced. Accordingly, a variation in electrical characteristics among a plurality of transistors is also reduced.

The transistor including the back gate electrode has a smaller change in threshold voltage by a positive GBT stress test in which positive charges are applied to a gate than a transistor including no back gate electrode.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

[Deposition Method]

An insulating material for forming the insulating layers, a conductive material for forming the electrodes, or a semiconductor material for forming the semiconductor layers can be formed by a sputtering method, a spin coating method, a chemical vapor deposition (CVD) method (including a thermal CVD method, a metal organic chemical vapor deposition (MOCVD) method, a plasma enhanced CVD (PECVD) method, a high density plasma CVD method, a low pressure CVD (LPCVD) method, an atmospheric pressure CVD (APCVD) method, and the like), an atomic layer deposition (ALD) method, a molecular beam epitaxy (MBE) method, or a pulsed laser deposition (PLD) method.

A sputtering method using a parallel-plate-type sputtering apparatus can also be referred to as parallel electrode sputtering (PESP). A sputtering method using a facing-targets sputtering apparatus can also be referred to as vapor deposition sputtering (VDSP).

By using a PECVD method, a high-quality film can be formed at a relatively low temperature. By using a deposition method that does not use plasma for deposition, such as an MOCVD method, an ALD method, or a thermal CVD method, a film can be formed with few defects because damage is not easily caused on a surface on which the film is deposited.

In the case where a film is formed by an ALD method, a gas that does not contain chlorine is preferably used as a material gas.

[Substrate]

There is no particular limitation on a material used as the substrate 101 as long as the material has heat resistance high enough to withstand at least heat treatment performed later. For example, a single crystal semiconductor substrate or a polycrystalline semiconductor substrate made of silicon, silicon carbide, or the like or a compound semiconductor substrate made of silicon germanium or the like may be used as the substrate 101. Alternatively, an SOI substrate, a semiconductor substrate on which a semiconductor element such as a strained transistor or a FIN-type transistor is provided, or the like can also be used. Alternatively, gallium arsenide, aluminum gallium arsenide, indium gallium arsenide, gallium nitride, indium phosphide, silicon germanium, or the like that can be used for a high-electron-mobility transistor (HEMT) may be used. The substrate 101 is not limited to a simple supporting substrate, and may be a substrate where a device such as a transistor is formed. In this case, at least one of the gate, the source, and the drain of the transistor 100 may be electrically connected to the device.

Further alternatively, as the substrate 101, a glass substrate of barium borosilicate glass, aluminoborosilicate glass, or the like, a ceramic substrate, a quartz substrate, or a sapphire substrate can be used. Note that a flexible substrate may be used as the substrate 101. In the case where a flexible substrate is used, the transistor, a capacitor, or the like may be directly formed over the flexible substrate; or the transistor, the capacitor, or the like may be formed over a manufacturing substrate and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

For the flexible substrate, for example, metal, an alloy, resin, glass, or fiber thereof can be used. The flexible substrate used as the substrate 101 preferably has a lower coefficient of linear expansion because deformation due to an environment is suppressed. The flexible substrate used as the substrate 101 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

[Insulating Layer]

The insulating layers 102 to 104, 106 to 108, 111 to 116, and 119 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

It is particularly preferable that the insulating layer 115 and the insulating layer 102 and/or the insulating layer 103 be formed using an insulating material that is relatively impermeable to impurities. Examples of such an insulating material include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When the insulating material that is relatively impermeable to impurities is used for the insulating layer 102 and/or the insulating layer 103, impurity diffusion from the substrate 101 side can be suppressed, and the reliability of the transistor can be improved. When the insulating material that is relatively impermeable to impurities is used for the insulating layer 115, impurity diffusion from the insulating layer 116 side can be suppressed, and the reliability of the transistor can be improved.

Note that a stack of a plurality of insulating layers formed with these materials may be used as the insulating layer 115 and the insulating layer 102 and/or the insulating layer 103.

The hydrogen concentration in the insulating layers is preferably lowered in order to prevent an increase in the hydrogen concentration in the semiconductor layer 109. It is particularly preferable to lower the hydrogen concentration of the insulating layers 104, 106 to 108, 111, and 114. Specifically, the hydrogen concentration in the insulating layer, which is measured by secondary ion mass spectrometry (SIMS), is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. Furthermore, the nitrogen concentration in the insulating layers is preferably low in order to prevent an increase in the nitrogen concentration in the oxide semiconductor. Specifically, the nitrogen concentration in the insulating layer, which is measured by SIMS, is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The insulating layers 108, 111, and 114 are each preferably formed using an insulating layer from which oxygen is released by heating (hereinafter also referred to as an "insulating layer containing excess oxygen"). Note that in this specification and the like, oxygen released from a layer by heating is referred to as excess oxygen. The insulating layer containing excess oxygen may be an insulating layer in which the amount of released oxygen converted into oxygen atoms is $1.0 \times 10^{18}$ atoms/cm$^3$ or more, $1.0 \times 10^{19}$ atoms/cm$^3$ or more, or $1.0 \times 10^{20}$ atoms/cm$^3$ or more, in thermal desorption spectroscopy (TDS) analysis performed under such a condition that a surface of the insulating layer is heated at a temperature higher than or equal to 100° C. and lower than or equal to 700° C., preferably higher than or equal to 100° C. and lower than or equal to 500° C.

The insulating layer containing excess oxygen can be formed by performing treatment for adding oxygen to an insulating layer. The treatment for adding oxygen can be performed by heat treatment under an oxygen atmosphere, an ion implantation method, an ion doping method, a plasma immersion ion implantation method, plasma treatment, or the like. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

A heat-resistant organic material such as polyimide, acrylic, benzocyclobutene, polyamide, or epoxy may be used to form the insulating layer 116. Other than the above organic materials, a low-dielectric constant material (low-k material), a siloxane-based resin, phosphosilicate glass (PSG), borophosphosilicate glass (BPSG), or the like can be used. Note that the insulating layer 116 may be formed by stacking a plurality of insulating layers formed using any of these materials.

Note that the siloxane-based resin corresponds to a resin including an Si—O—Si bond formed using a siloxane-based material as a starting material. The siloxane-based resin may contain, as a substituent, an organic group (e.g., an alkyl group or an aryl group) or a fluoro group. The organic group may contain a fluoro group.

There is no particular limitation on the method for forming the insulating layer 116, and any of the following methods which depend on a material thereof can be used: a sputtering method; an SOG method; spin coating; dipping; spray coating; a droplet discharging method (e.g., an ink-jet method); a printing method (e.g., screen printing or offset printing); or the like. When the baking step of the insulating layer 116 also serves as heat treatment for another layer, the transistor can be manufactured efficiently.

Any of the above insulating layers may be used as the layer 129. In the case where the layer 129 is an insulating layer, an insulating layer which is less likely to release oxygen and/or which is less likely to absorb oxygen is preferably used.

[Electrode]

As a conductive material for forming the electrodes 105a, 105b, 110a, 110b, 112a, 112b, 117a1, 117a2, 117b1, 117b2, 117c1, 117c2, 118a, and 118b, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, and the like can be used. Alternatively, a semiconductor having a high electric conductivity typified by polycrystalline silicon including an impurity element such as phosphorus, or a silicide such as nickel silicide may be used.

A conductive material containing the above metal element and oxygen may be used. A conductive material containing the above metal element and nitrogen may be used. For example, a conductive material containing nitrogen such as titanium nitride or tantalum nitride may be used. Indium tin oxide (ITO), indium oxide containing tungsten oxide, indium zinc oxide containing tungsten oxide, indium oxide containing titanium oxide, indium tin oxide containing titanium oxide, indium zinc oxide, indium tin oxide to which silicon is added, or indium gallium zinc oxide containing nitrogen may be used.

A stack of a plurality of conductive layers formed with the above materials may be used. For example, a stacked-layer structure formed using a material containing the above metal element and a conductive material containing oxygen may be used. Alternatively, a stacked-layer structure formed using a material containing the above metal element and a conductive material containing nitrogen may be used. Further alternatively, a stacked-layer structure formed using a material containing the above metal element, a conductive material containing oxygen, and a conductive material containing nitrogen may be used.

One of the electrode 105a and the electrode 105b may be omitted. One of the electrode 112a and the electrode 112b may be omitted. One of the electrode 117a1 and the electrode 117a2 may be omitted. One of the electrode 117b1 and the electrode 117b2 may be omitted. One of the electrode 117c1 and the electrode 117c2 may be omitted.

The electrode 117a (the electrode 117a1 and the electrode 117a2), the electrode 117b (the electrode 117b1 and the electrode 117b2), and the electrode 117c (the electrode 117c1 and the electrode 117c2) may be formed using, for example, a conductive material with high embeddability, such as tungsten or polysilicon. A conductive material with high embeddability and a barrier layer (a diffusion prevention layer) such as a titanium layer, a titanium nitride layer, or a tantalum nitride layer may be used in combination. Note that the electrode 117a, the electrode 117b, and the electrode 117c may be regarded as contact plugs.

In particular, the electrode 105a in contact with the insulating layers 103 and 104 is preferably formed using a conductive material that is relatively impermeable to impurities. Furthermore, the electrodes 117a1, 117b1, and 117c1 in contact with the insulating layers 114 to 116 are preferably formed using a conductive material that is relatively impermeable to impurities. As an example of the conductive material that is relatively impermeable to impurities, tantalum nitride can be given.

When the insulating layers 103 and 104 are formed using an insulating material that is relatively impermeable to impurities and the electrodes 105a, 117a1, 117b1, and 117c1 are formed using a conductive material that is relatively impermeable to impurities, diffusion of impurities into the transistor 100 can be further suppressed. Thus, the reliability of the transistor 100 can be further increased.

Any of the above conductive materials may be used for the layer 129. In the case where the layer 129 is formed using a conductive material, a conductive material which is less likely to release oxygen and/or which is less likely to absorb oxygen is preferably used.

[Semiconductor Layer]

For the semiconductor layer 109, a single-crystal semiconductor, a polycrystalline semiconductor, a microcrystalline semiconductor, an amorphous semiconductor, or the like can be used alone or in combination. As a semiconductor material, silicon, germanium, or the like can be used. Alternatively, a compound semiconductor of silicon germanium, silicon carbide, gallium arsenide, an oxide semiconductor, a nitride semiconductor, or the like, an organic semiconductor, or the like may be used.

In the case of using an organic semiconductor for the semiconductor layer 109, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

The semiconductor layers 109a to 109c may be formed using semiconductors having different crystal states or different semiconductor materials.

The band gap of an oxide semiconductor is greater than or equal to 2 eV; thus, when the oxide semiconductor is used for the semiconductor layer 109, a transistor with an extremely low off-state current can be provided. An OS transistor has a high withstand voltage between its source and drain. Thus, a transistor with high reliability can be provided. Furthermore, a transistor with high output voltage and high withstand voltage can be provided. Furthermore, a semiconductor device or the like with high reliability can be provided. Furthermore, a semiconductor device with high output voltage and high withstand voltage can be provided.

Alternatively, for example, a transistor including silicon having crystallinity in a semiconductor layer in which a channel is formed (also referred to as a "crystalline Si transistor") tends to obtain relatively high mobility as compared to the OS transistor. On the other hand, the crystalline Si transistor has difficulty in obtaining extremely small off-state current unlike the OS transistor. Thus, it is important that the semiconductor material used for the semiconductor layer be selected depending on the purpose and the usage. For example, depending on the purpose and the usage, the OS transistor and the crystalline Si transistor may be used in combination.

In this embodiment, the case where an oxide semiconductor is used for the semiconductor layer 109 will be described.

[Oxide Semiconductor]

An oxide semiconductor according to the present invention will be described below. An oxide semiconductor preferably contains at least indium or zinc. In particular, indium and zinc are preferably contained. In addition to these, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in an oxide semiconductor according to the present invention are described with reference to FIGS. 46A to 46C. Note that the proportion of oxygen atoms is not shown in FIGS. 46A to 46C. The terms of the atomic ratio of indium, the element M, and zinc contained in the oxide semiconductor are denoted by [In], [M], and [Zn], respectively.

Figure 46A:
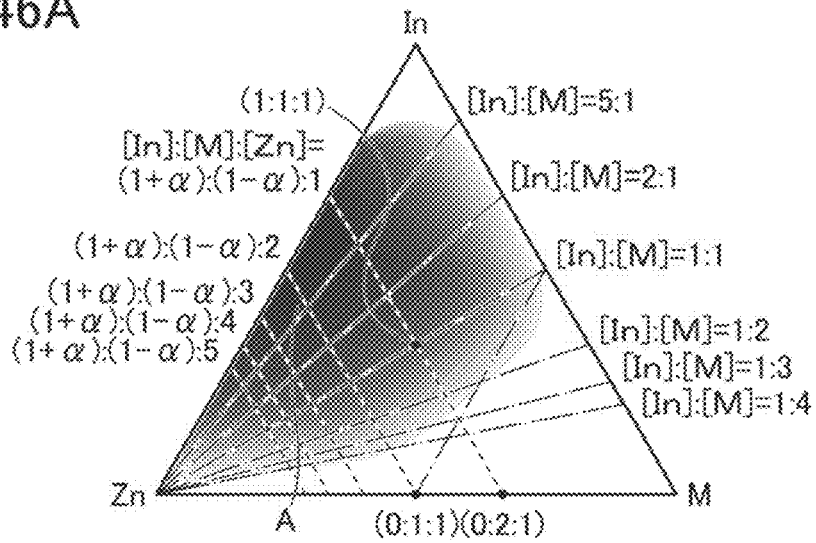
FIGS. 46A to 46C each illustrate an atomic ratio range of an oxide semiconductor of one embodiment of the present invention.
Figure 46B:
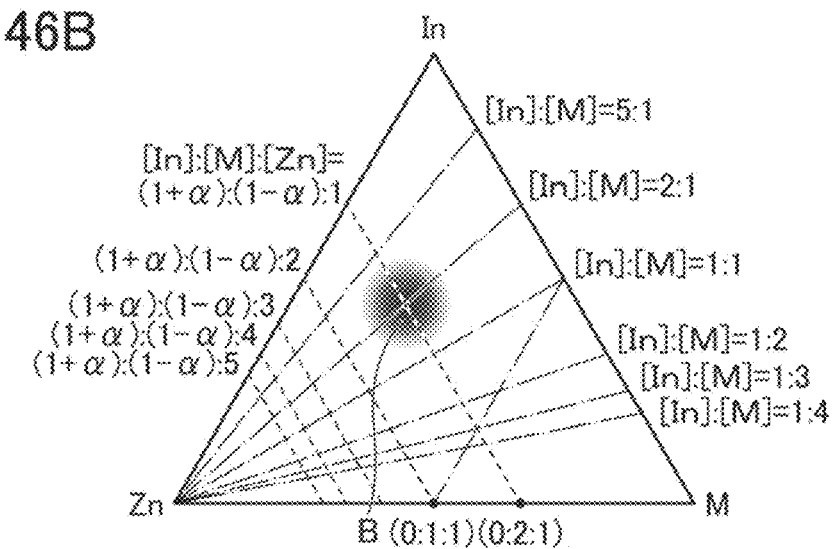
Figure 46C:
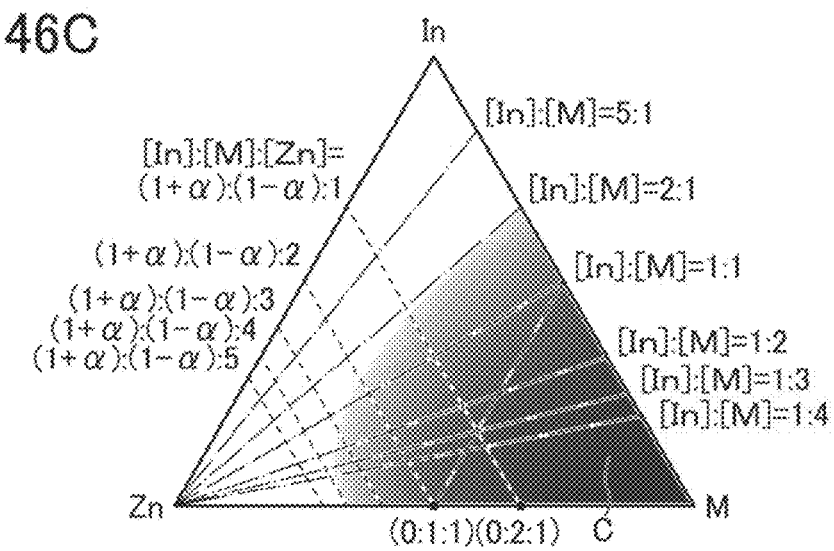

In FIGS. 46A to 46C, broken lines indicate a line where the atomic ratio [In]:[M]:[Zn] is $(1+\alpha):(1-\alpha):1$ (where $-1 \leq \alpha \leq 1$), a line where the atomic ratio [In]:[M]:[Zn] is $(1+\alpha):(1-\alpha):2$, a line where the atomic ratio [In]:[M]:[Zn] is (1+α):(1−α):3, a line where the atomic ratio [In]:[M]:[Zn] is (1+α):(1−α):4, and a line where the atomic ratio [In]:[M]:[Zn] is (1+α):(1−α):5.

Dashed-dotted lines indicate a line where the atomic ratio [In]:[M]:[Zn] is 1:1:β (where β≥0), a line where the atomic ratio [In]:[M]:[Zn] is 1:2:β, a line where the atomic ratio [In]:[M]:[Zn] is 1:3:β, a line where the atomic ratio [In]:[M]:[Zn] is 1:4:β, a line where the atomic ratio [In]:[M]:[Zn] is 2:1:β, and a line where the atomic ratio [In]: M:[Zn] is 5:1:β.

Dashed-double dotted lines indicate a line where the atomic ratio [In]:[M]:[Zn] is (1+γ): 2:(1−γ) (where −1≤γ≤1). Furthermore, an oxide semiconductor with the atomic ratio of [In]:[M]:[Zn]=0:2:1 or a neighborhood thereof in FIGS. 46A to 46C tends to have a spinel crystal structure.

FIGS. 46A and 46B illustrate examples of the preferred ranges of the atomic ratio of indium, the element M, and zinc contained in an oxide semiconductor in one embodiment of the present invention.

Figure 47:
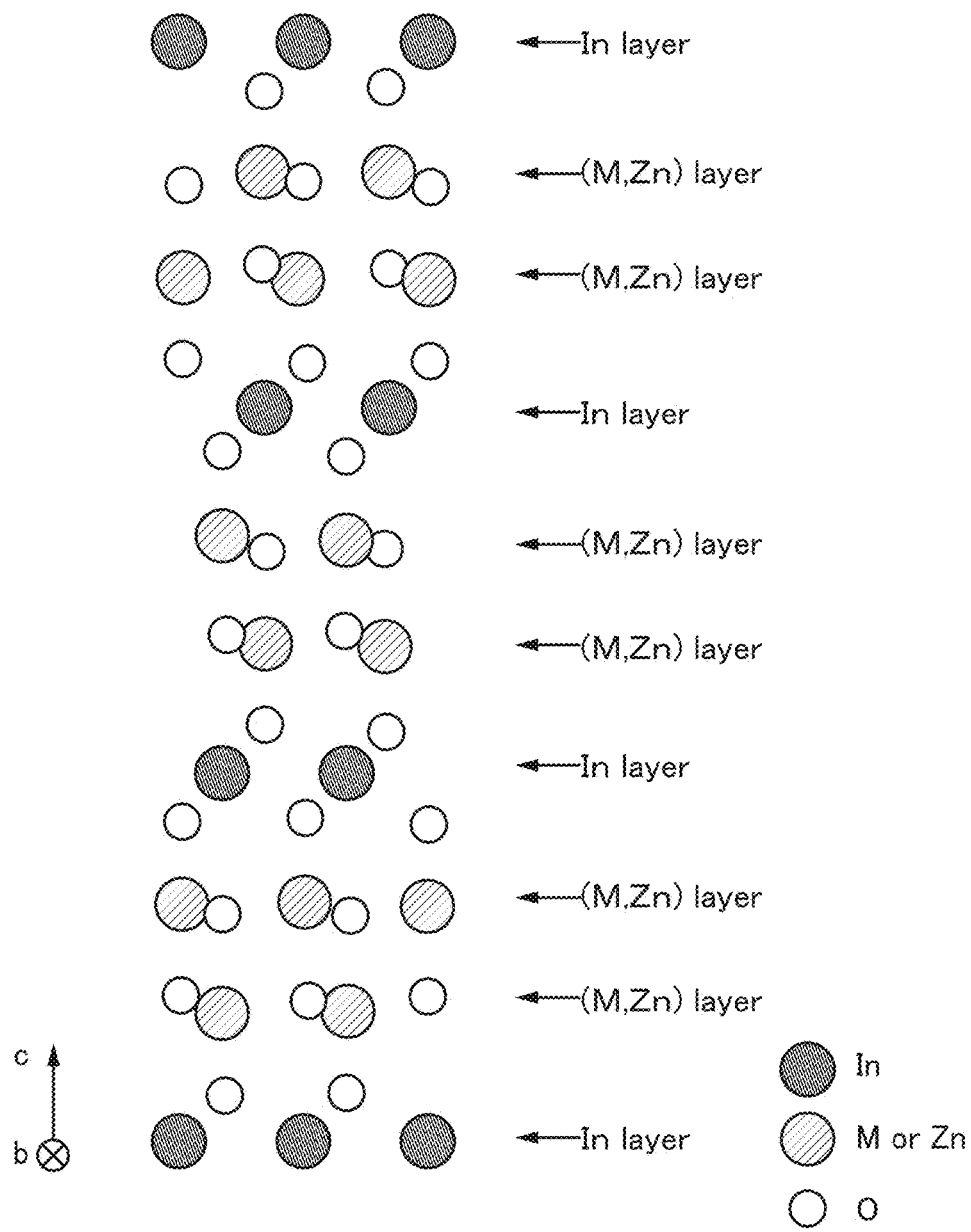
FIG. 47 illustrates a crystal of $InMZnO_4$.

FIG. 47 illustrates an example of the crystal structure of $InMZnO_4$ whose atomic ratio [In]:[M]:[Zn] is 1:1:1. The crystal structure illustrated in FIG. 47 is $InMZnO_4$ observed from a direction parallel to a b-axis. Note that a metal element in a layer that contains M, Zn, and oxygen (hereinafter, this layer is referred to as an "(M,Zn) layer") in FIG. 47 represents the element M or zinc. In that case, the proportion of the element M is the same as the proportion of zinc. The element M and zinc can be replaced with each other, and their arrangement is random.

$InMZnO_4$ has a layered crystal structure (also referred to as a layered structure) and includes one layer that contains indium and oxygen (hereinafter referred to as an In layer) for every two (M,Zn) layers that contain the element M, zinc, and oxygen, as illustrated in FIG. 47.

Indium and the element M can be replaced with each other. Therefore, when the element M in the (M,Zn) layer is replaced by indium, the layer can also be referred to as an (In,M,Zn) layer. In that case, a layered structure that includes one In layer for every two (In,M,Zn) layers is obtained.

An oxide whose atomic ratio [In]:[M]:[Zn] is 1:1:2 has a layered structure that includes one In layer for every three (M,Zn) layers. In other words, if [Zn] is larger than [In] and [M], the proportion of the (M,Zn) layer to the In layer becomes higher when the oxide is crystallized.

Note that in the case where the number of (M,Zn) layers with respect to one In layer is not an integer in the oxide, the oxide might have plural kinds of layered structures where the number of (M,Zn) layers with respect to one In layer is an integer. For example, in the case of [In]:[M]:[Zn]=1:1:1.5, the oxide might have the following layered structures: a layered structure of one In layer for every two (M,Zn) layers and a layered structure of one In layer for every three (M,Zn) layers.

For example, in the case where the oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased; therefore, an oxide semiconductor having a high content of indium has higher carrier mobility than that of an oxide semiconductor having a low content of indium.

In contrast, when the indium content and the zinc content in an oxide semiconductor become lower, carrier mobility becomes lower. Thus, with an atomic ratio of [In]:[M]:[Zn]=0:1:0 and the vicinity thereof (e.g., a region C in FIG. 46C), insulation performance becomes better.

Accordingly, an oxide semiconductor of one embodiment of the present invention preferably has an atomic ratio represented by a region A in FIG. 46A. With the atomic ratio, a layered structure with high carrier mobility and a few grain boundaries is easily obtained.

A region B in FIG. 46B represents an atomic ratio of [In]:[M]:[Zn]=4:2:3 to 4:2:4.1 and the vicinity thereof. The vicinity includes an atomic ratio of [In]:[M]:[Zn]=5:3:4. An oxide semiconductor having an atomic ratio represented by the region B is an excellent oxide semiconductor that has particularly high crystallinity and high carrier mobility.

Note that a condition where an oxide semiconductor has a layered structure is not uniquely determined by an atomic ratio. The atomic ratio affects difficulty in forming a layered structure. Even with the same atomic ratio, whether a layered structure is formed or not depends on a formation condition. Therefore, the illustrated regions each represent an atomic ratio with which an oxide semiconductor has a layered structure, and boundaries of the regions A to C are not clear.

Next, the case where the oxide semiconductor is used for a transistor is described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8\times10^{11}/cm^3$, preferably lower than $1\times10^{11}/cm^3$, further preferably lower than $1\times10^{10}/cm^3$, and higher than or equal to $1\times10^{-9}/cm^3$ is used.

A highly purified intrinsic or substantially highly purified intrinsic oxide semiconductor has few carrier generation sources and thus can have a low carrier density. The highly purified intrinsic or substantially highly purified intrinsic oxide semiconductor has a low density of defect states and accordingly has a low density of trap states in some cases.

Charges trapped by the trap states in the oxide semiconductor take a long time to be released and may behave like fixed charges. Thus, a transistor whose channel is formed in an oxide semiconductor having a high density of trap states has unstable electrical characteristics in some cases.

To obtain stable electrical characteristics of the transistor, it is effective to reduce the concentration of impurities in the oxide semiconductor. In addition, to reduce the concentration of impurities in the oxide semiconductor, the concentration of impurities in a film that is adjacent to the oxide semiconductor is preferably reduced. Examples of impurities include hydrogen, nitrogen, an alkali metal, an alkaline earth metal, iron, nickel, and silicon.

Here, the influence of impurities in the oxide semiconductor is described.

When silicon or carbon that is one of Group 14 elements is contained in the oxide semiconductor, defect states are formed. Thus, the concentration of silicon or carbon in the oxide semiconductor and around an interface with the oxide semiconductor (measured by SIMS) is set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated, in some cases. Thus, a transistor including an oxide semiconductor that contains an alkali metal or an alkaline earth metal is likely to be normally-on. Therefore, it is preferable to reduce the concentration of an alkali metal or an alkaline earth metal in the oxide semiconductor. Specifically, the concentration of an alkali metal or an alkaline earth metal in the oxide semiconductor measured by SIMS is set lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; the nitrogen concentration measured by SIMS is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurity concentration is used for a channel formation region in a transistor, the transistor can have stable electrical characteristics.

For the semiconductor layer 109b, an oxide with a wide energy gap is used, for example. The energy gap of the semiconductor layer 109b is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

For example, in the case where an InGaZnO$_X$ (X>0) film is formed by a thermal CVD method as the semiconductor layer 109, trimethylindium (In(CH$_3$)$_3$), trimethylgallium (Ga(CH$_3$)$_3$), and dimethylzinc (Zn(CH$_3$)$_2$) are used. Without limitation to the above combination, triethylgallium (Ga(C$_2$H$_5$)$_3$) can be used instead of trimethylgallium, and diethylzinc (Zn(C$_2$H$_5$)$_2$) can be used instead of dimethylzinc.

For example, in the case where an InGaZnO$_X$ (X>0) film is formed as the semiconductor layer 109 by an ALD method, an In(CH$_3$)$_3$ gas and an O$_3$ gas are sequentially introduced a plurality of times to form an InO$_2$ layer, a Ga(CH$_3$)$_3$ gas and an O$_3$ gas are sequentially introduced a plurality of times to form a GaO layer, and then a Zn(CH$_3$)$_2$ gas and an O$_3$ gas are sequentially introduced a plurality of times to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by using these gases. Note that although an H$_2$O gas which is bubbled with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas or tris(acetylacetonato)indium may be used. Note that tris(acetylacetonato)indium is also referred to as In(acac)$_3$. Instead of a Ga(CH$_3$)$_3$ gas, a Ga(C$_2$H$_5$)$_3$ gas or tris(acetylacetonato)gallium may be used. Note that tris(acetylacetonato)gallium is also referred to as Ga(acac)$_3$. Furthermore, a Zn(CH$_3$)$_2$ gas or zinc acetate may be used. However, the deposition gas is not limited to these.

In the case where the semiconductor layer 109 is formed by a sputtering method, a target containing indium is preferably used in order to reduce the number of particles. In addition, if an oxide target having a high atomic ratio of the element M is used, the conductivity of the target may be decreased. Particularly in the case where a target containing indium is used, the conductivity of the target can be increased and DC discharge or AC discharge is facilitated; thus, deposition over a large substrate can be easily performed. Thus, semiconductor devices can be manufactured with improved productivity.

In the case where the semiconductor layer 109 is formed by a sputtering method, the atomic ratio of In to M and Zn contained in the target may be 3:1:1, 3:1:2, 3:1:4, 1:1:0.5, 1:1:1, 1:1:2, 1:4:4, 4:2:4.1, 1:3:2, or 1:3:4, for example.

In the cases where the semiconductor layer 109 is formed by a sputtering method, a film having an atomic ratio different from the atomic ratio of the target may be formed. Especially for zinc, the atomic ratio of zinc in a deposited film is smaller than the atomic ratio of the target in some cases. Specifically, the film has an atomic ratio of zinc of 40 atomic % to 90 atomic % of the atomic ratio of zinc in the target in some cases.

The semiconductor layer 109a and the semiconductor layer 109c are preferably formed using a material including one or more kinds of metal elements, other than oxygen, included in the semiconductor layer 109b. With the use of such a material, interface states at interfaces between the semiconductor layer 109a and the semiconductor layer 109b and between the semiconductor layer 109c and the semiconductor layer 109b are less likely to be generated. Accordingly, carriers are not likely to be scattered or captured at the interfaces, which results in an improvement in field-effect mobility of the transistor. Further, variation in threshold voltage (hereinafter also referred to as "Vth") of the transistor can be reduced. Thus, a semiconductor device having favorable electrical characteristics can be obtained.

When the semiconductor layer 109b is an In-M-Zn oxide containing In, the element M, and Zn at an atomic ratio of $x_2$:$y_2$:$z_2$ and each of the semiconductor layer 109a and the semiconductor layer 109c is an In-M-Zn oxide containing In, M, and Zn at an atomic ratio of $x_1$:$y_1$:$z_1$, $y_1/x_1$ needs to be larger than $y_2/x_2$. Preferably, the semiconductor layer 109a, the semiconductor layer 109c, and the semiconductor layer 109b in which $y_1/x_1$ is 1.5 or more times as large as $y_2/x_2$ are selected. Still further preferably, the semiconductor layer 109a, the semiconductor layer 109c, and the semiconductor layer 109b in which $y_1/x_1$ is 2 or more times as large as $y_2/x_2$ are selected. Still further preferably, the semiconductor layer 109a, the semiconductor layer 109c, and the semiconductor layer 109b in which $y_1/x_1$ is 3 or more times as large as $y_2/x_2$ are selected. In the semiconductor layer 109b at this time, $y_1$ is preferably larger than or equal to $x_1$ because the transistor can have stable electrical characteristics. However, when $y_1$ is five or more times as large as $x_1$, the field-effect mobility of the transistor is reduced; accordingly, $y_1$ is preferably smaller than five times $x_1$. When the semiconductor layers 109a and 109c each have the above structure, each of the semiconductor layers 109a and 109c can be a layer in which oxygen vacancy is less likely to occur than in the semiconductor layer 109b.

In the case of using an In-M-Zn oxide as the semiconductor layer 109a, when the summation of In and M is assumed to be 100 atomic %, the proportions of In and M are preferably set to be less than 50 atomic % and greater than or equal to 50 atomic %, respectively, more preferably less than 25 atomic % and greater than or equal to 75 atomic %, respectively. In the case of using an In-M-Zn oxide as the semiconductor layer 109b, when the summation of In and M is assumed to be 100 atomic %, the proportions of In and M are preferably set to be greater than or equal to 25 atomic % and less than 75 atomic %, respectively, more preferably greater than or equal to 34 atomic % and less than 66 atomic %, respectively. In the case of using an In-M-Zn oxide as the semiconductor layer 109c, when the summation of In and M is assumed to be 100 atomic %, the proportions of In and Mare preferably set to be less than 50 atomic % and greater than or equal to 50 atomic %, respectively, more preferably less than 25 atomic % and greater than or equal to 75 atomic %, respectively. Note that the semiconductor layer 109c and the semiconductor layer 109a may be formed using the same type of oxide.

For example, an In—Ga—Zn oxide which is formed using a target having an atomic ratio of In:Ga:Zn=1:3:2, 1:3:4, 1:3:6, 1:4:5, 1:6:4, or 1:9:6 or an In—Ga oxide which is formed using a target having an atomic ratio of In:Ga=1:9 or 7:93 can be used for each of the semiconductor layers 109a and 109c containing In or Ga. Further, an In—Ga—Zn oxide which is formed using a target having an atomic ratio of In:Ga:Zn=1:1:1 or 3:1:2 can be used for the semiconductor layer 109b. Note that the atomic ratio of each of the semiconductor layers 109a, 109b, and 109c may vary within a margin of ±20% of the corresponding atomic ratio.

For the semiconductor layer 109b, an oxide having an electron affinity higher than that of each of the semiconductor layers 109a and 109c is used. For example, for the semiconductor layer 109b, an oxide having an electron affinity higher than that of each of the semiconductor layers 109a and 109c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the conduction band minimum.

An indium gallium oxide has a small electron affinity and a high oxygen-blocking property. Therefore, the semiconductor layer 109c preferably includes an indium gallium oxide. The gallium atomic ratio [Ga/(In+Ga)] is, for example, higher than or equal to 70%, preferably higher than or equal to 80%, more preferably higher than or equal to 90%.

Note that the semiconductor layer 109a and/or the semiconductor layer 109c may be gallium oxide. For example, when gallium oxide is used for the semiconductor layer 109c, a leakage current generated between the electrode 105 and the semiconductor layer 109 can be reduced. In other words, the off-state current of the transistor 100 can be reduced.

At this time, when a gate voltage is applied, a channel is formed in the semiconductor layer 109b having the highest electron affinity among the semiconductor layers 109a to 109c.

In order to give stable electrical characteristics to the OS transistor, it is preferable that impurities and oxygen vacancies in the oxide semiconductor layer be reduced to highly purify the oxide semiconductor layer so that at least the semiconductor layer 109b can be regarded as an intrinsic or substantially intrinsic oxide semiconductor layer. Furthermore, it is preferable that at least the channel formation region of the semiconductor layer 109b be regarded as an intrinsic or substantially intrinsic semiconductor layer.

The layer 129 may be formed using a material and a method which are similar to those of the semiconductor layer 109. In the case where the layer 129 is formed using an oxide semiconductor layer, an oxide semiconductor layer which is less likely to release oxygen and/or which is less likely to absorb oxygen is preferably used.

[Energy Band Structure of Oxide Semiconductor Layer]

Figure 2A:
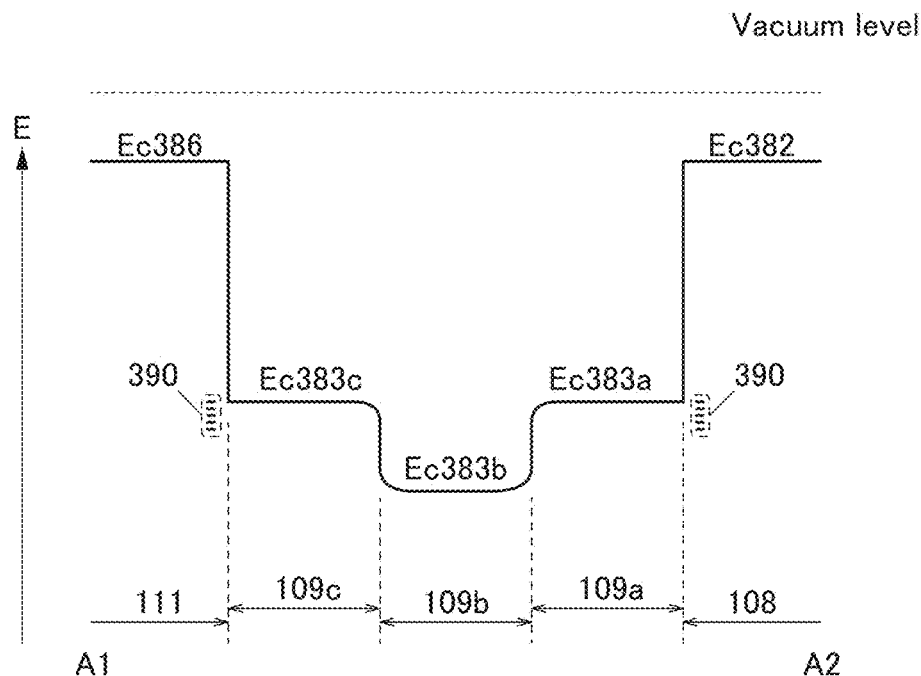
FIGS. 2A and 2B are band diagrams of stacked structures of oxide semiconductors.
Figure 2B:
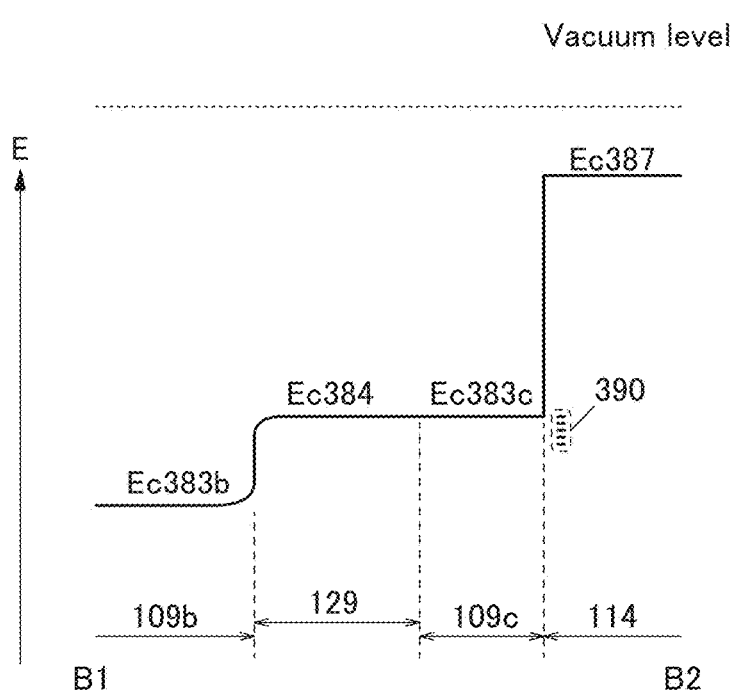

A function and an effect of the semiconductor layer 109 consisting of the semiconductor layers 109a, 109b, and 109c are described using an energy band structure diagram in FIGS. 2A and 2B. FIG. 2A illustrates the energy band structure of a portion along dashed dotted line A1-A2 in FIG. 1B. In other words, FIG. 2A illustrates the energy band structure of a channel formation region of the transistor 100.

In FIG. 2A, Ec382, Ec383a, Ec383b, Ec383c, and Ec386 indicate the energy of the conduction band minimum of the insulating layer 108, the semiconductor layer 109a, the semiconductor layer 109b, the semiconductor layer 109c, and the insulating layer 111, respectively.

Here, an electron affinity corresponds to a value obtained by subtracting an energy gap from a difference in energy between the vacuum level and the valence band maximum (the difference is also referred to as an "ionization potential"). The energy gap can be measured using a spectroscopic ellipsometer (UT-300 manufactured by HORIBA Jobin Yvon S.A.S.). The energy difference between the vacuum level and the valence band maximum can be measured using an ultraviolet photoelectron spectroscopy (UPS) device (VersaProbe manufactured by ULVAC-PHI, Inc.).

An In—Ga—Zn oxide formed using a target with an atomic ratio of In:Ga:Zn=1:3:2 has an energy gap of approximately 3.5 eV and an electron affinity of approximately 4.5 eV. An In—Ga—Zn oxide formed using a target with an atomic ratio of In:Ga:Zn=1:3:4 has an energy gap of approximately 3.4 eV and an electron affinity of approximately 4.5 eV. An In—Ga—Zn oxide formed using a target with an atomic ratio of In:Ga:Zn=1:3:6 has an energy gap of approximately 3.3 eV and an electron affinity of approximately 4.5 eV. An In—Ga—Zn oxide formed using a target with an atomic ratio of In:Ga:Zn=1:6:2 has an energy gap of approximately 3.9 eV and an electron affinity of approximately 4.3 eV. An In—Ga—Zn oxide formed using a target with an atomic ratio of In:Ga:Zn=1:6:8 has an energy gap of approximately 3.5 eV and an electron affinity of approximately 4.4 eV. An In—Ga—Zn oxide which is formed using a target having an atomic ratio of In:Ga:Zn=1:6:10 has an energy gap of approximately 3.5 eV and an electron affinity of approximately 4.5 eV. An In—Ga—Zn oxide formed using a target with an atomic ratio of In:Ga:Zn=1:1:1 has an energy gap of approximately 3.2 eV and an electron affinity of approximately 4.7 eV. An In—Ga—Zn oxide formed using a target with an atomic ratio of In:Ga:Zn=3:1:2 has an energy gap of approximately 2.8 eV and an electron affinity of approximately 5.0 eV.

Since the insulating layer 108 and the insulating layer 111 are insulators, Ec382 and Ec386 are closer to the vacuum level (have a smaller electron affinity) than Ec383a, Ec383b, and Ec383c.

Ec383a is closer to the vacuum level than Ec383b. Specifically, Ec383a is preferably located closer to the vacuum level than Ec383b by greater than or equal to 0.07 eV and less than or equal to 1.3 eV, more preferably greater than or equal to 0.1 eV and less than or equal to 0.7 eV, further preferably greater than or equal to 0.15 eV and less than or equal to 0.4 eV.

Ec383c is closer to the vacuum level than Ec383b. Specifically, Ec383c is preferably located closer to the vacuum level than Ec383b by greater than or equal to 0.07 eV and less than or equal to 1.3 eV, more preferably greater than or equal to 0.1 eV and less than or equal to 0.7 eV, further preferably greater than or equal to 0.15 eV and less than or equal to 0.4 eV.

Here, a mixed region of the semiconductor layer 109a and the semiconductor layer 109b might exist between the semiconductor layer 109a and the semiconductor layer 109b. A mixed region of the semiconductor layer 109b and the semiconductor layer 109c might exist between the semiconductor layer 109b and the semiconductor layer 109c. The mixed region has a low density of interface states. For that reason, the stack including the semiconductor layers 109a, 109b, and 109c has a band structure where energy at each interface and in the vicinity of the interface is changed continuously (continuous junction).

At this time, electrons move mainly in the semiconductor layer 109b, not in the semiconductor layer 109a and the semiconductor layer 109c. As described above, when the interface state density at the interface between the semiconductor layer 109a and the semiconductor layer 109b and the interface state density at the interface between the semiconductor layer 109b and the semiconductor layer 109c are decreased, electron movement in the semiconductor layer 109b is less likely to be inhibited and the on-state current of the transistor 100 can be increased.

Although trap states 390 due to impurities or defects might be formed at or near the interface between the semiconductor layer 109a and the insulating layer 108 and at or near the interface between the semiconductor layer 109c and the insulating layer 111, the semiconductor layer 109b can be separated from the trap states owing to the existence of the semiconductor layer 109a and the semiconductor layer 109c.

In the case where the transistor 100 has an s-channel structure, a channel is formed in the whole of the semiconductor layer 109b. Therefore, as the semiconductor layer 109b has a larger thickness, a channel formation region becomes larger. In other words, the thicker the semiconductor layer 109b is, the larger the on-state current of the transistor 100 is. The thickness of the semiconductor layer 109b is 5 nm or larger, preferably 10 nm or larger, more preferably 20 nm or larger, still more preferably 50 nm or larger.

Moreover, the thickness of the semiconductor layer 109c is preferably as small as possible to increase the on-state current of the transistor 100. The thickness of the semiconductor layer 109c is less than 20 nm, preferably less than or equal to 10 nm, more preferably less than or equal to 5 nm. Meanwhile, the semiconductor layer 109c has a function of blocking entry of elements other than oxygen (such as hydrogen and silicon) included in the adjacent insulator into the semiconductor layer 109b where a channel is formed. For this reason, it is preferable that the semiconductor layer 109c have a certain thickness. The semiconductor layer 109c may have a thickness of greater than or equal to 0.3 nm, preferably greater than or equal to 1 nm, more preferably greater than or equal to 2 nm.

To improve reliability, preferably, the thickness of the semiconductor layer 109a is large. The semiconductor layer 109a may have a thickness of greater than or equal to 10 nm, preferably greater than or equal to 20 nm, more preferably greater than or equal to 40 nm, still more preferably greater than or equal to 60 nm. When the thickness of the semiconductor layer 109a is made large, the distance from an interface between the adjacent insulator (the insulating layer 108) and the semiconductor layer 109a to the semiconductor layer 109b in which a channel is formed can be large. However, to prevent the productivity of the transistor 100 or the semiconductor device including the transistor 100 from being decreased, the semiconductor layer 109a has a thickness of, for example, less than or equal to 50 nm, preferably less than or equal to 20 nm, more preferably less than or equal to 10 nm.

The semiconductor layer 109a may have a function of blocking entry of elements other than oxygen (such as hydrogen and silicon) included in the adjacent insulator into the semiconductor layer 109b where a channel is formed. The semiconductor layer 109a may have an oxygen-blocking property to suppress outward diffusion of oxygen included in the semiconductor layer 109b.

In the case where an electrode functioning as a gate electrode or a back gate electrode is provided below the semiconductor layer 109a, the thickness of the semiconductor layer 109a is preferably as small as possible to increase the on-state current of the transistor 100. In this case, the semiconductor layer 109a may include a region with a thickness of less than 20 nm, preferably less than or equal to 10 nm, further preferably less than or equal to 5 nm, for example.

FIG. 2B illustrates the energy band structure of a portion along dashed dotted line B1-B2 in FIG. 1D. In other words, FIG. 2B illustrates the energy band structure of a side surface of the semiconductor layer 109b.

In FIG. 2B, Ec387, Ec383c, Ec384, and Ec383b indicate the energy of the conduction band minimum of the insulating layer 114, that of the semiconductor layer 109c, that of the layer 129, and that of the semiconductor layer 109b, respectively. In FIG. 2B, the layer 129 and the semiconductor layer 109c have substantially the same electron affinity.

Although the trap states 390 due to impurities or defects might be formed at or in the vicinity of the interface between the side surface of the semiconductor layer 109c and the insulating layer 114, the side surface of the semiconductor layer 109b can be apart from the trap states owing to the existence of the layer 129 and the semiconductor layer 109c.

By providing the layer 129 and the semiconductor layer 109c on the side surface of the semiconductor layer 109b, diffusion of elements other than oxygen (such as hydrogen and silicon) included in the adjacent insulator into the inside through the side surface of the semiconductor layer 109b can be prevented. Furthermore, outward diffusion of oxygen included in the semiconductor layer 109b can be suppressed.

Although the semiconductor layer 109 has the above stacked-structure including three layers in this embodiment, one embodiment of the present invention is not limited thereto. For example, the semiconductor layer 109 may have a two-layer structure without one of the semiconductor layer 109a and the semiconductor layer 109c. Alternatively, a four-layer structure in which any one of the semiconductors described as examples of the semiconductor layer 109a, the semiconductor layer 109b, and the semiconductor layer 109c is provided under or over the semiconductor layer 109a or under or over the semiconductor layer 109c may be employed. Further alternatively, it is possible to employ an n-layer structure (n is an integer of 5 or more) in which any one of the semiconductors described as examples of the semiconductor layer 109a, the semiconductor layer 109b, and the semiconductor layer 109c is provided at two of the following positions: under the semiconductor layer 109a; over the semiconductor layer 109a; under the semiconductor layer 109c; and over the semiconductor layer 109c.

[Concentration of Impurities in Oxide Semiconductor Layer]

Note that silicon contained in the oxide semiconductor might serve as a carrier trap or a carrier generation source. Therefore, the silicon concentration of the semiconductor layer 109b is preferably as low as possible. For example, a region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS is provided between the semiconductor layer 109b and the semiconductor layer 109a. A region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS is provided between the semiconductor layer 109b and the semiconductor layer 109c.

It is preferable to reduce the concentration of hydrogen in the semiconductor layer 109a and the semiconductor layer 109c in order to reduce the concentration of hydrogen in the semiconductor layer 109b. The semiconductor layer 109a and the semiconductor layer 109c each have a region in which the concentration of hydrogen measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$.

It is preferable to reduce the concentration of nitrogen in the semiconductor layer 109a and the semiconductor layer 109c in order to reduce the concentration of nitrogen in the semiconductor layer 109b. The semiconductor layer 109a and the semiconductor layer 109c each have a region in which the concentration of nitrogen measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

Note that when copper enters the oxide semiconductor, an electron trap might be generated. The electron trap might shift the threshold voltage of the transistor in the positive direction. Therefore, the copper concentration at the surface of or in the semiconductor layer 109b is preferably as low as possible. For example, the semiconductor layer 109b preferably has a region in which the copper concentration is lower than or equal to $1\times10^{19}$ atoms/cm$^3$, lower than or equal to $5\times10^{18}$ atoms/cm$^3$, or lower than or equal to $1\times10^{18}$ atoms/cm$^3$.

<Method for Manufacturing Transistor 100>

An example of a method for manufacturing the transistor 100 will be described with reference to FIGS. 3A to 3D, FIGS. 4A to 4C, FIGS. 5A to 5C, FIGS. 6A to 6C, FIGS. 7A to 7C, FIGS. 8A and 8B, FIGS. 9A and 9B, and FIGS. 10A and 10B. An L1-L2 cross section in each of FIGS. 3A to 10B corresponds to the cross section taken along dashed dotted line L1-L2 in FIG. 1A. A W1-W2 cross section in each of FIGS. 3A to 10B corresponds to the cross section taken along dashed dotted line W1-W2 in FIG. 1A.

[Step 1]

Figure 3A:
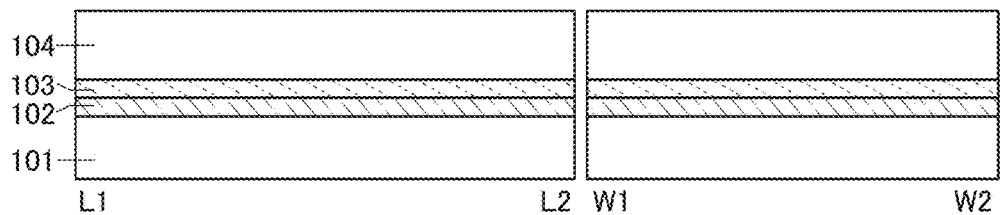
FIGS. 3A to 3D illustrate an example of a method for manufacturing a transistor of one embodiment of the present invention.

First, the insulating layer 102, the insulating layer 103, and the insulating layer 104 are sequentially formed over the substrate 101 (see FIG. 3A). In this embodiment, a single crystal silicon substrate (a p-type semiconductor substrate or an n-type semiconductor substrate) is used as the substrate 101.

A silicon nitride film is formed by a CVD method as the insulating layer 102. An aluminum oxide film is formed by an ALD method as the insulating layer 103. A dense insulating layer including reduced defects such as cracks or pinholes or having a uniform thickness can be formed by an ALD method. A silicon oxide film is formed by a CVD method as the insulating layer 104.

[Step 2]

Next, a resist mask is formed over the sample surface (not illustrated). The resist mask can be formed by a photolithography method, a printing method, an inkjet method, or the like as appropriate. Formation of the resist mask by a printing method, an inkjet method, or the like needs no photomask; thus, manufacturing cost can be reduced.

The formation of the resist mask by a photolithography method can be performed in such a manner that a photosensitive resist is irradiated with light through a photomask and a portion of the resist which has been exposed to light (or has not been exposed to light) is removed using a developing solution. Examples of light with which the photosensitive resist is irradiated include KrF excimer laser light, ArF excimer laser light, extreme ultraviolet (EUV) light, and the like. Alternatively, a liquid immersion technique may be employed in which light exposure is performed with a portion between a substrate and a projection lens filled with liquid (e.g., water). An electron beam or an ion beam may be used instead of the above-mentioned light. Note that a photomask is not necessary in the case of using an electron beam or an ion beam. Note that a dry etching method such as ashing or a wet etching method using a dedicated stripper or the like can be used for removal of the resist mask. Both the dry etching method and the wet etching method may be used.

Figure 3B:
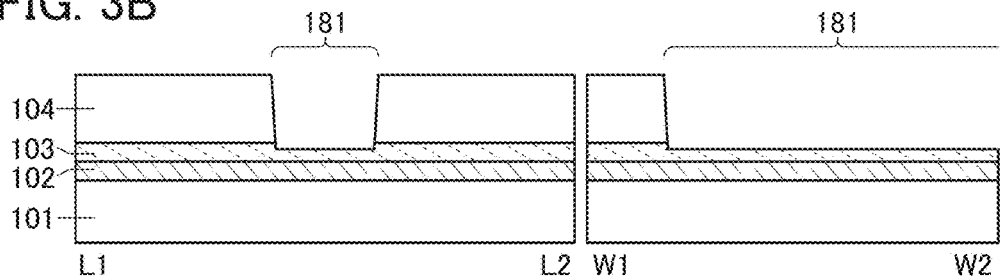

With the use of the resist mask as a mask, a portion of the insulating layer 104 is selectively removed to form an opening 181 (see FIG. 3B). After that, the resist mask is removed. When the opening 181 is formed, a portion of the insulating layer 103 is also removed in some cases.

[Step 3]

Figure 3C:
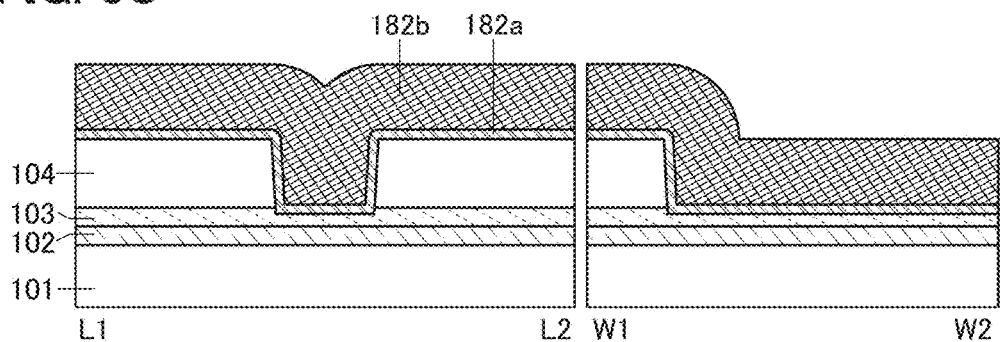

Next, a conductive layer 182a and a conductive layer 182b are sequentially formed over the sample surface (see FIG. 3C). In this embodiment, a titanium nitride film is formed by an ALD method as the conductive layer 182a. A tungsten film is formed by a sputtering method as the conductive layer 182b.

[Step 4]

Figure 3D:
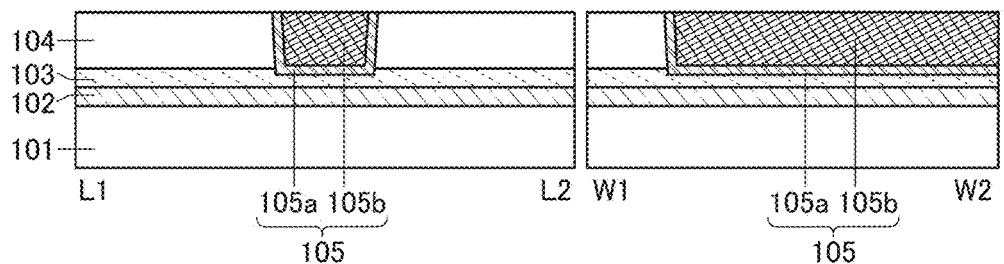

Next, the sample surface is subjected to chemical mechanical polishing (CMP) treatment (hereinafter also referred to as "CMP treatment") (see FIG. 3D). By CMP treatment, portions of the conductive layers 182a and 182b are removed to form the electrode 105a and the electrode 105b. At this time, a portion of a surface of the insulating layer 104 is also removed in some cases. By the CMP treatment, unevenness of the sample surface can be reduced, and coverage with an insulating layer or a conductive layer to be formed later can be increased.

[Step 5]

Figure 4A:
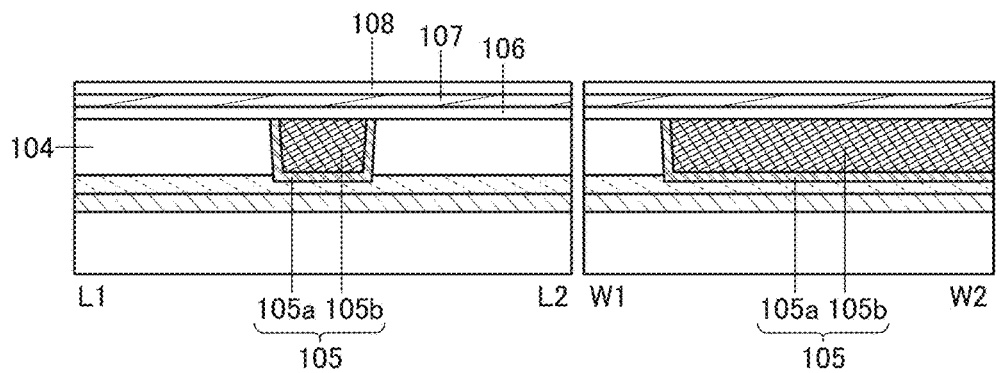
FIGS. 4A to 4C illustrate an example of a method for manufacturing a transistor of one embodiment of the present invention.

Next, the insulating layer 106, the insulating layer 107, and the insulating layer 108 are sequentially formed over the sample surface (see FIG. 4A). In this embodiment, as each of the insulating layers 106 and 108, a 5-nm-thick silicon oxynitride film is formed by a CVD method.

The insulating layer 107 is preferably formed using a high-k material such as hafnium oxide, aluminum oxide, tantalum oxide, or yttrium oxide. When the insulating layer 107 is formed using any of these materials, the insulating layer 107 can function as a charge trap layer. The threshold voltage of the transistor 100 can be changed by injecting electrons into the insulating layer 107. For example, the injection of electrons into the insulating layer 107 can be performed with the use of the tunnel effect. By applying a positive voltage to the electrode 105, tunnel electrons can be injected into the insulating layer 107. In this embodiment, a 5-nm-thick aluminum oxide film is formed as the insulating layer 107 by an ALD method.

As described above, the insulating layer 108 is preferably an insulating layer containing excess oxygen. Oxygen doping treatment may be performed after the formation of the insulating layer 108.

[Step 6]

Figure 4B:
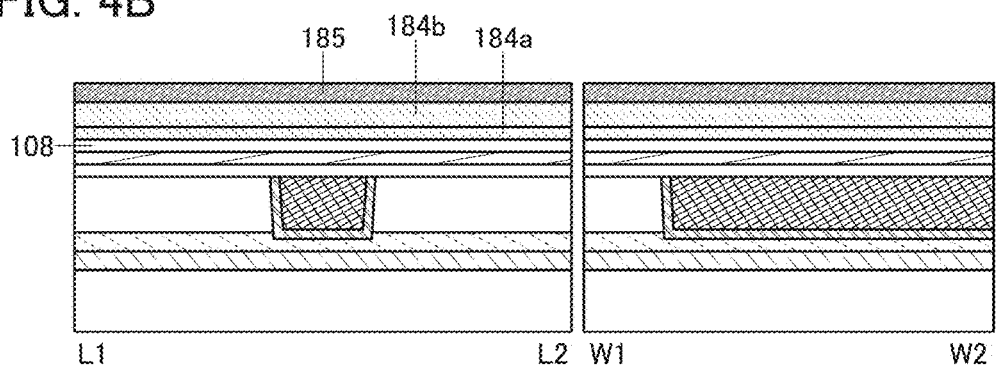
Figure 4C:
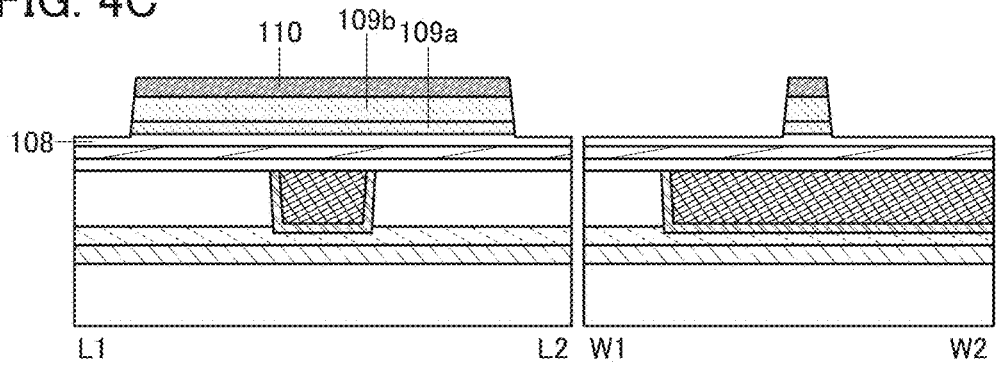

Next, the semiconductor layer 184a, the semiconductor layer 184b, and the conductive layer 185 are sequentially formed over the sample surface (see FIG. 4B). In this embodiment, the semiconductor layer 184a is formed by a sputtering method using a target having a composition of In:Ga:Zn=1:3:2. The semiconductor layer 184b is formed by a sputtering method using a target having a composition of In:Ga:Zn=1:1:1. As the conductive layer 185, a tungsten film is formed by a sputtering method.

By introducing impurity elements into the semiconductor layer 184b after the semiconductor layer 184b is formed, the threshold voltage of the transistor can be changed. Impurity elements can be introduced by an ion implantation method, an ion doping method, a plasma immersion ion implantation method, plasma treatment using a gas containing impurity elements, or the like. In the case where impurity elements are introduced by an ion implantation method or the like, the introduction may be performed after the conductive layer 185 is formed.

[Step 7]

Next, a resist mask is formed over the sample surface by a photolithography process (not illustrated). Then, with the use of the resist mask as a mask, portions of the semiconductor layer 184a, the semiconductor layer 184b, and the conductive layer 185 are selectively removed to form the semiconductor layer 109a, the semiconductor layer 109b, and the electrode 110 (see FIG. 4C). At this time, a portion of the insulating layer 108 is also etched; thus, the insulating layer 108 has a projection.

The introduction of impurities into the semiconductor layer 184b which is described in Step 6 may be performed after Step 7.

[Step 8]

Figure 5A:
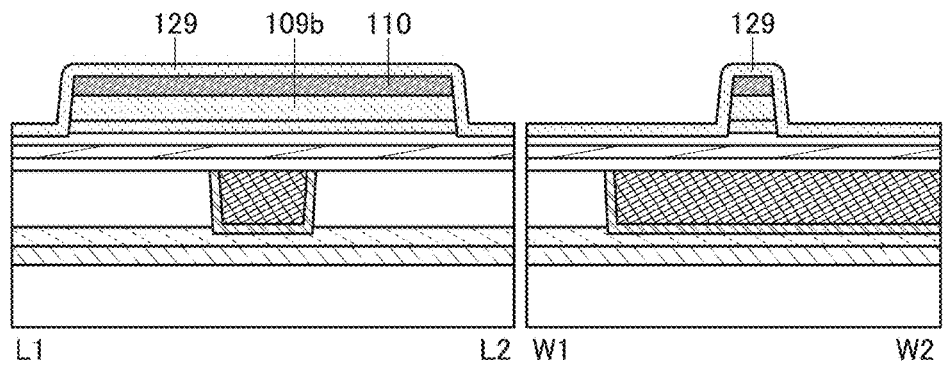
FIGS. 5A to 5C illustrate an example of a method for manufacturing a transistor of one embodiment of the present invention.
Figure 5B:
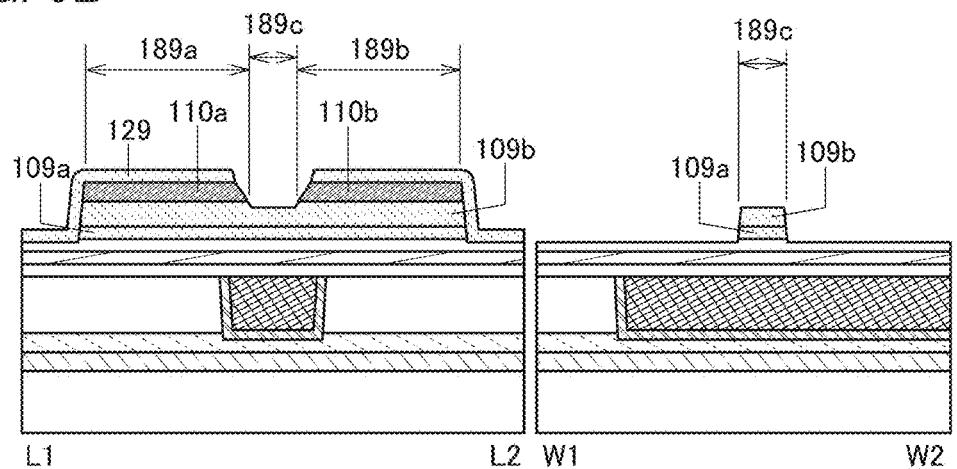
Figure 5C:
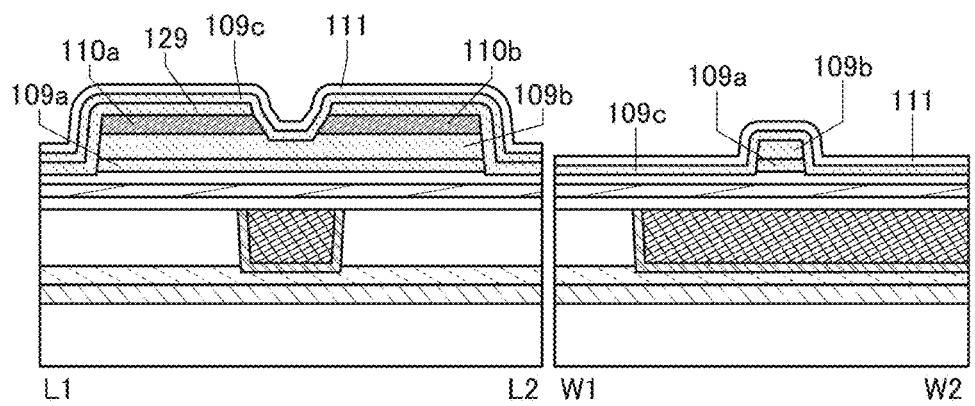

Next, the layer 129 is formed to cover the semiconductor layer 109a, the semiconductor layer 109b, and the electrode 110 (see FIG. 5A). In this embodiment, an oxide semiconductor is used for the layer 129. Specifically, the layer 129 is formed by a sputtering method using a target having a composition of In:Ga:Zn=1:3:2. Since the transmittance of oxygen in an oxide semiconductor depends on the composition, the composition of the oxide semiconductor to be used may be determined in accordance with the purpose as appropriate. For example, the layer 129 may be formed by a sputtering method using a target having a composition of In:Ga:Zn=1:3:4. Furthermore, the layer 129 covers side surfaces of the electrode 110 and side surfaces of the semiconductor layers 109b and 109a.

[Step 9]

Next, heat treatment is preferably performed to reduce impurities such as moisture and hydrogen contained in the semiconductor layer 109a and the semiconductor layer 109b and to highly purify the semiconductor layer 109a and the semiconductor layer 109b.

For example, the semiconductor layer 109a and the semiconductor layer 109b are subjected to heat treatment in a reduced-pressure atmosphere, an inert gas atmosphere of nitrogen, a rare gas, or the like, an oxidizing gas atmosphere, or an ultra-dry air atmosphere (the moisture amount is 20 ppm (−55° C. by conversion into a dew point) or less, preferably 1 ppm or less, more preferably 10 ppb or less, in the case where the measurement is performed by a dew point meter in a cavity ring down laser spectroscopy (CRDS) system). Note that the oxidizing gas atmosphere refers to an atmosphere containing an oxidizing gas such as oxygen, ozone, or nitrogen oxide at 10 ppm or higher. The inert gas atmosphere refers to an atmosphere which contains the oxidizing gas at lower than 10 ppm and is filled with nitrogen or a rare gas.

By the heat treatment, at the same time that the impurities are released, oxygen contained in the insulating layer 108 is diffused into the semiconductor layer 109a and the semiconductor layer 109b and oxygen vacancies in the semiconductor layer 109a and the semiconductor layer 109b can be reduced. Note that the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for desorbed oxygen. The heat treatment may be performed at any time after the semiconductor layer 184b is formed.

The heat treatment may be performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

In this embodiment, after heat treatment is performed at 400° C. in a nitrogen gas atmosphere for 1 hour, heat treatment is performed at 400° C. in an oxygen gas atmosphere for 1 hour. By performing the heat treatment in a nitrogen gas atmosphere first, impurities such as moisture or hydrogen contained in the semiconductor layer 109a and the semiconductor layer 109b are released, so that the impurity concentration in the semiconductor layers 109a and 109b is reduced. By performing the heat treatment in an oxygen gas atmosphere next, oxygen is introduced into the semiconductor layers 109a and 109b.

Note that in a CAAC-OS (described below), impurities or oxygen moves more easily in the a-axis direction and the b-axis direction than in the c-axis direction (film thickness direction). For example, in the case where the semiconductor layer is formed using a CAAC-OS, impurities are released mainly from a side surface of the semiconductor layer. Similarly, in the case where the semiconductor layer is formed using a CAAC-OS, oxygen is introduced mainly from the side surface of the semiconductor layer.

The transmittance of impurities or oxygen in the thickness direction can be changed by adjusting the crystal state, composition, or the like of an oxide semiconductor. For example, the transmittance of oxygen in the thickness direction can be increased by mixing an nc-OS, an amorphous oxide semiconductor, or the like to an oxide semiconductor. In particular, in the case where the semiconductor layer 109a and the semiconductor layer 109b are formed using a CAAC-OS, the layer 129 covering the side surfaces of the semiconductor layers is preferably formed using an oxide semiconductor containing an nc-OS, an amorphous oxide semiconductor, or the like.

Meanwhile, by covering the electrode 110 with the layer 129, excessive oxidation of the electrode 110 in heat treatment under an oxidation atmosphere can be prevented.

[Step 10]

Next, a resist mask is formed over the sample surface, and a portion of the layer 129 is selectively removed using the resist mask as a mask. Furthermore, by selectively removing a portion of the electrode 110, the electrode 110a and the electrode 110b are formed (see FIG. 5B). At this time, an exposed portion of the semiconductor layer 109b is removed in some cases.

Here, a region of the semiconductor layer 109b which overlaps with the electrode 110a is referred to as the region 189a. A region of the semiconductor layer 109b which overlaps with the electrode 110b is referred to as the region 189b. A region of the semiconductor layer 109b which is located between the region 189a and the region 189b is referred to as the region 189c. One of the region 189a and the region 189b can function as one of the source region and the drain region of the transistor 100. The other of the region 189a and the region 189b can function as the other of the source region and the drain region of the transistor 100. The region 189c can function as a channel formation region.

The introduction of impurities into the semiconductor layer 184b which is described in Step 6 may be performed after Step 10.

[Step 11]

Next, the semiconductor layer 109c is formed to cover the regions 189a to 189c. The insulating layer 111 is formed over the semiconductor layer 109c (see FIG. 5C). In this embodiment, the semiconductor layer 109c is formed by a sputtering method using a target having a composition of In:Ga:Zn=1:3:2. Since the transmittance of oxygen in an oxide semiconductor depends on the composition, the composition of the oxide semiconductor to be used may be determined in accordance with the purpose as appropriate. For example, the semiconductor layer 109c may be formed by a sputtering method using a target having a composition of In:Ga:Zn=1:3:4. Oxygen doping treatment may be performed after the formation of the semiconductor layer 109c.

A silicon oxynitride film is formed by a CVD method as the insulating layer 111. As described above, the insulating layer 111 is preferably an insulating layer containing excess oxygen. Oxygen doping treatment may be performed after the formation of the insulating layer 111. Heat treatment may be performed after the formation of the insulating layer 111.

A portion of the semiconductor layer 109c is in contact with the region 189c of the semiconductor layer 109b. The layer 129 and the semiconductor layer 109c cover side surfaces of the electrodes 110a and 110b and side surfaces of the semiconductor layers 109a and 109b. In this manner, the semiconductor layer 109b can be surrounded by the semiconductor layer 109a, the layer 129, and the semiconductor layer 109c.

By surrounding the semiconductor layer 109b by the semiconductor layer 109a, the layer 129, and the semiconductor layer 109c, diffusion of impurities generated in a later step into the semiconductor layer 109b can be suppressed.

[Step 12]

Next, a conductive layer 191a and a conductive layer 191b are sequentially formed over the sample surface. In this embodiment, the conductive layer 191a and the conductive layer 191b are formed using titanium nitride and tungsten, respectively (see FIG. 6A).

[Step 13]

Next, a resist mask is formed over the sample surface by a photolithography process (not illustrated). With the use of the resist mask as a mask, portions of the conductive layers 191a and 191b are selectively removed to form the electrode 112a and the electrode 112b (see FIG. 6B).

[Step 14]

Figure 6A:
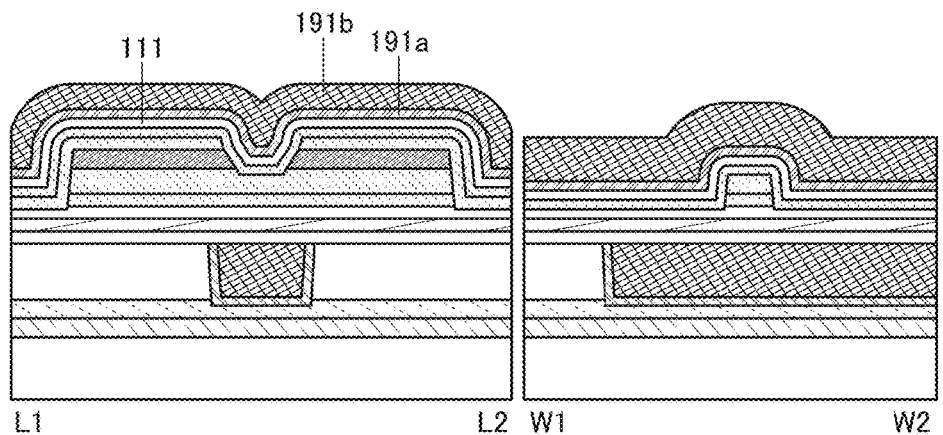
FIGS. 6A to 6C illustrate an example of a method for manufacturing a transistor of one embodiment of the present invention.
Figure 6B:
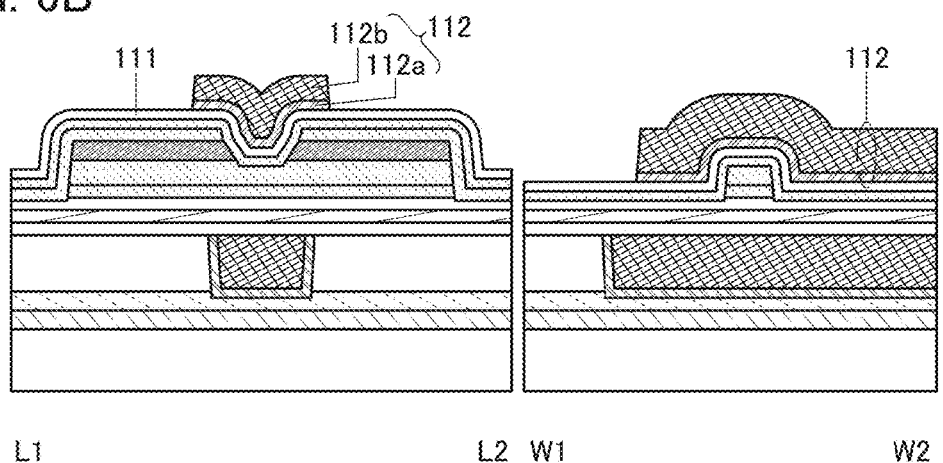
Figure 6C:
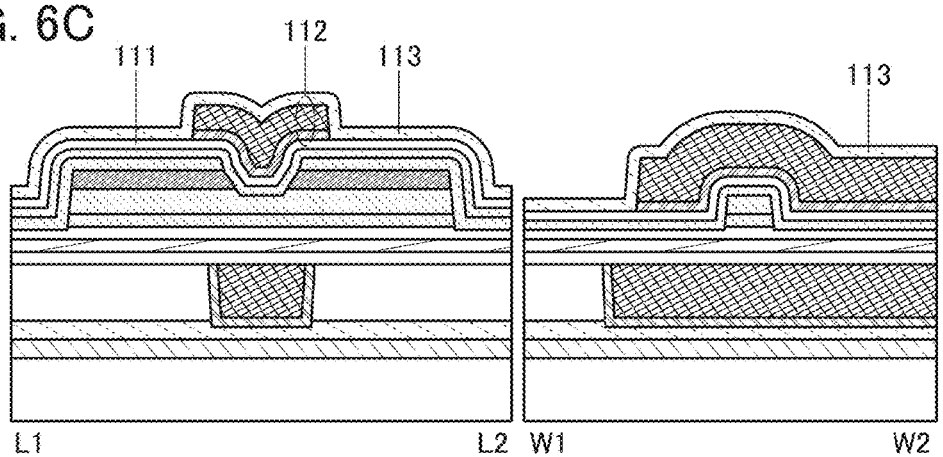

Next, the insulating layer 113 is formed over the sample surface (see FIG. 6C). In this embodiment, an aluminum oxide film is formed by an ALD method as the insulating layer 113.

When the insulating layer 114 to be formed later and the electrode 112 are in direct contact with each other, oxygen in the insulating layer 114 is absorbed by the electrode 112 in heat treatment to be performed later, so that the amount of oxygen supplied to the semiconductor layer 109 might be insufficient. The resistance of the electrode 112 might be increased by oxidizing the electrode 112. By covering the electrode 112 with the insulating layer 113 before the insulating layer 114 is formed, oxygen contained in the insulating layer 114 can be prevented from moving to the electrode 112.

By forming the insulating layer 113 by an ALD method, oxidation of the electrode 112 at the formation of the insulating layer 113 can be prevented.

Next, a resist mask is formed over the insulating layer 113 by a photolithography process (not illustrated). With the use of the resist mask as a mask, portions of the insulating layers 113 and 111 are selectively removed to expose a portion of the semiconductor layer 109c (see FIG. 7A). The insulating layer 113 and the insulating layer 111 are in contact with each other on an outer side than an end portion of the electrode 112.

[Step 15]

Next, the insulating layer 114 and the insulating layer 115 are sequentially formed over the sample surface. In this embodiment, a silicon oxynitride film is formed as the insulating layer 114 by a CVD method (see FIG. 7B). The insulating layer 114 is preferably an insulating layer containing excess oxygen. After the formation of the insulating layer 114, unevenness of the sample surface is preferably reduced by performing CMP treatment on the sample surface. The insulating layer 114 may be subjected to oxygen doping treatment.

Figure 7A:
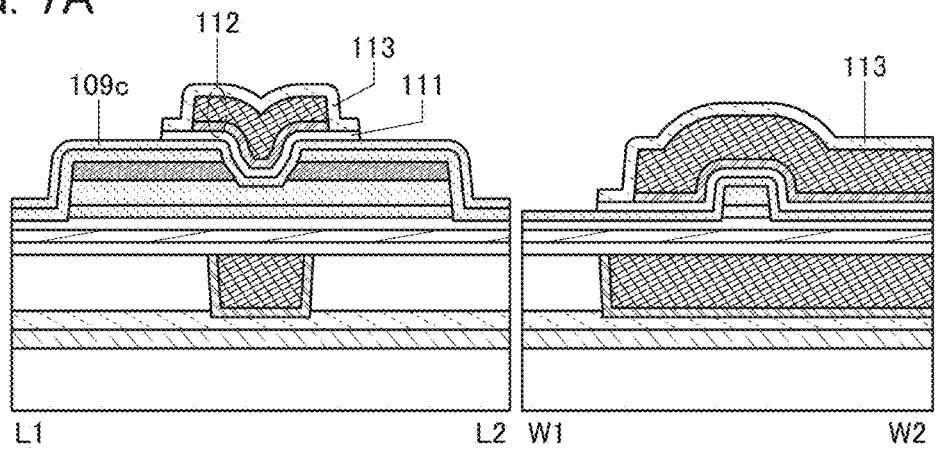
FIGS. 7A to 7C illustrate an example of a method for manufacturing a transistor of one embodiment of the present invention.
Figure 7B:
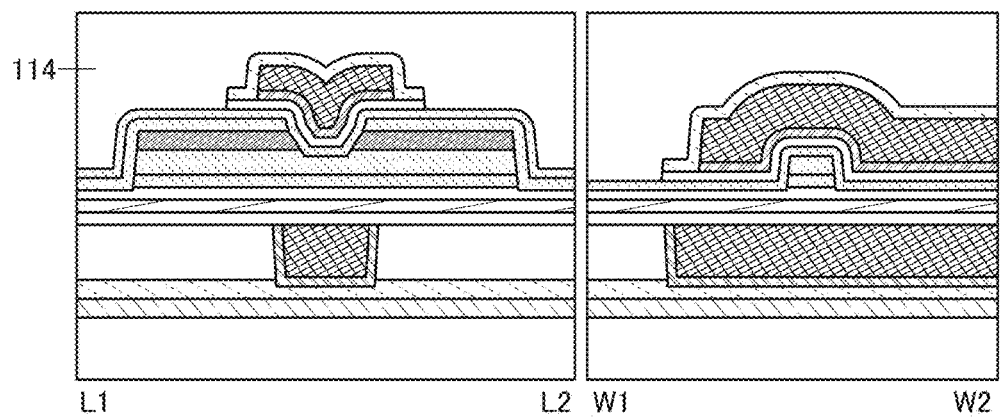
Figure 7C:
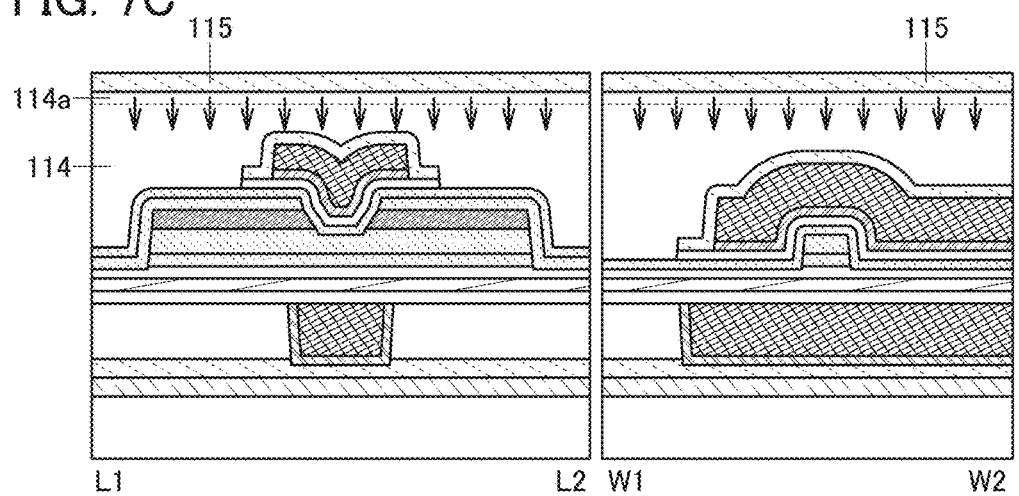

As the insulating layer 115, an aluminum oxide film is formed by a sputtering method (see FIG. 7C). At this time, part of oxygen used as a sputtering gas is introduced into the insulating layer 114, whereby a region 114a containing excess oxygen is formed.

Part of excess oxygen in the insulating layer 114 reacts with hydrogen left in the insulating layer 114 to be water in some cases. Thus, after the insulating layer 115 is formed, the insulating layer 115 is removed and heat treatment is performed, so that hydrogen left in the insulating layer 114 can be released as water. By repeating the formation of the insulating layer 115, the removal of the insulating layer 115, and the heat treatment a plurality of times, the hydrogen concentration in the insulating layer 114 can be further reduced.

Furthermore, by performing oxygen doping treatment and heat treatment before the formation of the insulating layer 115, hydrogen left in the insulating layer 114 can be released as water. By repeating the oxygen doping treatment and the heat treatment a plurality of times, the hydrogen concentration in the insulating layer 114 can be further reduced.

After the formation of the insulating layer 115, oxygen doping treatment may be performed.

By providing the layer 129 and the insulating layer 113, oxygen in the insulating layer 114 can be less likely to be absorbed by the electrode 110a, the electrode 110b, and the electrode 112. Thus, an increase in resistance of the electrode 110a, the electrode 110b, and the electrode 112 due to oxidation can be suppressed. Furthermore, the shortage of oxygen supplied to the semiconductor layer 109 can be prevented.

[Step 16]

Heat treatment is performed after the insulating layer 115 is formed over the insulating layer 114. By performing heat treatment after the formation of the insulating layer 115, diffusion of oxygen contained in the insulating layer 114 into the outside can be prevented and the oxygen can be efficiently introduced into the oxide semiconductor layer.

By providing the layer 129 and the insulating layer 113, in the heat treatment, oxygen in the insulating layer 114 can be less likely to be absorbed by the electrode 110a, the electrode 110b, and the electrode 112. Thus, an increase in resistance of the electrode 110a, the electrode 110b, and the electrode 112 due to oxidation can be suppressed. Furthermore, the shortage of oxygen supplied to the semiconductor layer 109 can be prevented.

[Step 17]

Figure 8A:
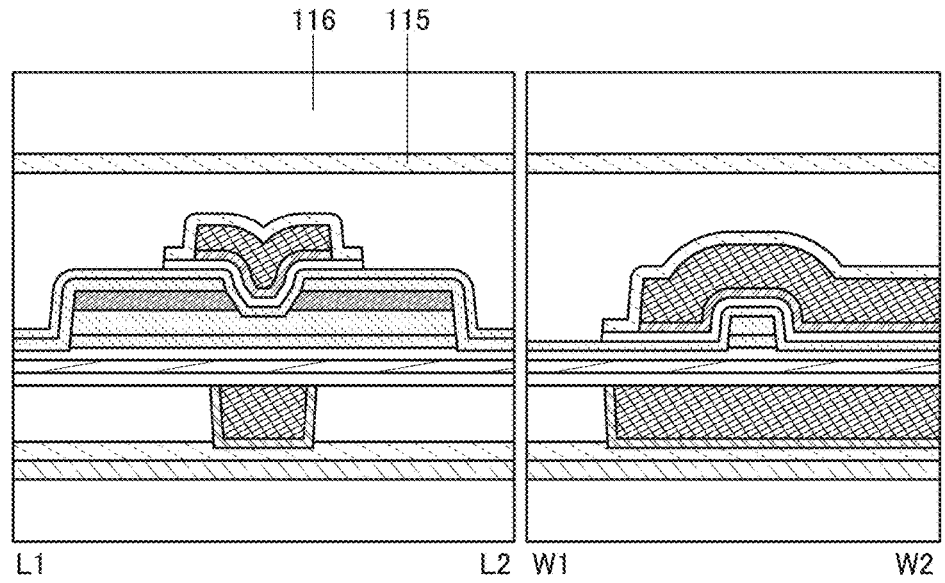
FIGS. 8A and 8B illustrate an example of a method for manufacturing a transistor of one embodiment of the present invention.
Figure 8B:
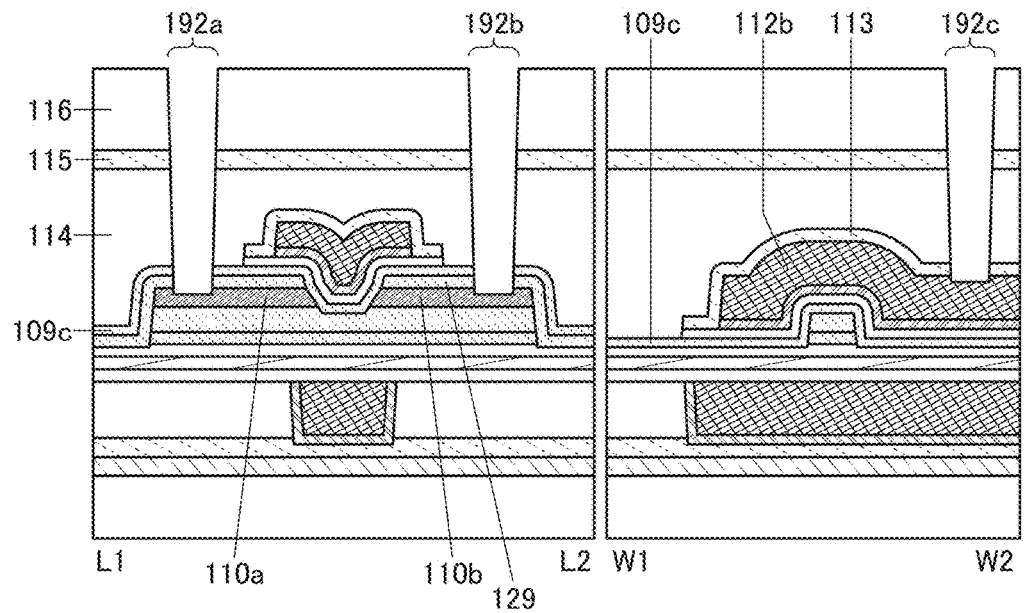

Next, the insulating layer 116 is formed over the sample surface (see FIG. 8A). The insulating layer 116 preferably includes an insulator having a low dielectric constant (low-k material). The use of a material with a low dielectric constant in an interlayer film can reduce the parasitic capacitance between wirings. As the low-k material, silicon oxide to which fluorine is added, silicon oxide to which carbon is added, or the like can be used.

[Step 18]

Next, a resist mask is formed over the sample surface by a photolithography method (not illustrated). With the use of the resist mask as a mask, portions of the insulating layer 116, the insulating layer 115, the insulating layer 114, the semiconductor layer 109c, and the layer 129 are removed to form an opening 192a and an opening 192b. Furthermore, portions of the insulating layer 116, the insulating layer 115, the insulating layer 114, and the insulating layer 113 are removed to form an opening 192c (see FIG. 8B). The openings 192a, 192b, and 192c overlap with the electrodes 110a, 110b, and 112b, respectively. An exposed portion of the electrode 110a is etched at the formation of the opening 192a in some cases. An exposed portion of the electrode 110b is etched at the formation of the opening 192b in some cases. An exposed portion of the electrode 112b is etched at the formation of the opening 192c in some cases.

[Step 19]

Figure 9A:
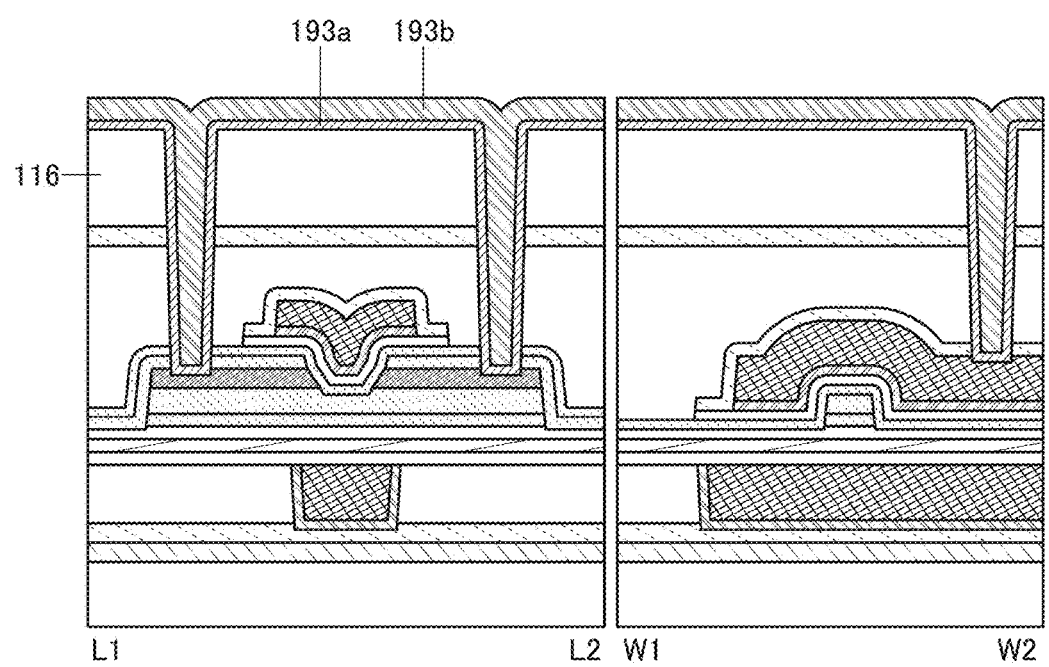
FIGS. 9A and 9B illustrate an example of a method for manufacturing a transistor of one embodiment of the present invention.

Next, a conductive layer 193a and a conductive layer 193b are sequentially formed over the sample surface (see FIG. 9A). In this embodiment, a titanium nitride film is formed by an ALD method as the conductive layer 193a. A tungsten film is formed by a sputtering method as the conductive layer 193b.

[Step 20]

Figure 9B:
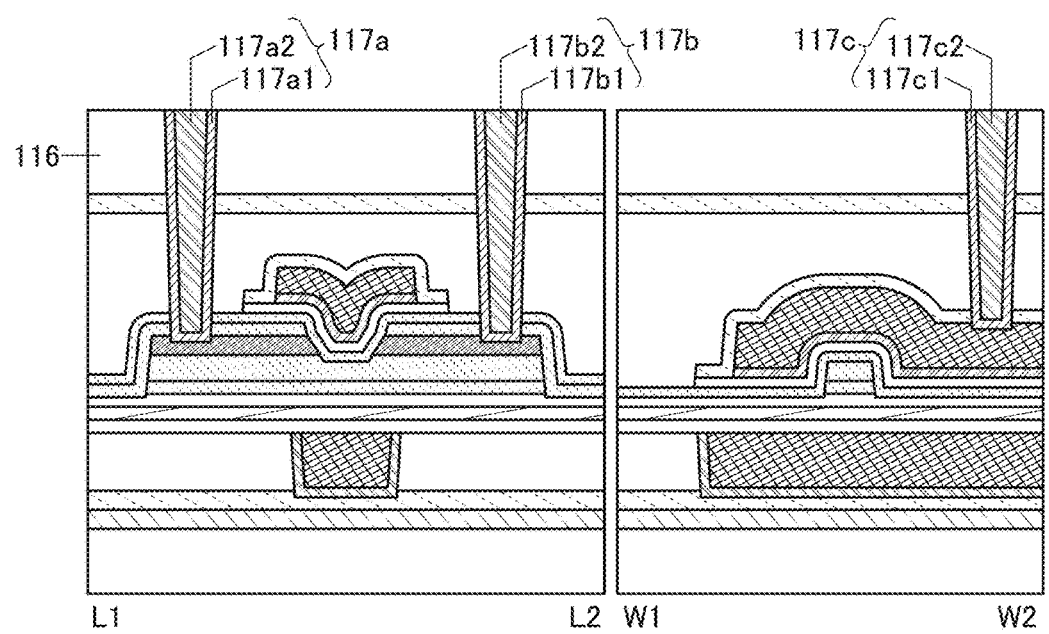

Next, the sample surface is subjected to CMP treatment (see FIG. 9B). By CMP treatment, portions of the conductive layers 193a and 193b are removed to form the electrode 117a (the electrode 117a1 and the electrode 117a2), the electrode 117b (the electrode 117b1 and the electrode 117b2), and the electrode 117c (the electrode 117c1 and the electrode 117c2). At this time, a portion of a surface of the insulating layer 116 is also removed in some cases.

[Step 21]

Figure 10A:
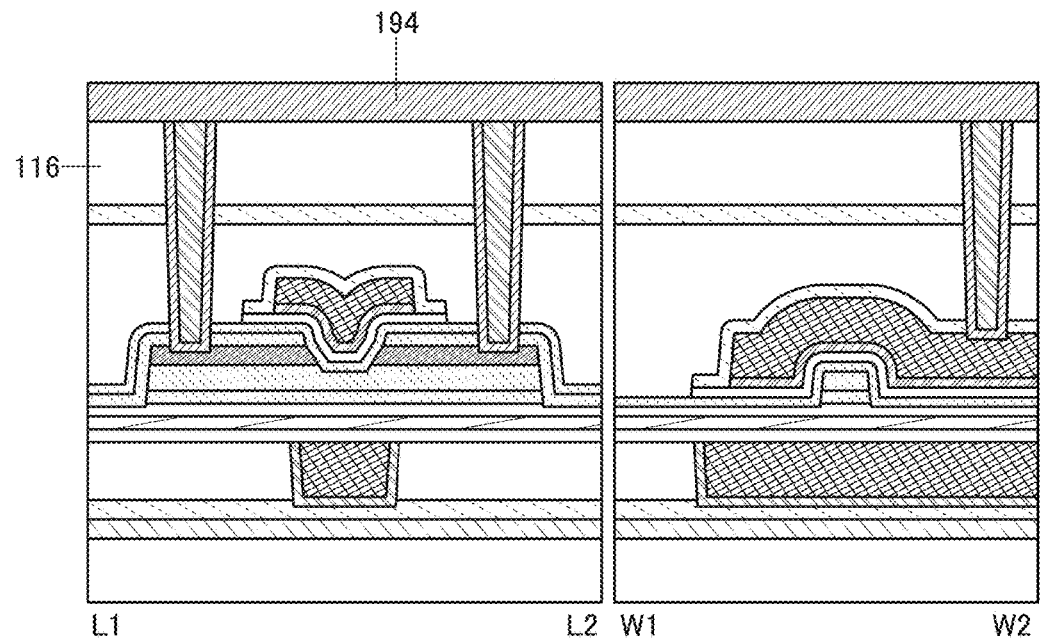
FIGS. 10A and 10B illustrate an example of a method for manufacturing a transistor of one embodiment of the present invention.

Next, a conductive layer 194 is formed over the sample surface (see FIG. 10A). In this embodiment, a tungsten film is formed by a sputtering method as the conductive layer 194.

[Step 22]

Next, a resist mask is formed over the sample surface by a photolithography process (not illustrated). With the use of the resist mask as a mask, a portion of the conductive layer 194 is selectively removed to form the electrodes 118a to 118c (see FIG. 10B). Note that a portion of the insulating layer 116 is removed at the formation of the electrodes 118a to 118c in some cases.

[Step 23]

Figure 10B:
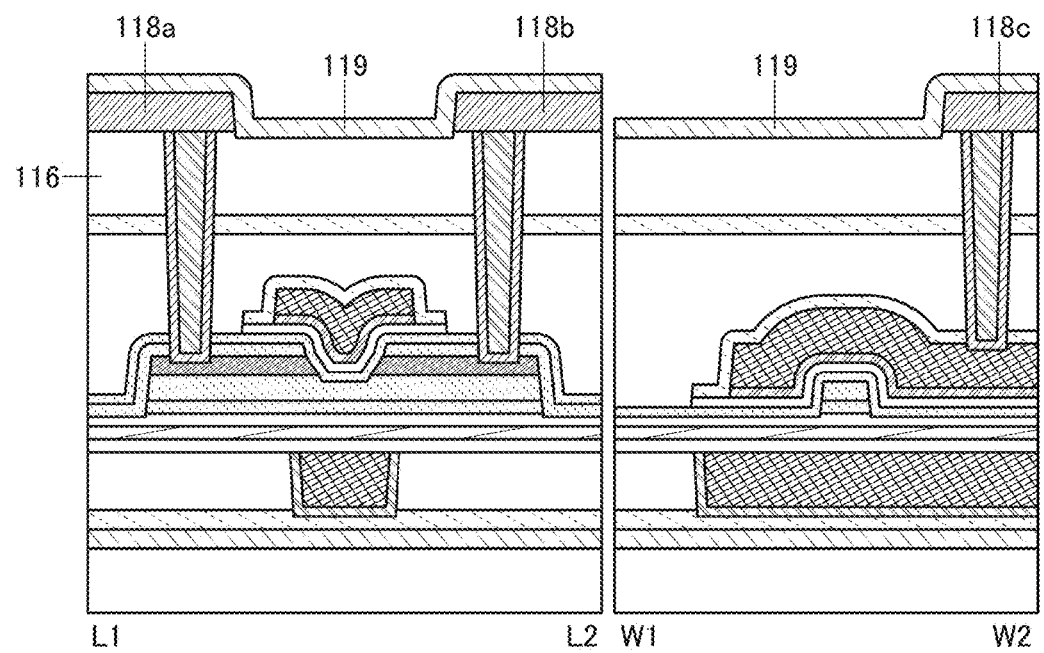

Next, the insulating layer 119 is formed over the sample surface (see FIG. 10B). In this embodiment, a silicon nitride film is formed by a CVD method as the insulating layer 119.

[Modification Example 1]

Figure 11A:
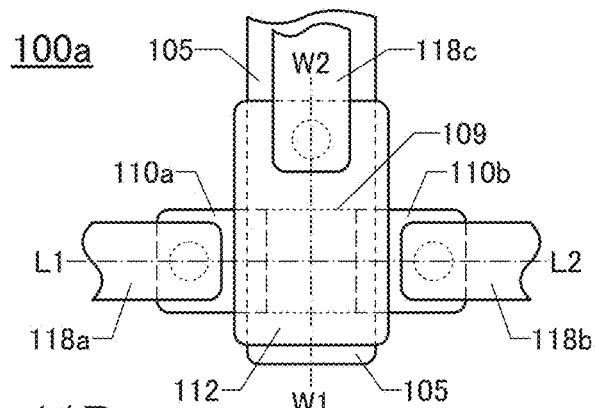
FIGS. 11A to 11D illustrate a transistor of one embodiment of the present invention.
Figure 11B:
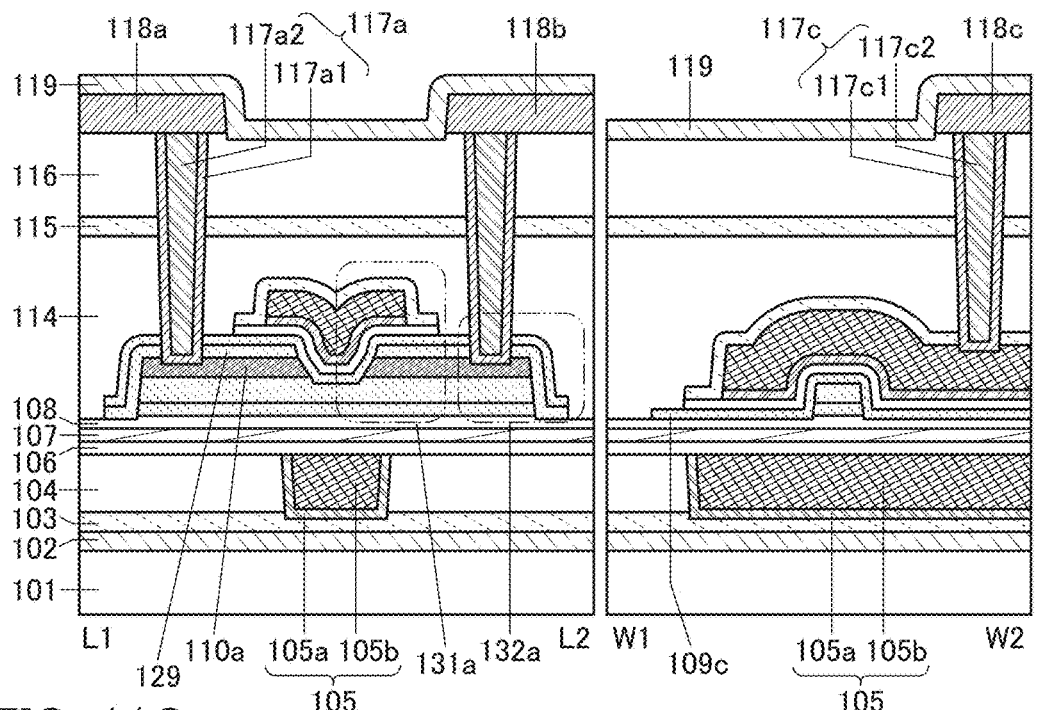
Figure 11C:
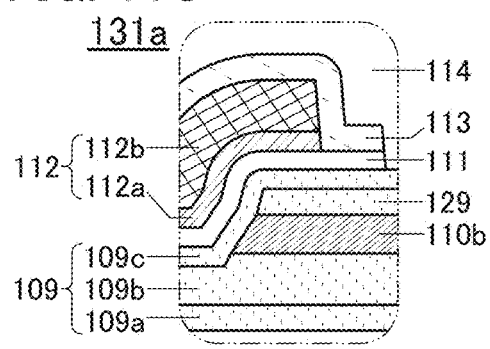
Figure 11D:
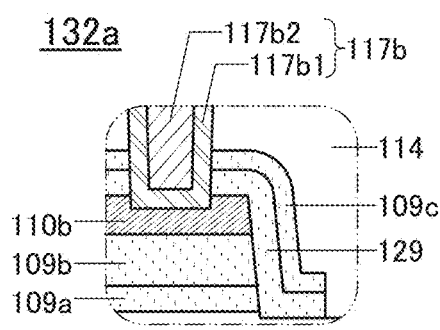

FIGS. 11A to 11D illustrate a transistor 100a. FIG. 11A illustrates a plan view of the transistor 100a. FIG. 11B illustrates a cross-sectional view taken along dashed-dotted line L1-L2 and a cross-sectional view taken along dashed-dotted line W1-W2 in FIG. 11A. FIG. 11C is an enlarged view of a portion 131a in FIG. 11B. FIG. 11D is an enlarged view of a portion 132a in FIG. 11B.

The transistor 100a is different from the transistor 100 in the shapes of the layer 129 and the semiconductor layer 109c. In the transistor 100a, portions of the layer 129 and the semiconductor layer 109c are removed in a region where the semiconductor layers 109a and 109b are not provided, and the insulating layer 108 is in contact with the insulating layer 114.

When the insulating layer 108 and the insulating layer 114 are in contact with each other by removing the portions of the layer 129 and the semiconductor layer 109c, oxygen (excess oxygen) contained in the insulating layer 114 can be supplied to the oxide semiconductor layer through the insulating layer 108.

[Modification Example 2]

Figure 12A:
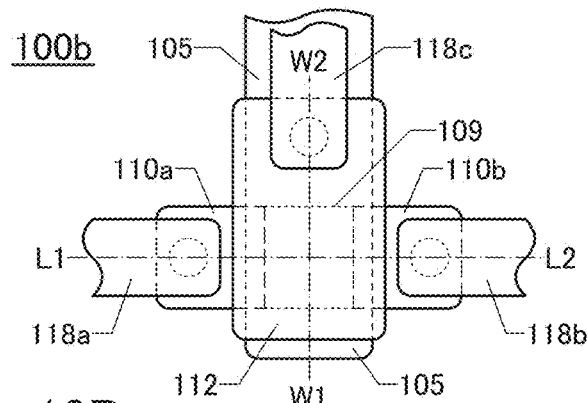
FIGS. 12A to 12D illustrate a transistor of one embodiment of the present invention.
Figure 12B:
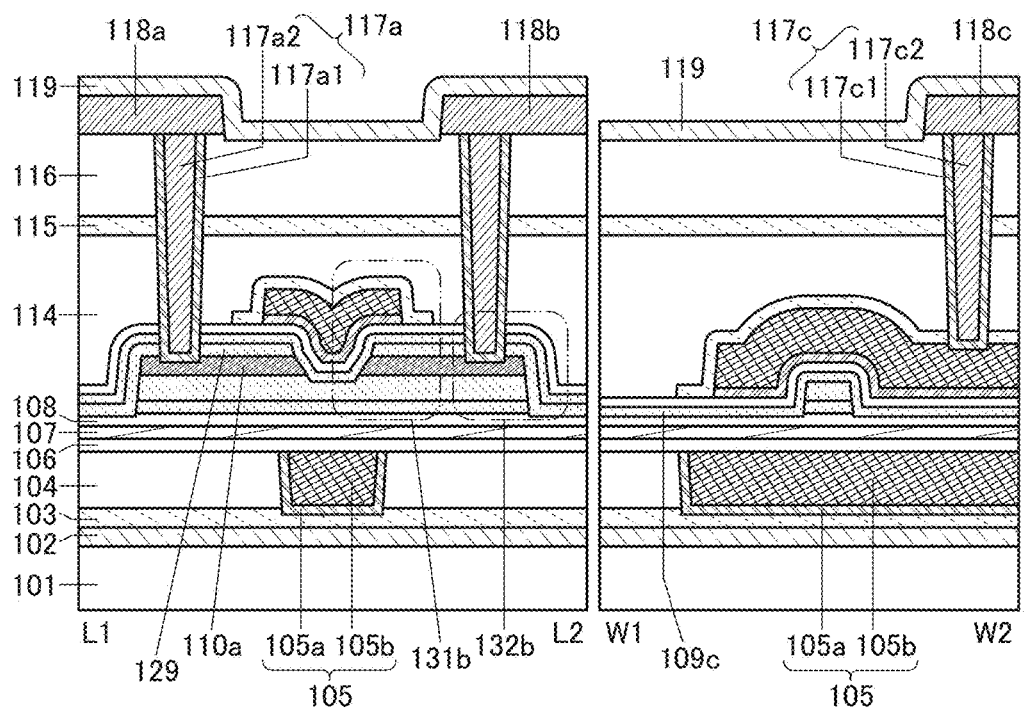
Figure 12C:
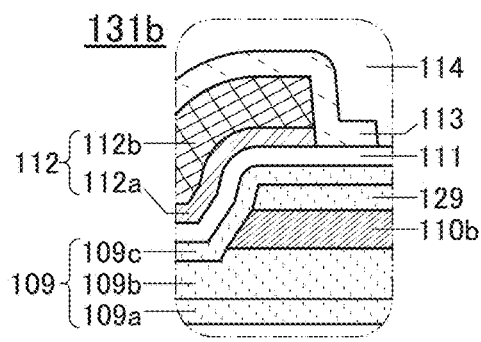
Figure 12D:
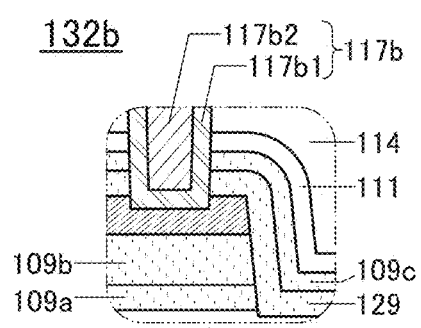

FIGS. 12A to 12D illustrate a transistor 100b. FIG. 12A illustrates a plan view of the transistor 100b. FIG. 12B illustrates a cross-sectional view taken along dashed-dotted line L1-L2 and a cross-sectional view taken along dashed-dotted line W1-W2 in FIG. 12A. FIG. 12C is an enlarged view of a portion 131b in FIG. 12B. FIG. 12D is an enlarged view of a portion 132b in FIG. 12B.

The transistor 100b is different from the transistor 100 in the shape of the insulating layer 111. While the portion of the insulating layer 111 is removed in the transistor 100, a portion of the insulating layer 111 is left without being removed in the transistor 100b. In accordance with the purpose, the portion of the insulating layer 111 is not necessarily removed.

[Modification Example 3]

Figure 13A:
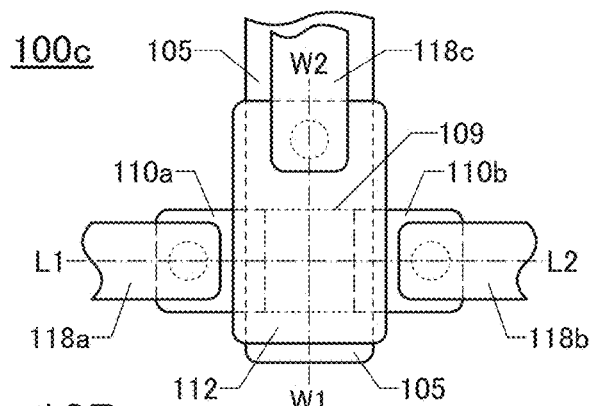
FIGS. 13A to 13D illustrate a transistor of one embodiment of the present invention.
Figure 13B:
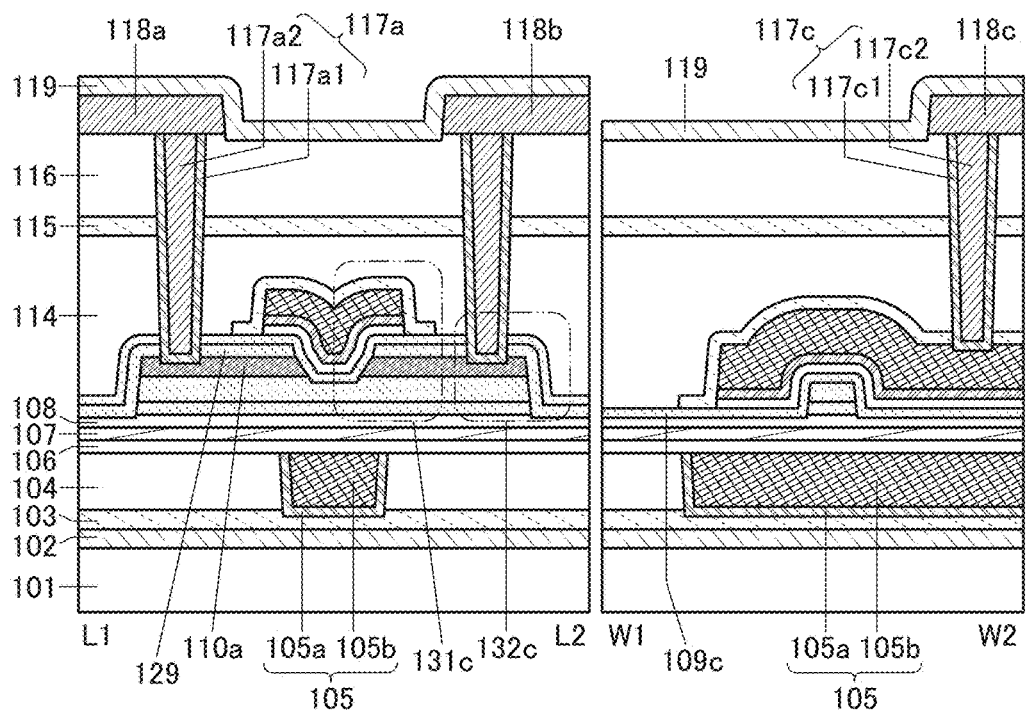
Figure 13C:
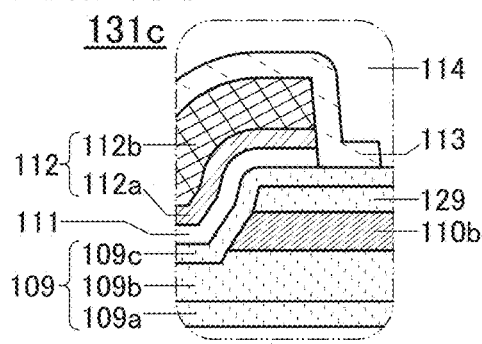
Figure 13D:
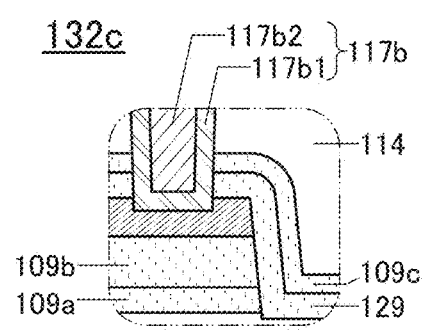

FIGS. 13A to 13D illustrate a transistor 100c. FIG. 13A illustrates a plan view of the transistor 100c. FIG. 13B illustrates a cross-sectional view taken along dashed-dotted line L1-L2 and a cross-sectional view taken along dashed-dotted line W1-W2 in FIG. 13A. FIG. 13C is an enlarged view of a portion 131c in FIG. 13B. FIG. 13D is an enlarged view of a portion 132c in FIG. 13B.

The transistor 100c is different from the transistor 100 in the shape of the insulating layer 111. In a manufacturing process of the transistor 100, a portion of the insulating layer 111 is removed with the use of the electrode 112 as a mask, so that the transistor 100c can be obtained.

[Modification Example 4]

Figure 14A:
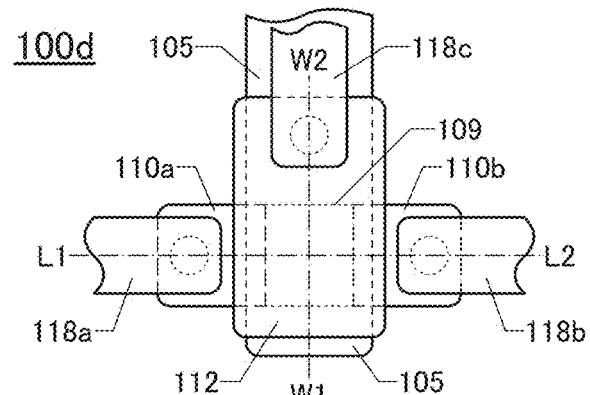
FIGS. 14A to 14D illustrate a transistor of one embodiment of the present invention.
Figure 14B:
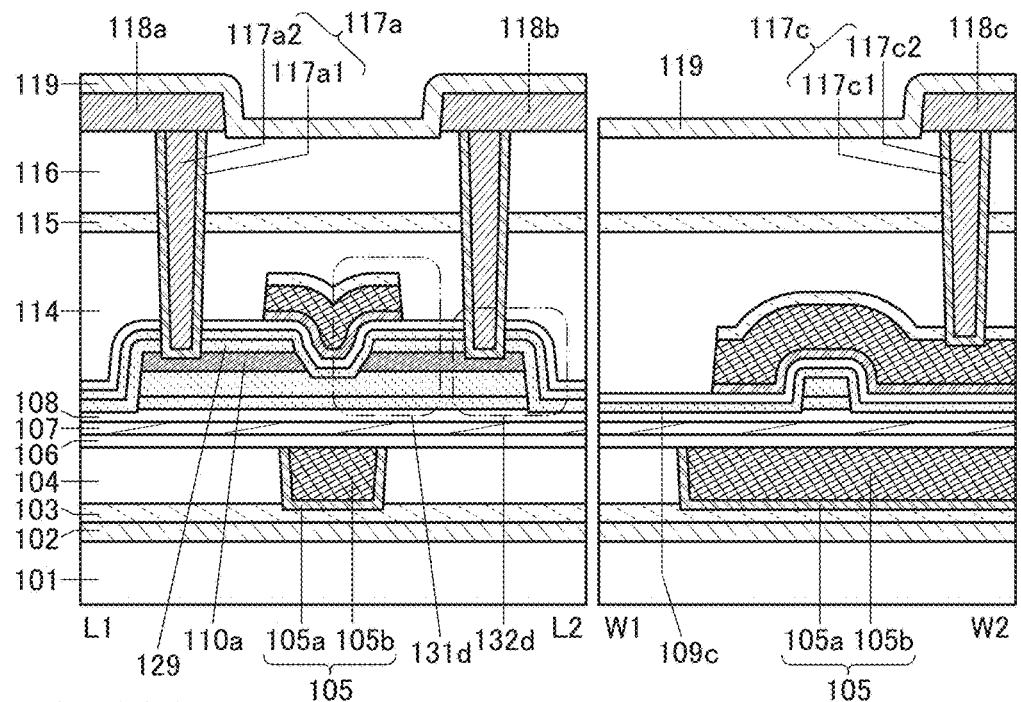
Figure 14C:
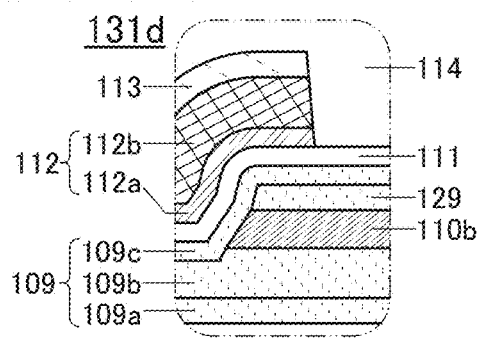
Figure 14D:
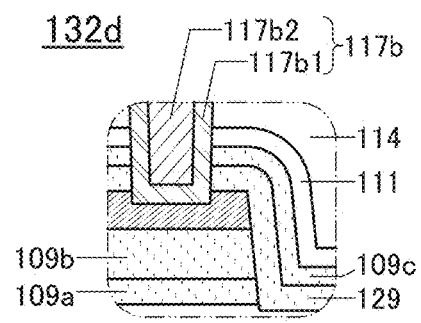

FIGS. 14A to 14D illustrate a transistor 100d. FIG. 14A illustrates a plan view of the transistor 100d. FIG. 14B illustrates a cross-sectional view taken along dashed-dotted line L1-L2 and a cross-sectional view taken along dashed-dotted line W1-W2 in FIG. 14A. FIG. 14C is an enlarged view of a portion 131d in FIG. 14B. FIG. 14D is an enlarged view of a portion 132d in FIG. 14B.

The transistor 100d is different from the transistor 100b in the shape of the insulating layer 113. In the transistor 100d, the insulating layer 113 is provided over the electrode 112, and a side surface of the electrode 112 is not covered with the insulating layer 113. In the transistor 100d, the insulating layer 113 is formed after Step 12, and then, Step 13 is performed. In Step 13, a portion of the insulating layer 113 is removed as well as portions of the conductive layers 191a and 191b. The productivity of the transistor can be increased because a step of removing a portion of the insulating layer 113 after the formation of the electrode 112 is omitted.

[Modification Example 5]

Figure 15A:
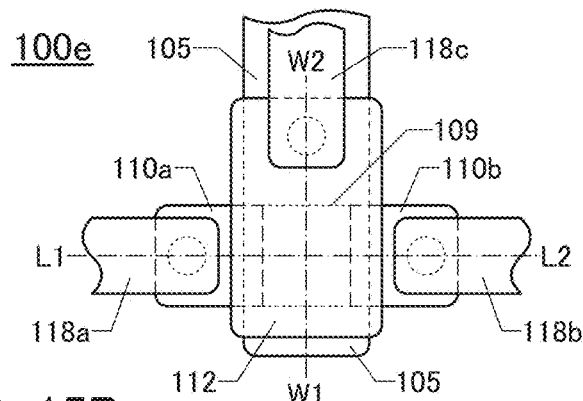
FIGS. 15A to 15D illustrate a transistor of one embodiment of the present invention.
Figure 15B:
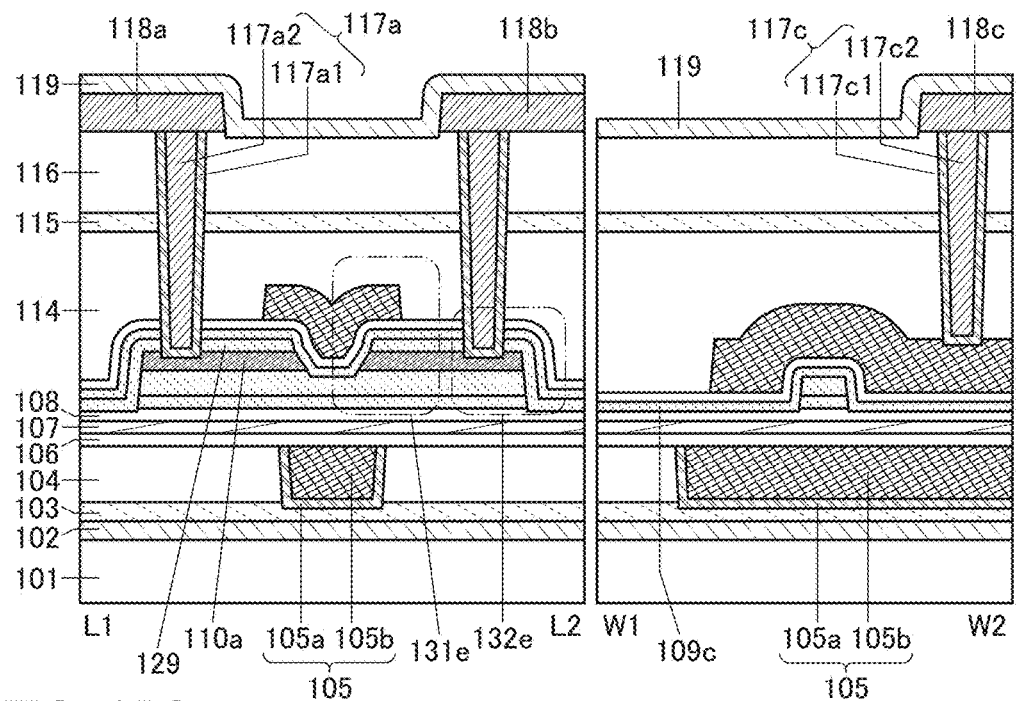
Figure 15C:
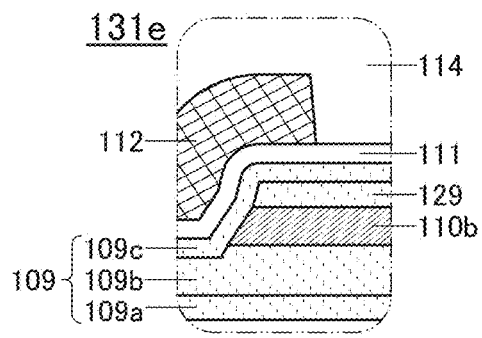
Figure 15D:
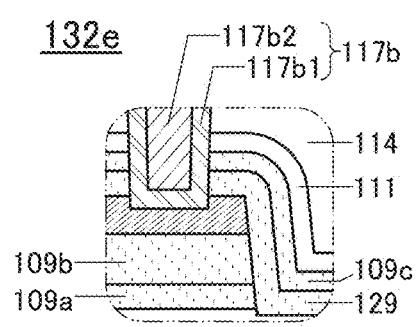

FIGS. 15A to 15D illustrate a transistor 100e. FIG. 15A illustrates a plan view of the transistor 100e. FIG. 15B illustrates a cross-sectional view taken along dashed-dotted line L1-L2 and a cross-sectional view taken along dashed-dotted line W1-W2 in FIG. 15A. FIG. 15C is an enlarged view of a portion 131e in FIG. 15B. FIG. 15D is an enlarged view of a portion 132e in FIG. 15B.

In the case where the electrode 112 is formed using a conductive material which is less likely to absorb oxygen, such as tantalum nitride, the insulating layer 113 can be omitted. When the insulating layer 113 is omitted, the number of steps for forming the transistor can be reduced; thus, the productivity of the transistor can be increased.

[Modification Example 6]

FIGS. 16A to 16D illustrate a transistor 100f. FIG. 16A illustrates a plan view of the transistor 100f. FIG. 16B illustrates a cross-sectional view taken along dashed-dotted line L1-L2 and a cross-sectional view taken along dashed-dotted line W1-W2 in FIG. 16A. FIG. 16C is an enlarged view of a portion 131f in FIG. 16B. FIG. 16D is an enlarged view of a portion 132f in FIG. 16B.

The transistor 100f is different from the transistor 100e in the shape of the insulating layer 111. In a manufacturing process of the transistor 100e, a portion of the insulating layer 111 is removed with the use of the electrode 112 as a mask, so that the transistor 100f can be obtained.

[Modification Example 7]

Figure 17A:
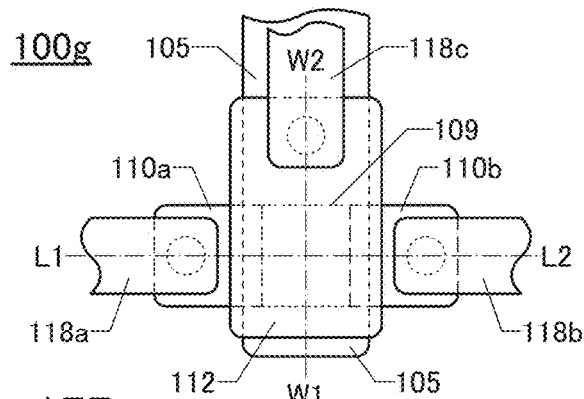
FIGS. 17A to 17D illustrate a transistor of one embodiment of the present invention.
Figure 17B:
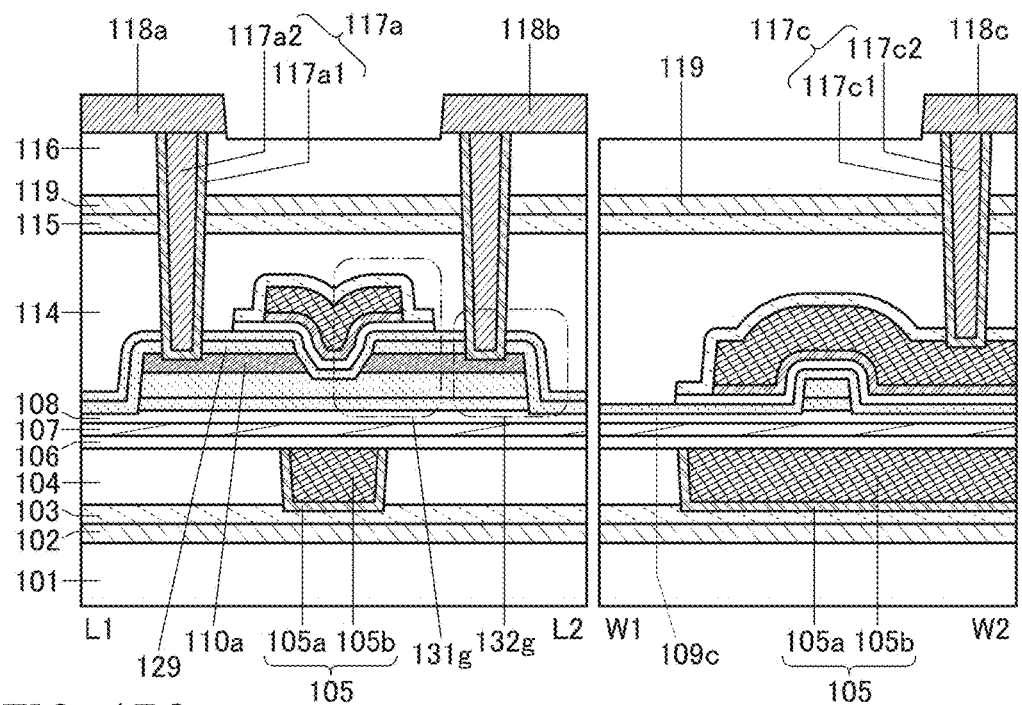
Figure 17C:
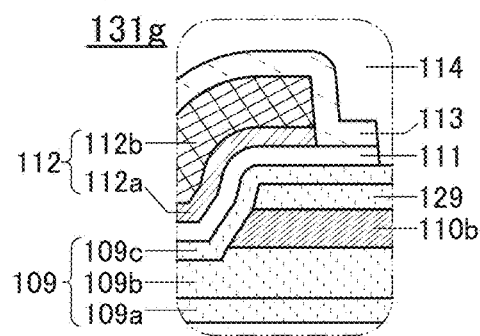
Figure 17D:
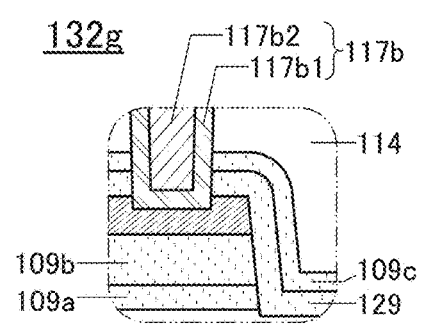

FIGS. 17A to 17D illustrate a transistor 100g. FIG. 17A illustrates a plan view of the transistor 100g. FIG. 17B illustrates a cross-sectional view taken along dashed-dotted line L1-L2 and a cross-sectional view taken along dashed-dotted line W1-W2 in FIG. 17A. FIG. 17C is an enlarged view of a portion 131g in FIG. 17B. FIG. 17D is an enlarged view of a portion 132g in FIG. 17B.

The transistor 100g is different from the transistor 100 in a stacked position of the insulating layer 119. As in the transistor 100g, the insulating layer 119 may be provided between the insulating layer 115 and the insulating layer 116.

[Modification Example 8]

Figure 18A:
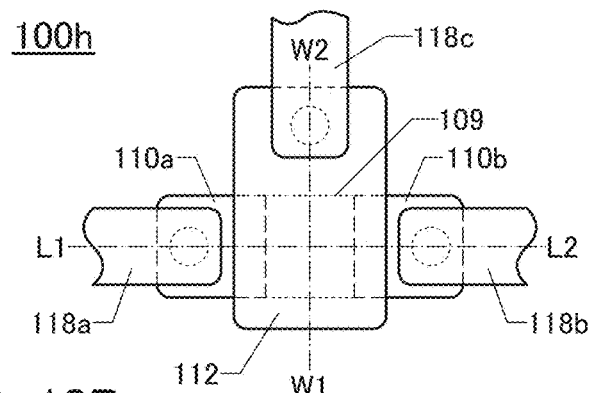
FIGS. 18A to 18D illustrate a transistor of one embodiment of the present invention.
Figure 18B:
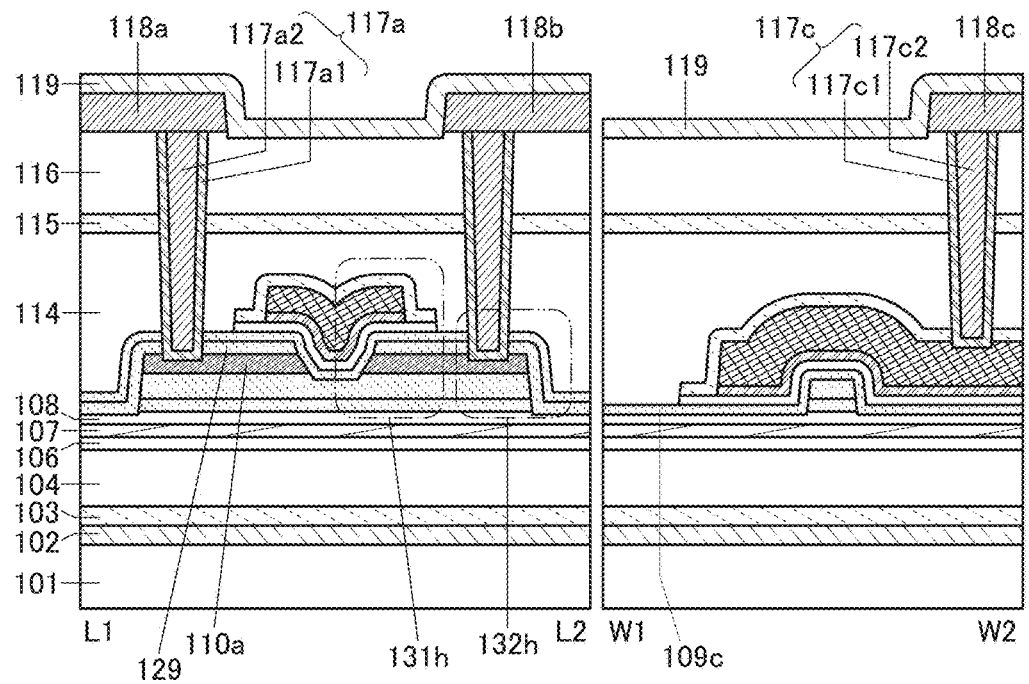
Figure 18C:
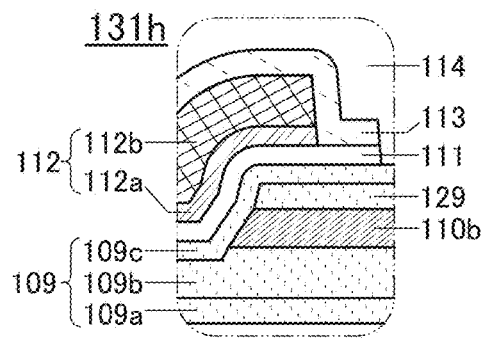
Figure 18D:
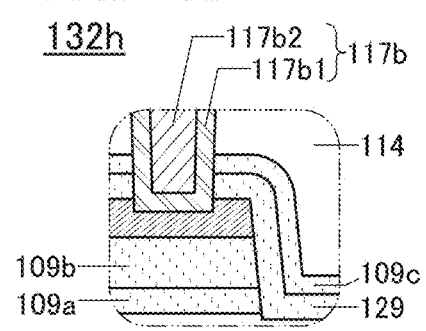

FIGS. 18A to 18D illustrate a transistor 100h. FIG. 18A illustrates a plan view of the transistor 100h. FIG. 18B illustrates a cross-sectional view taken along dashed-dotted line L1-L2 and a cross-sectional view taken along dashed-dotted line W1-W2 in FIG. 18A. FIG. 18C is an enlarged view of a portion 131h in FIG. 18B. FIG. 18D is an enlarged view of a portion 132h in FIG. 18B.

The transistor 100h has a structure in which the electrode 105 is removed from the transistor 100. In accordance with the purpose or the usage, the electrode 105 is not necessarily provided as in the transistor 100h. When the electrode 105 is omitted, the number of steps for forming the transistor can be reduced; thus, the productivity of the transistor can be increased.

[Modification Example 9]

Figure 19A:
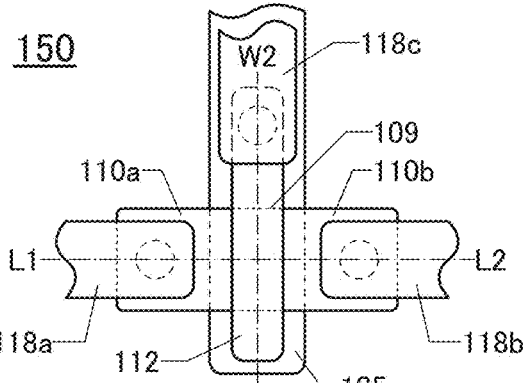
FIGS. 19A to 19D illustrate a transistor of one embodiment of the present invention.
Figure 19B:
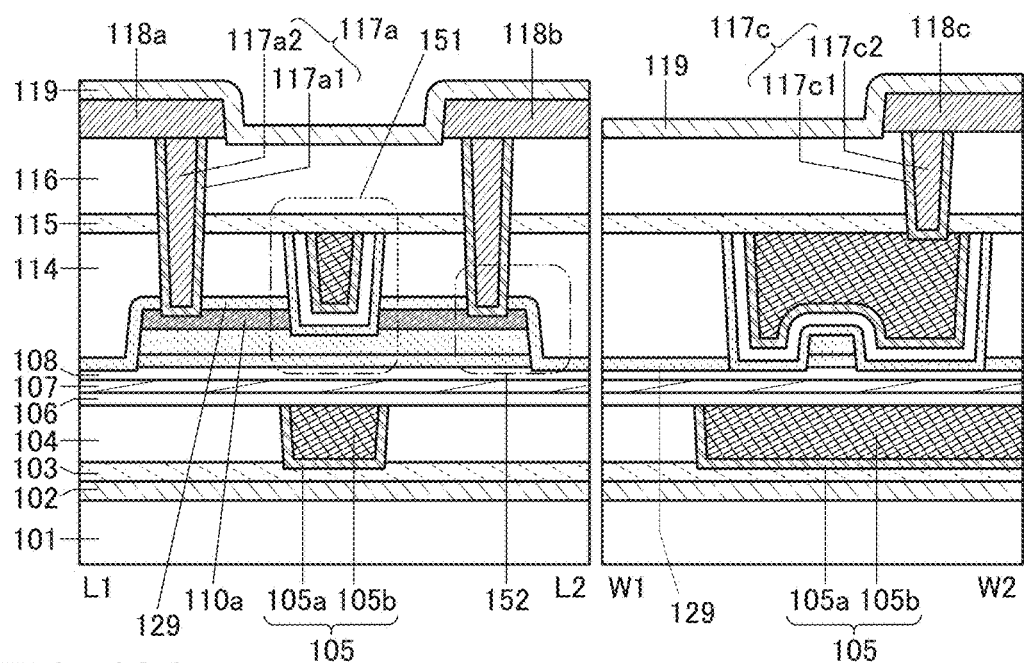
Figure 19C:
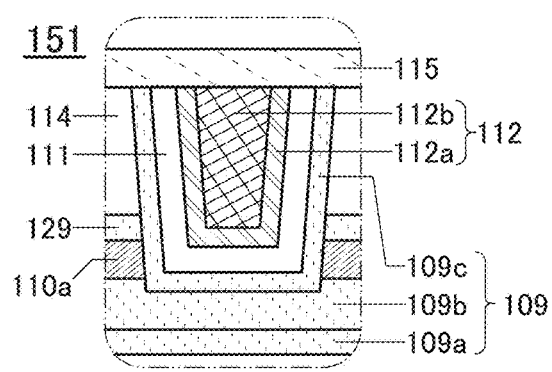
Figure 19D:
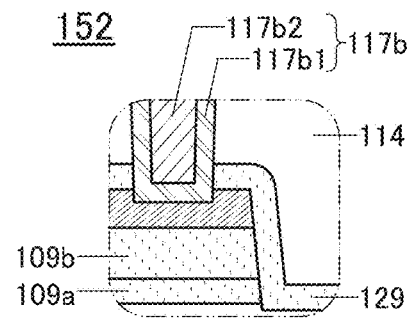

FIGS. 19A to 19D illustrate a transistor 150. FIG. 19A illustrates a plan view of the transistor 150. FIG. 19B illustrates a cross-sectional view taken along dashed-dotted line L1-L2 and a cross-sectional view taken along dashed-dotted line W1-W2 in FIG. 19A. FIG. 19C is an enlarged view of a portion 151 in FIG. 19B. FIG. 19D is an enlarged view of a portion 152 in FIG. 19B.

The transistors 150 and 100 have similar structures. Note that the transistor 150 is different from the transistor 100 in that the electrode 112, the insulating layer 111, and the semiconductor layer 109c are embedded in the insulating layer 114. In addition, the transistor 150 is different from the transistor 100 in that the regions 189a and 189b are not covered with the semiconductor layer 109c.

In the transistor 150, the electrodes 110a and 110b and the electrode 112 do not overlap with each other or have an extremely small overlapping area. Thus, in the transistor 150, parasitic capacitance between a gate and a source and between a gate and a drain can be further reduced compared with the transistor 100. Consequently, a transistor which performs high speed operation and has lower power consumption can be provided.

Next, a manufacturing process of the transistor 150 will be described. In order to avoid repeated description, steps different from those for forming the transistor 100 are described.

Figure 20A:
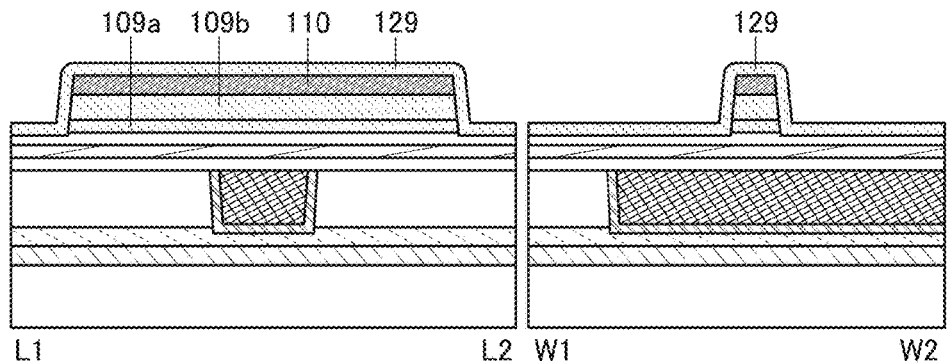
FIGS. 20A to 20C illustrate an example of a method for manufacturing a transistor of one embodiment of the present invention.
Figure 20B:
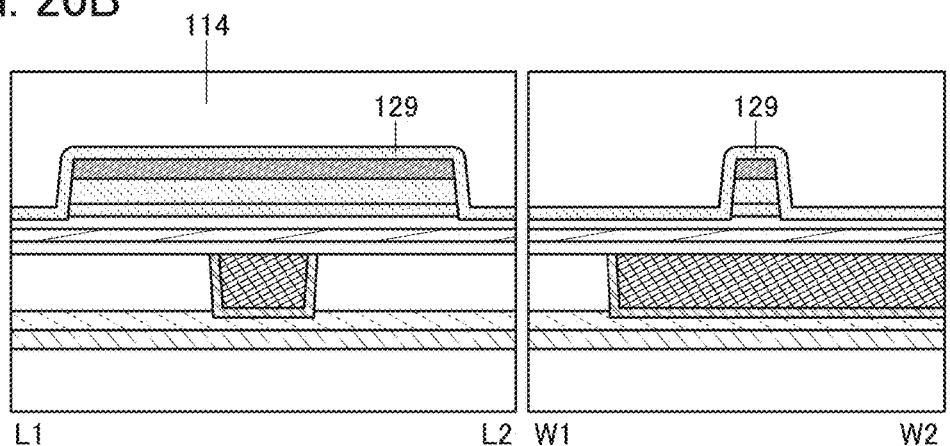

First, steps up to Step 9 are performed in a manner similar to that of the transistor 100 (see FIG. 20A). Next, the insulating layer 114 is formed over the sample surface (see FIG. 20B). After the formation of the insulating layer 114, unevenness of the sample surface is preferably reduced by performing CMP treatment on the sample surface. The insulating layer 114 may be subjected to oxygen doping treatment.

Figure 20C:
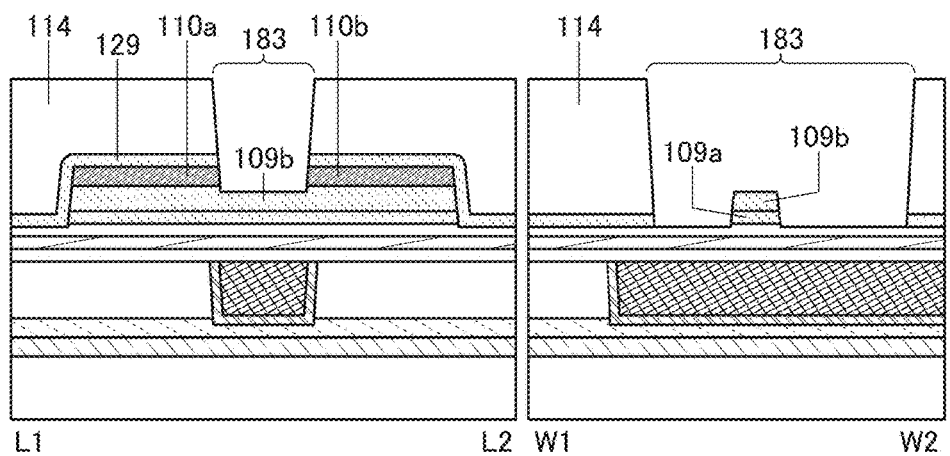

Next, a resist mask is formed over the sample surface (not illustrated) and portions of the insulating layer 114, the layer 129, and the electrode 110 are selectively removed with the use of the resist mask as a mask, so that an opening 183 is formed. The electrode 110a and the electrode 110b are also formed at the same time as the opening 183 (see FIG. 20C). At this time, an exposed portion of the semiconductor layer 109b is removed in some cases.

Figure 21A:
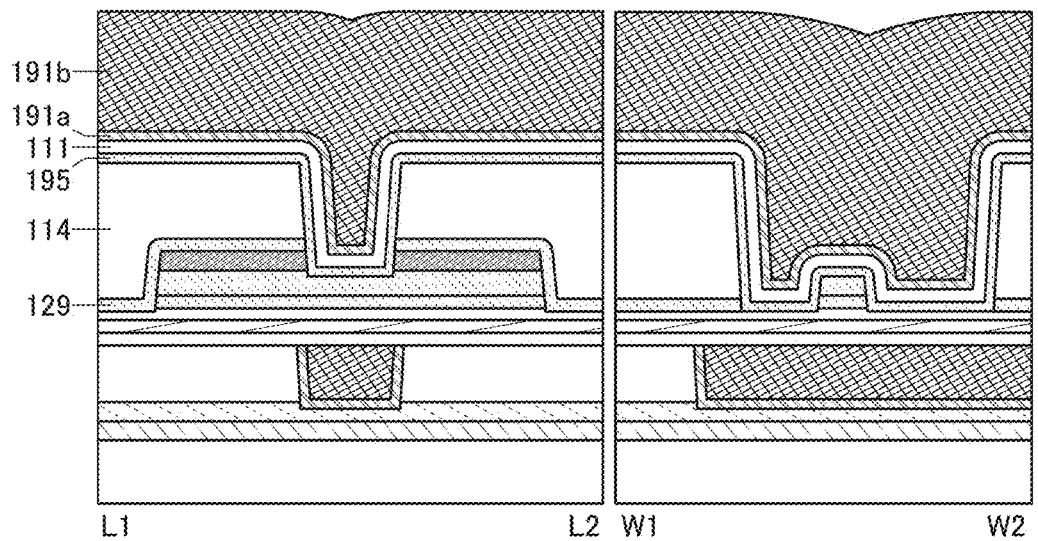
FIGS. 21A to 21C illustrate an example of a method for manufacturing a transistor of one embodiment of the present invention.

Next, an oxide semiconductor layer 195, the insulating layer 111, the conductive layer 191a, and the conductive layer 191b are sequentially formed over the sample surface (see FIG. 21A). The oxide semiconductor layer 195 is to function as the semiconductor layer 109c later. The oxide semiconductor layer 195 is formed using a material and a method similar to those of the semiconductor layer 109c described above.

Figure 21B:
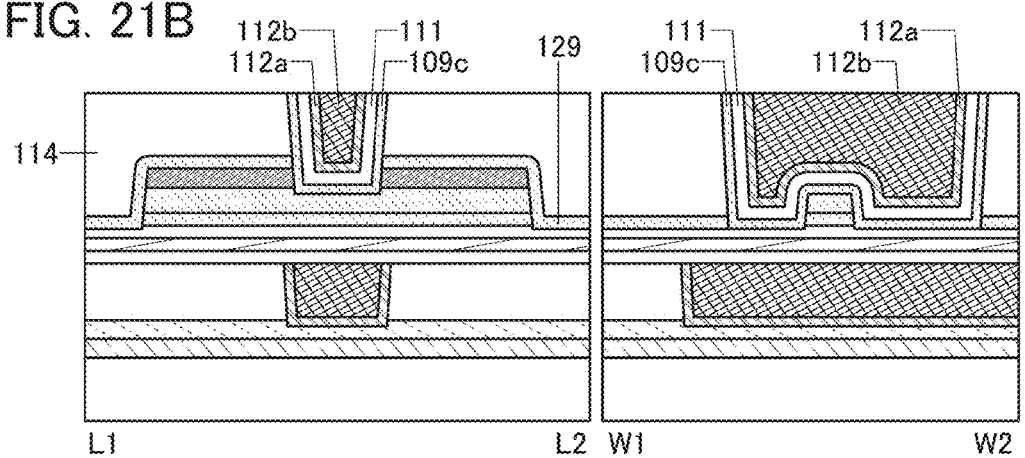

Next, the sample surface is subjected to CMP treatment (see FIG. 21B). By CMP treatment, portions of the oxide semiconductor layer 195, the insulating layer 111, the conductive layer 191a, and the conductive layer 191b are removed to form the semiconductor layer 109c, the electrode 112a, and the electrode 112b. At this time, a portion of a surface of the insulating layer 114 is also removed in some cases.

Figure 21C:
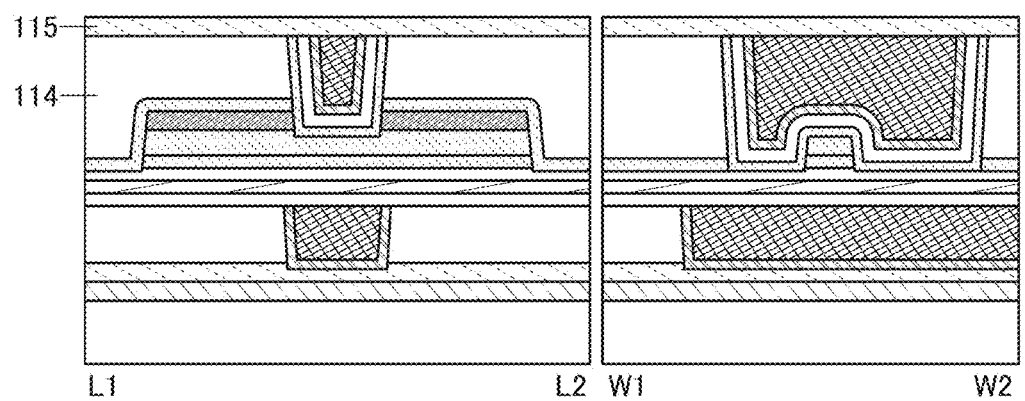

Next, the insulating layer 115 is formed over the sample surface (see FIG. 21C). After this, the transistor 150 can be formed through steps similar to those after Step 16.

[Modification Example 10]

Figure 22A:
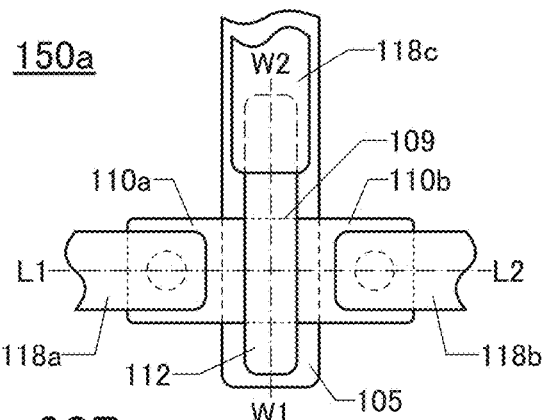
FIGS. 22A to 22C illustrate a transistor of one embodiment of the present invention.
Figure 22B:
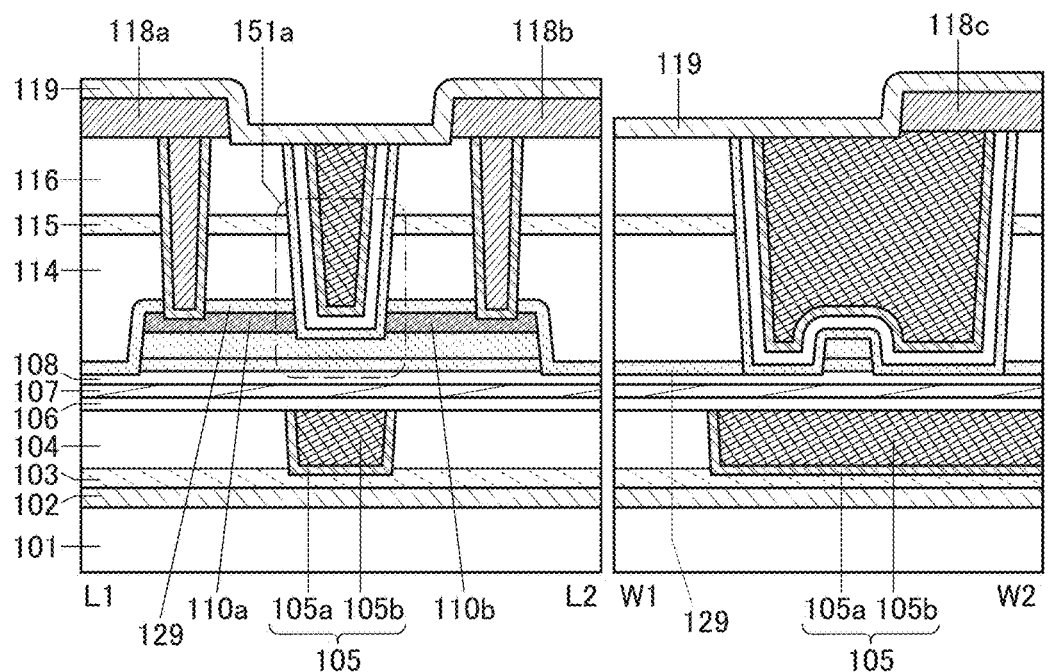
Figure 22C:
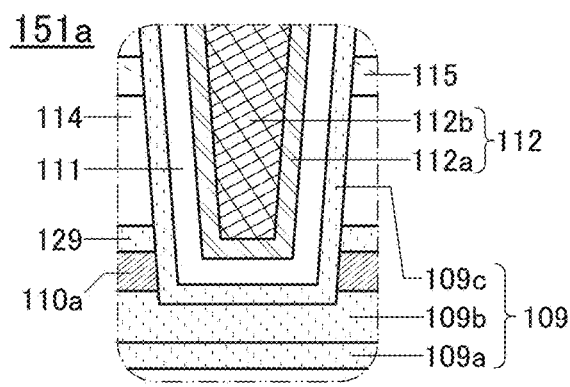

FIGS. 22A to 22C illustrate a transistor 150a. FIG. 22A illustrates a plan view of the transistor 150a. FIG. 22B illustrates a cross-sectional view taken along dashed-dotted line L1-L2 and a cross-sectional view taken along dashed-dotted line W1-W2 in FIG. 22A. FIG. 22C is an enlarged view of a portion 151a in FIG. 22B.

Although the transistor 150a can be formed in a manner similar to that of the transistor 150, the transistor 150a is different from the transistor 150 in that the opening 183 is formed after the insulating layer 116 is formed. The openings 192a and 192b and the opening 183 are formed in different steps. The opening 192c is not necessarily formed. After the opening 183, the opening 192a, and the opening 192b are formed, the transistor 150a can be formed by a method similar to that after Step 19 described above.

This embodiment can be implemented in appropriate combination with any of the structures described in the other embodiments and the like.

[Embodiment 2]

In this embodiment, examples of a semiconductor device including any of the transistors disclosed in this specification and the like will be described.

<<Structural Example of Semiconductor Device>>

Figure 23A:
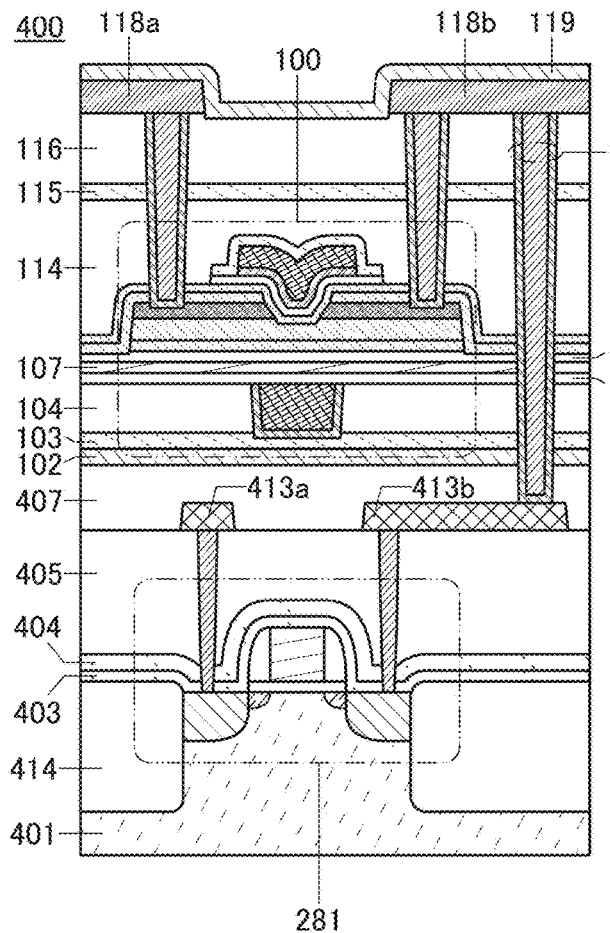
FIGS. 23A to 23C illustrate a semiconductor device of one embodiment of the present invention.
Figure 23B:
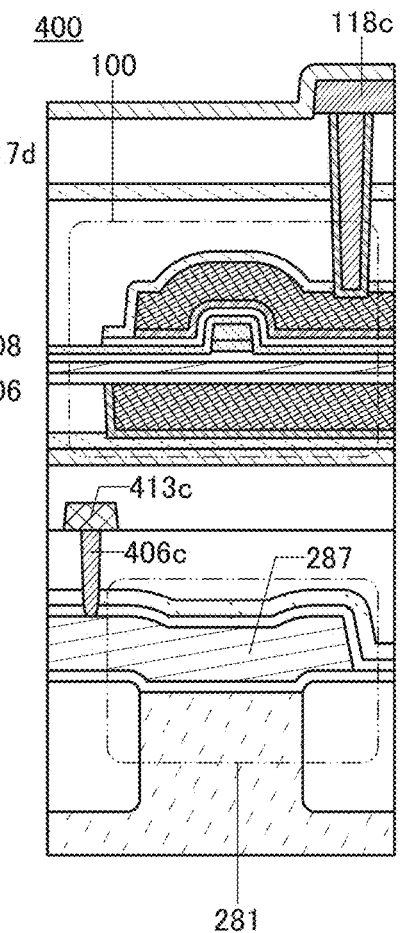
Figure 23C:
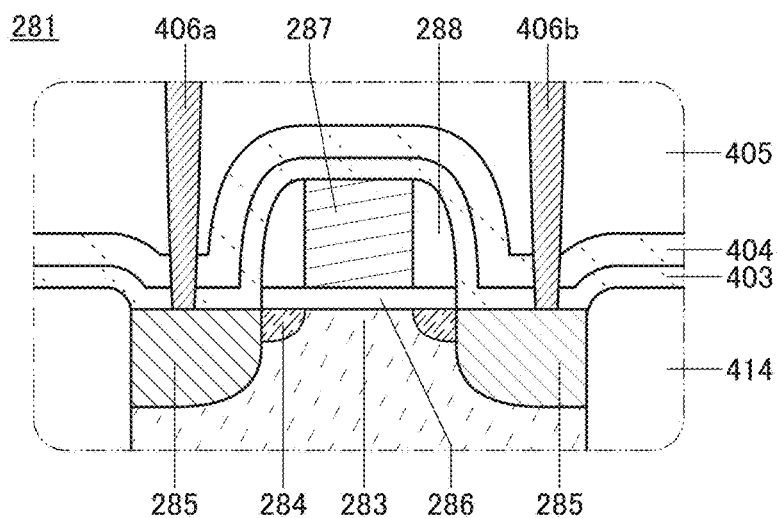

FIGS. 23A to 23C are cross-sectional views of a semiconductor device 400. The semiconductor device 400 includes the transistor 100 and a transistor 281. Note that the transistor 100 described in this embodiment can be replaced with any of the other transistors described in the above embodiment. FIG. 23A is a cross-sectional view of the transistor 100 and the transistor 281 in the channel length direction, and FIG. 23B is a cross-sectional view thereof in the channel width direction. FIG. 23C is an enlarged view of the transistor 281 in FIG. 23A.

In the semiconductor device 400, an n-type semiconductor is used for a substrate 401. The transistor 281 includes a channel formation region 283, high-concentration p-type impurity regions 285, an insulating layer 286, an electrode 287, and a sidewall 288. In regions overlapping with the sidewall 288 with the insulating layer 286 located therebetween, low-concentration p-type impurity regions 284 are provided. The insulating layer 286 can function as a gate insulating layer. The electrode 287 can function as a gate electrode. The channel formation region 283 of the transistor 281 is formed in part of the substrate 401.

The low-concentration p-type impurity regions 284 can be formed in such a manner that an impurity element is added with the use of the electrode 287 as a mask after the formation of the electrode 287 and before the formation of the sidewall 288. In other words, the low-concentration p-type impurity regions 284 can be formed in a self-aligned manner. After the sidewall 288 is formed, the high-concentration p-type impurity regions 285 are formed. Note that the low-concentration p-type impurity regions 284 have the same conductivity type as the high-concentration p-type impurity regions 285, and have a lower concentration of the impurity imparting the conductivity type than the high-concentration p-type impurity regions 285. The low-concentration p-type impurity regions 284 are not necessarily provided depending on circumstances.

The transistor 281 is electrically isolated from other transistors by an element isolation layer 414. The element isolation layer can be formed by a local oxidation of silicon (LOCOS) method, a shallow trench isolation (STI) method, or the like.

The transistor 281 can function as a p-channel transistor. An insulating layer 403 is formed over the transistor 281, and an insulating layer 404 is formed over the insulating layer 403. The insulating layer 403 and the insulating layer 404 can be formed using a material and a method which are similar to those of the insulating layer described in the above embodiment. Note that the insulating layer 403 and the insulating layer 404 are preferably formed using an insulating material that has a function of preventing diffusion of impurities such as oxygen, hydrogen, water, alkali metal, and alkaline earth metal. Note that one of the insulating layers 403 and 404 may be omitted or another insulating layer may be stacked thereover.

The semiconductor device 400 includes an insulating layer 405 having a flat surface over the insulating layer 404. The insulating layer 405 can be formed using a material and a method which are similar to those of the insulating layer described in the above embodiment. A surface of the insulating layer 405 may be subjected to CMP treatment.

An electrode 413a, an electrode 413b, and an electrode 413c are formed over the insulating layer 405. The electrode 413a, the electrode 413b, and the electrode 413c can be formed using a material and a method which are similar to those of the electrode described in the above embodiment.

The electrode 413a is electrically connected to one of the high-concentration p-type impurity regions 285 through a contact plug 406a. The electrode 413b is electrically connected to the other of the high-concentration p-type impurity regions 285 through a contact plug 406b. The electrode 413c is electrically connected to the electrode 287 through a contact plug 406c.

An insulating layer 407 is formed so as to cover the electrode 413a, the electrode 413b, and the electrode 413c. The insulating layer 407 can be formed using a material and a method which are similar to those of the insulating layer 405. A surface of the insulating layer 407 may be subjected to CMP treatment.

The insulating layer 102 is formed over the insulating layer 407. Components over the insulating layer 407 can be understood with reference to the above embodiment. Thus, detailed description thereof is omitted in this embodiment. The electrode 118b is electrically connected to the electrode 413b through an electrode 117d.

[Modification Example 1]

Figure 24A:
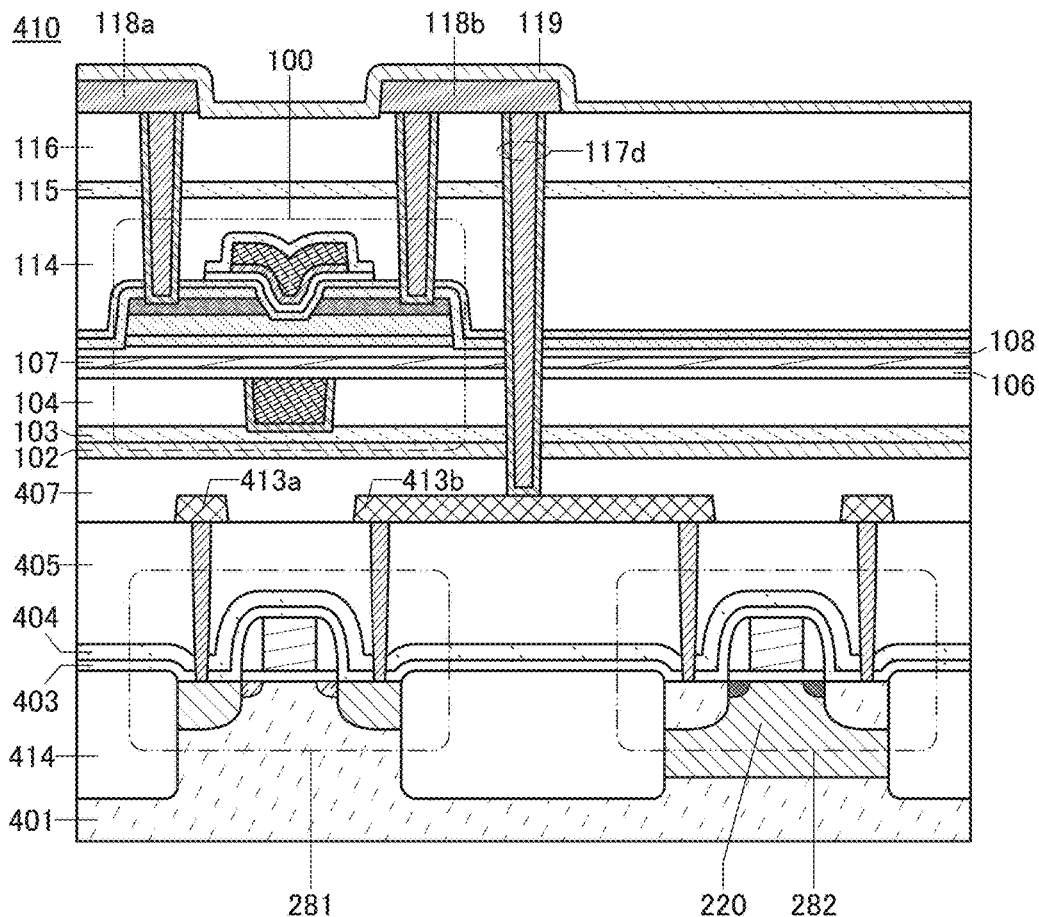
FIGS. 24A and 24B illustrate a semiconductor device of one embodiment of the present invention.
Figure 24B:
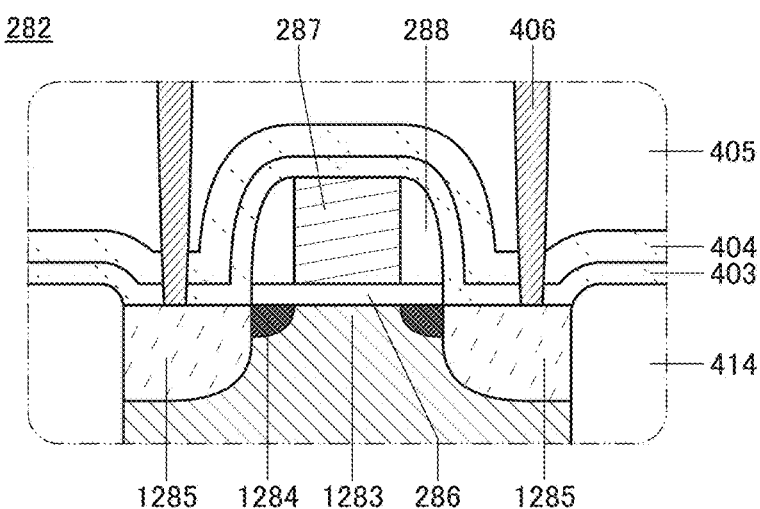

A transistor 282 which is an n-channel transistor may be provided on the substrate 401. FIGS. 24A and 24B are cross-sectional views of a semiconductor device 410. The semiconductor device 410 includes the transistor 282 in addition to the components of the semiconductor device 400. FIG. 24A is a cross-sectional view of the transistor 100, the transistor 281, and the transistor 282 in the channel length direction, and FIG. 24B is an enlarged view of the transistor 282.

In the transistor 282, a channel formation region 1283 is formed in a well 220. The transistor 282 includes the channel formation region 1283, high-concentration n-type impurity regions 1285, the insulating layer 286, the electrode 287, and the sidewall 288. In regions overlapping with the sidewall 288 with the insulating layer 286 located therebetween, low-concentration n-type impurity regions 1284 are provided.

The low-concentration n-type impurity regions 1284 can be formed in such a manner that an impurity element is added with the use of the electrode 287 as a mask after the formation of the electrode 287 and before the formation of the sidewall 288. In other words, the low-concentration n-type impurity regions 1284 can be formed in a self-aligned manner. After the sidewall 288 is formed, the high-concentration n-type impurity regions 1285 are formed. Note that the low-concentration n-type impurity regions 1284 have the same conductivity type as the high-concentration n-type impurity regions 1285, and have a lower concentration of the impurity imparting the conductivity type than the high-concentration n-type impurity regions 1285. The low-concentration n-type impurity regions 1284 are not necessarily provided depending on circumstances.

[Modification Example 2]

Figure 25A:
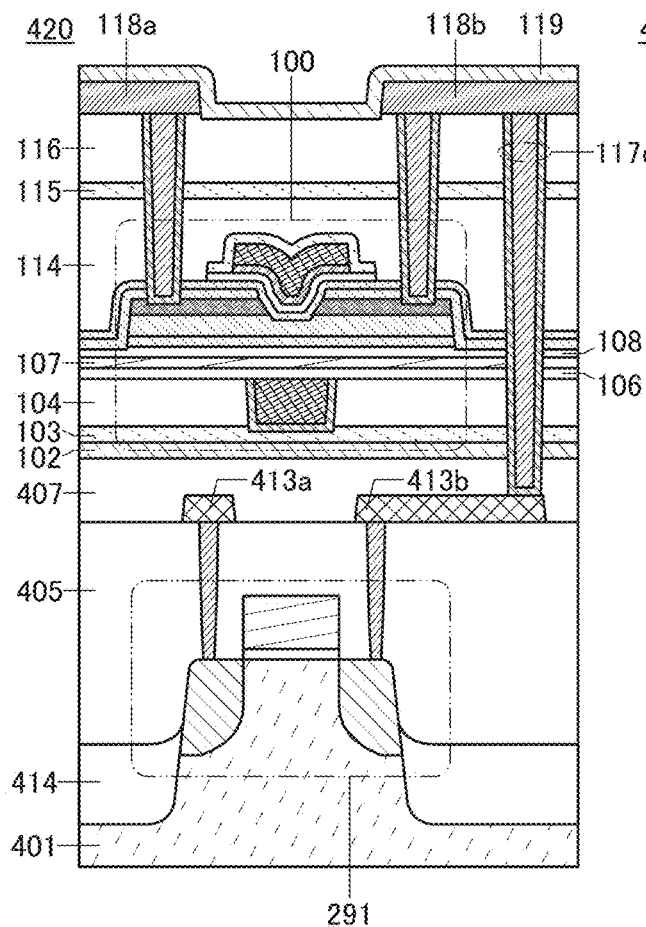
FIGS. 25A to 25C illustrate a semiconductor device of one embodiment of the present invention.
Figure 25B:
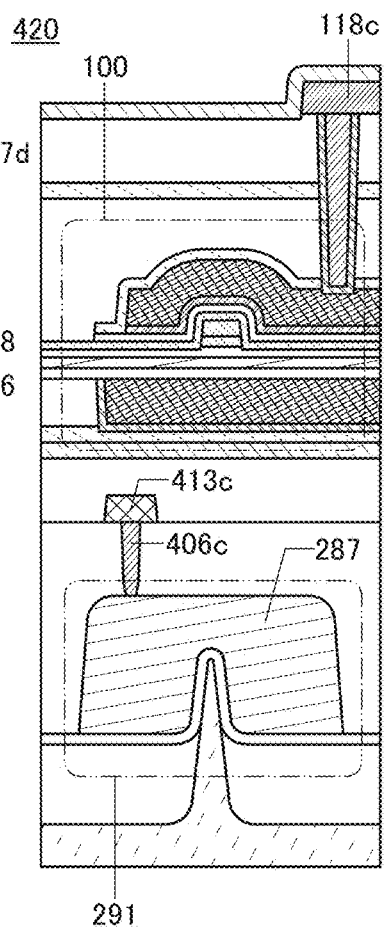
Figure 25C:
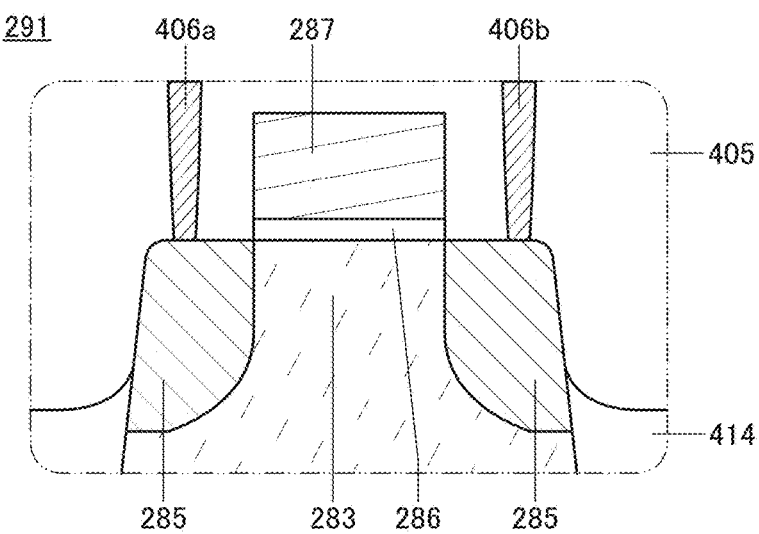

FIGS. 25A to 25C are cross-sectional views of a semiconductor device 420. The semiconductor device 420 has a structure obtained by replacing the transistor 281 of the semiconductor device 400 with a FIN-type transistor 291. The effective channel width is increased in the FIN-type transistor, whereby the on-state characteristics of the transistor can be improved. In addition, since contribution of the electric field of the gate electrode to the channel formation region can be increased, the off-state characteristics of the transistor can be improved.

[Modification Example 3]

Figure 26:
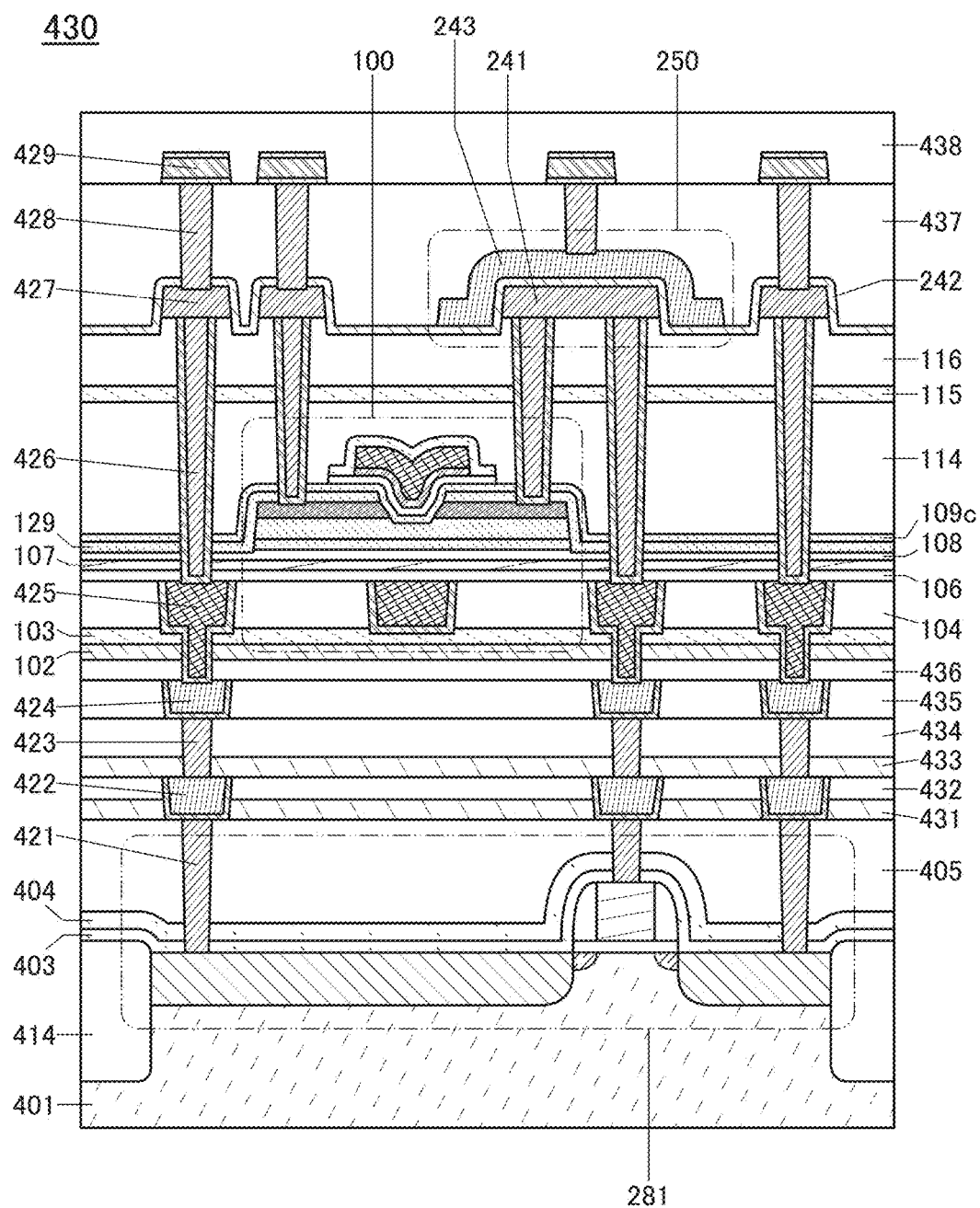
FIG. 26 illustrates a semiconductor device of one embodiment of the present invention.

FIG. 26 is a cross-sectional view of a semiconductor device 430. The semiconductor device 430 includes the transistor 100, the transistor 281, and a capacitor 250. In the semiconductor device 430, an insulating layer 431, an insulating layer 432, an insulating layer 433, an insulating layer 434, an insulating layer 435, and an insulating layer 436 are provided over the insulating layer 405 covering the transistor 281. Furthermore, an electrode 422 and an electrode 424 are provided over the insulating layer 405.

The electrode 422 is provided to be embedded in the insulating layers 431 and 432 and is electrically connected to the transistor 281 through an electrode 421 provided in the insulating layers 403 to 405.

The electrode 424 is provided to be embedded in the insulating layer 435 and is electrically connected to the electrode 422 through an electrode 423 provided in the insulating layers 433 and 434.

In the semiconductor device 430, the transistor 100 is provided over the insulating layer 436 with the insulating layers 102 and 103 located therebetween. The insulating layers 115 and 116 are provided over the transistor 100, and an electrode 427 and an electrode 241 are provided over the insulating layer 116. An insulating layer 242 covering the electrodes 427 and 241 is provided. Furthermore, an electrode 243 covering the electrode 241 is provided over the insulating layer 242.

A region where the electrode 241, the insulating layer 242, and the electrode 243 overlap with each other functions as the capacitor 250. By providing the electrode 243 to cover the electrode 241, not only a top surface but also side surfaces of the electrode 241 can function as the capacitor.

The electrode 427 is electrically connected to an electrode 425 through an electrode 426 provided in the insulating layer 116, the insulating layer 115, the insulating layer 114, the semiconductor layer 109c, the insulating layer 108, the insulating layer 107, and the insulating layer 106.

An insulating layer 437 is provided over the electrode 243 and the insulating layer 242, an electrode 429 is provided over the insulating layer 437, and an insulating layer 438 is provided over the electrode 429. The electrode 429 is electrically connected to the electrode 427 through an electrode 428 provided in the insulating layer 437.

The insulating layers 431 to 438 and 242 can be formed using a material and a method similar to those of the insulating layers described in the above embodiment. Furthermore, the electrodes 421 to 429, 241, and 243 can be formed using a material and a method similar to those of the electrodes described in the above embodiment.

The electrodes 421 to 429 may be formed by a damascene method, a dual damascene method, or the like.

<Example of Semiconductor Circuit>

The transistors disclosed in this specification and the like can be used in a variety of semiconductor circuits, e.g., logic circuits such as an OR circuit, an AND circuit, a NAND circuit, and a NOR circuit, an inverter circuit, a buffer circuit, a shift register circuit, a flip-flop circuit, an encoder circuit, a decoder circuit, an amplifier circuit, an analog switch circuit, an integrator circuit, a differentiation circuit, a memory element, and the like.

Figure 34A:
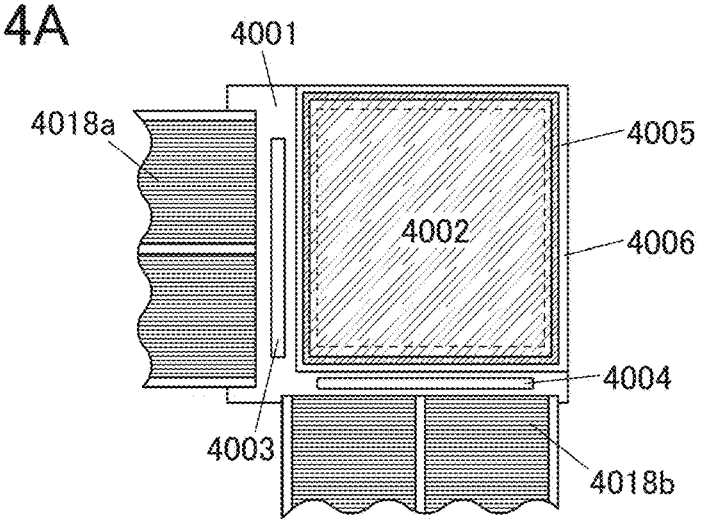
FIGS. 34A to 34C illustrate examples of a display device.
Figure 34B:
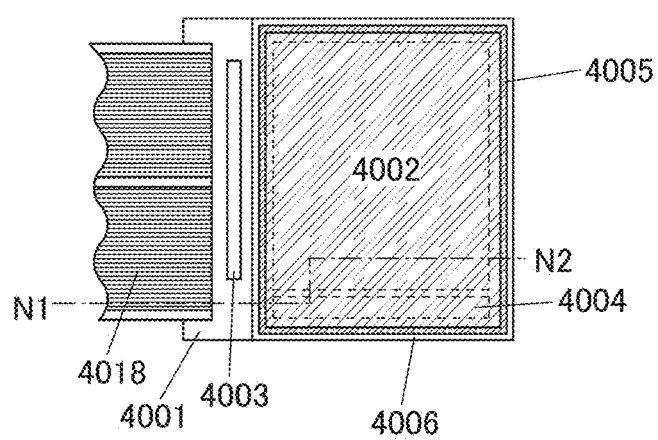
Figure 34C:
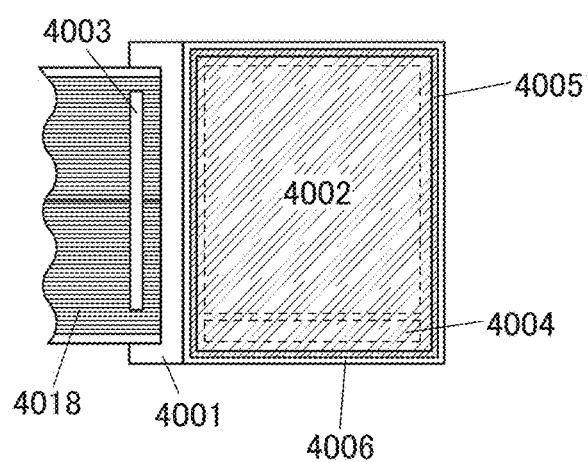

Examples of a semiconductor circuit including the transistor disclosed in this specification and the like are illustrated in circuit diagrams in FIGS. 34A to 34C. In the circuit diagrams, "OS" is given beside the circuit symbol of a transistor including an oxide semiconductor in order to clearly demonstrate that the transistor includes an oxide semiconductor.

Figure 27A:
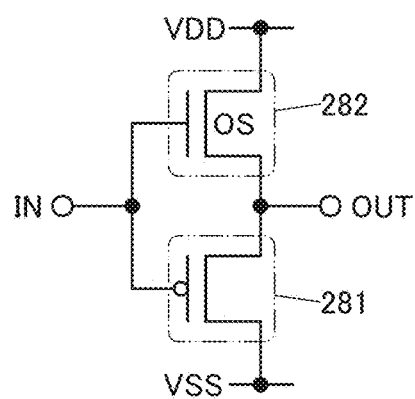
FIGS. 27A to 27C are each a circuit diagram of a semiconductor device of one embodiment of the present invention.

The semiconductor circuit illustrated in FIG. 27A has a configuration of an inverter circuit in which the p-channel transistor 281 and the n-channel transistor 282 are connected to each other in series and in which gates of the transistors are connected to each other.

Figure 27B:
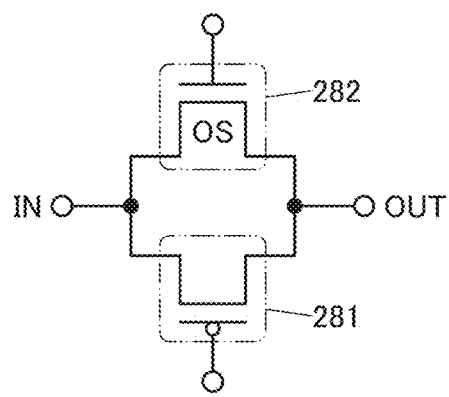

The semiconductor circuit illustrated in FIG. 27B has a configuration of an analog switch circuit in which the p-channel transistor 281 and the n-channel transistor 282 are connected to each other in parallel.

Figure 27C:
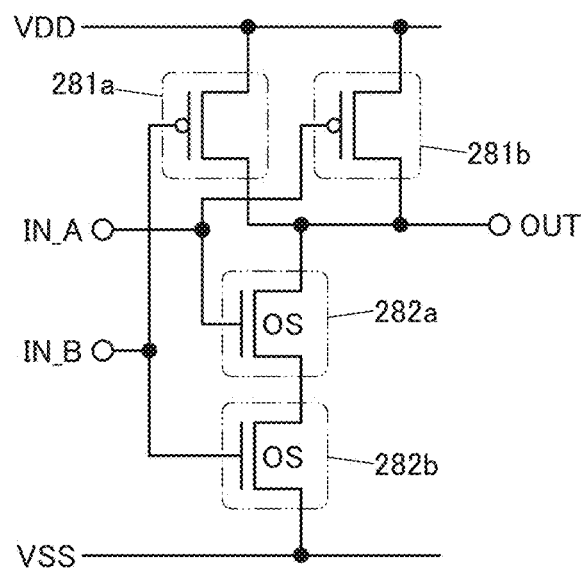

The semiconductor circuit illustrated in FIG. 27C has a configuration of a NAND circuit including a transistor 281a, a transistor 281b, a transistor 282a, and a transistor 282b. A potential output from the NAND circuit changes depending on the combination of potentials input to an input terminal IN_A and an input terminal IN_B.

<Examples of Memory Device>

Figure 28A:
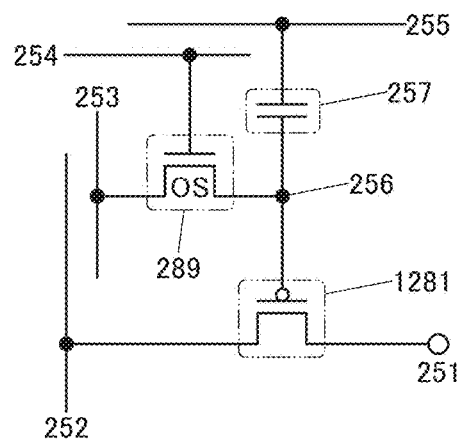
FIGS. 28A and 28B are each a circuit diagram of a semiconductor device of one embodiment of the present invention.

The semiconductor circuit illustrated in FIG. 28A has a configuration of a memory device in which one of a source and a drain of a transistor 289 is connected to a gate of a transistor 1281 and one electrode of a capacitor 257. The circuit illustrated in FIG. 28B has a configuration of a memory device in which one of the source and the drain of the transistor 289 is connected to one electrode of the capacitor 257.

Figure 28B:
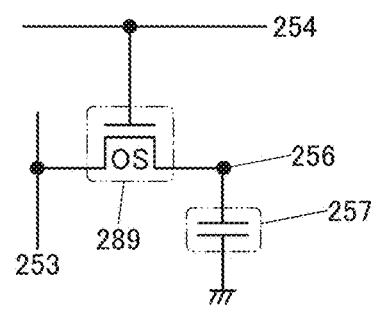

In each of the semiconductor circuits illustrated in FIGS. 28A and 28B, charges injected from the other of the source and the drain of the transistor 289 can be stored at a node 256. The transistor 289 is a transistor including an oxide semiconductor, which enables charges to be stored at the node 256 for a long period.

Although the transistor 1281 is a p-channel transistor in FIG. 28A, the transistor 1281 may be an n-channel transistor. For example, the transistor 281 or the transistor 282 may be used as the transistor 1281. An OS transistor may also be used as the transistor 1281.

The semiconductor devices (memory devices) illustrated in FIGS. 28A and 28B are described in detail here.

The semiconductor device illustrated in FIG. 28A includes the transistor 1281 using a first semiconductor, the transistor 289 using a second semiconductor, and the capacitor 257.

The transistor 289 is one of the OS transistors which are disclosed in the above embodiment. Since the off-state current of the transistor 289 is low, stored data can be retained for a long period at a predetermined node of the semiconductor device. In other words, power consumption of the memory device can be reduced because refresh operation becomes unnecessary or the frequency of refresh operation can be extremely low.

In FIG. 28A, a wiring 251 is electrically connected to one of a source and a drain of the transistor 1281, and a wiring 252 is electrically connected to the other of the source and the drain of the transistor 1281. A wiring 254 is electrically connected to a gate of the transistor 289. One of the source and the drain of the transistor 289 is electrically connected to the node 256, and the other of the source and the drain of the transistor 289 is electrically connected to a wiring 253. The gate of the transistor 1281 and the one electrode of the capacitor 257 are electrically connected to the node 256. A wiring 255 is electrically connected to the other electrode of the capacitor 257.

The memory device in FIG. 28A has a feature that the charges supplied to the node 256 can be retained, and thus enables writing, retaining, and reading of data as follows.

[Writing and Retaining Operations]

Writing and retaining of data are described. First, the potential of the wiring 254 is set to a potential at which the transistor 289 is on. Accordingly, the potential of the wiring 253 is supplied to the node 256. That is, a predetermined charge is supplied to the node 256 (writing). Here, one of two kinds of charges providing different potential levels (hereinafter referred to as a "low-level charge" and a "high-level charge") is supplied. After that, the potential of the wiring 254 is set to a potential at which the transistor 289 is off. Thus, the charge is retained at the node 256.

Note that the high-level charge is a charge for supplying a higher potential to the node 256 than the low-level charge. In the case where the transistor 1281 is a p-channel transistor, each of the high-level and low-level charges is a charge for supplying a potential higher than the threshold voltage of the transistor. In the case where the transistor 1281 is an n-channel transistor, each of the high-level and low-level charges is a charge for supplying a potential lower than the threshold voltage of the transistor. In other words, each of the high-level and low-level charges is a charge for supplying a potential at which the transistor is off.

Since the off-state current of the transistor 289 is extremely low, the charge of the node 256 is retained for a long time.

[Reading Operation]

Next, reading of data is described. A reading potential $V_R$ is supplied to the wiring 255 while a predetermined potential (a constant potential) different from the potential of the wiring 252 is supplied to the wiring 251, whereby data retained at the node 256 can be read.

The reading potential $V_R$ is set to $\{(V_{th}-V_H)+(V_{th}+V_L)\}/2$, where $V_H$ is the potential supplied in the case of the high-level charge and $V_L$ is the potential supplied in the case of the low-level charge. Note that the potential of the wiring 255 in a period during which data is not read is set to a potential higher than $V_H$ in the case where the transistor 1281 is a p-channel transistor, and is set to a potential lower than $V_L$ in the case where the transistor 1281 is an n-channel transistor.

For example, in the case where the transistor 1281 is a p-channel transistor, $V_R$ is −2 V when $V_{th}$ of the transistor 1281 is −2 V, $V_H$ is 1 V, and $V_L$ is −1 V. When the potential written to the node 256 is $V_H$ and $V_R$ is applied to the wiring 255, $V_R+V_H$, i.e., −1 V, is applied to the gate of the transistor 1281. Since −1 V is higher than $V_{th}$, the transistor 1281 is not turned on. Thus, the potential of the wiring 252 is not changed. When the potential written to the node 256 is $V_L$ and $V_R$ is applied to the wiring 255, $V_R+V_L$, i.e., −3 V, is applied to the gate of the transistor 1281. Since −3 V is lower than $V_{th}$, the transistor 1281 is turned on. Thus, the potential of the wiring 252 is changed.

In the case where the transistor 1281 is an n-channel transistor, $V_R$ is 2 V when $V_{th}$ of the transistor 1281 is 2 V, $V_H$ is 1 V, and $V_L$ is −1 V. When the potential written to the node 256 is $V_H$ and $V_R$ is applied to the wiring 255, $V_R+V_H$, i.e., 3 V, is applied to the gate of the transistor 1281. Since 3 V is higher than $V_{th}$, the transistor 1281 is turned on. Thus, the potential of the wiring 252 is changed. When the potential written to the node 256 is $V_L$ and $V_R$ is applied to the wiring 255, $V_R+V_L$, i.e., 1 V, is applied to the gate of the transistor 1281. Since 1 V is lower than $V_{th}$, the transistor 1281 is not turned on. Thus, the potential of the wiring 252 is not changed.

By determining the potential of the wiring 252, data retained at the node 256 can be read.

The semiconductor device in FIG. 28B is different from the semiconductor device in FIG. 28A in that the transistor 1281 is not provided. Also in this case, data can be written and retained in a manner similar to that of the semiconductor device in FIG. 28A.

Reading of data in the semiconductor device in FIG. 28B is described. When a potential at which the transistor 289 is turned on is supplied to the wiring 254, the wiring 253 which is in a floating state and the capacitor 257 are brought into conduction, and the charge is redistributed between the wiring 253 and the capacitor 257. As a result, the potential of the wiring 253 is changed. The amount of change in the potential of the wiring 253 varies depending on the potential of the node 256 (or the charge accumulated in the node 256).

For example, the potential of the wiring 253 after the charge redistribution is $(C_B \times V_{B0}+C \times V)/(C_B+C)$, where V is the potential of the node 256, C is the capacitance of the capacitor 257, $C_B$ is the capacitance component of the wiring 253, and $V_{B0}$ is the potential of the wiring 253 before the charge redistribution. Thus, it can be found that, assuming that the memory cell is in either of two states in which the potential of the node 256 is $V_1$ and $V_0$ ($V_1>V_0$), the potential of the wiring 253 in the case of retaining the potential $V_1$ $(=(C_B \times V_{B0}+C \times V_1)/(C_B+C))$ is higher than the potential of the wiring 253 in the case of retaining the potential $V_0$ $(=(C_B \times V_{B0}+C \times V_0)/(C_B+C))$.

Then, by comparing the potential of the wiring 253 with a predetermined potential, data can be read.

When including a transistor using an oxide semiconductor and having an extremely low off-state current, the memory device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the memory device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the memory device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Example of CPU>

Figure 29:
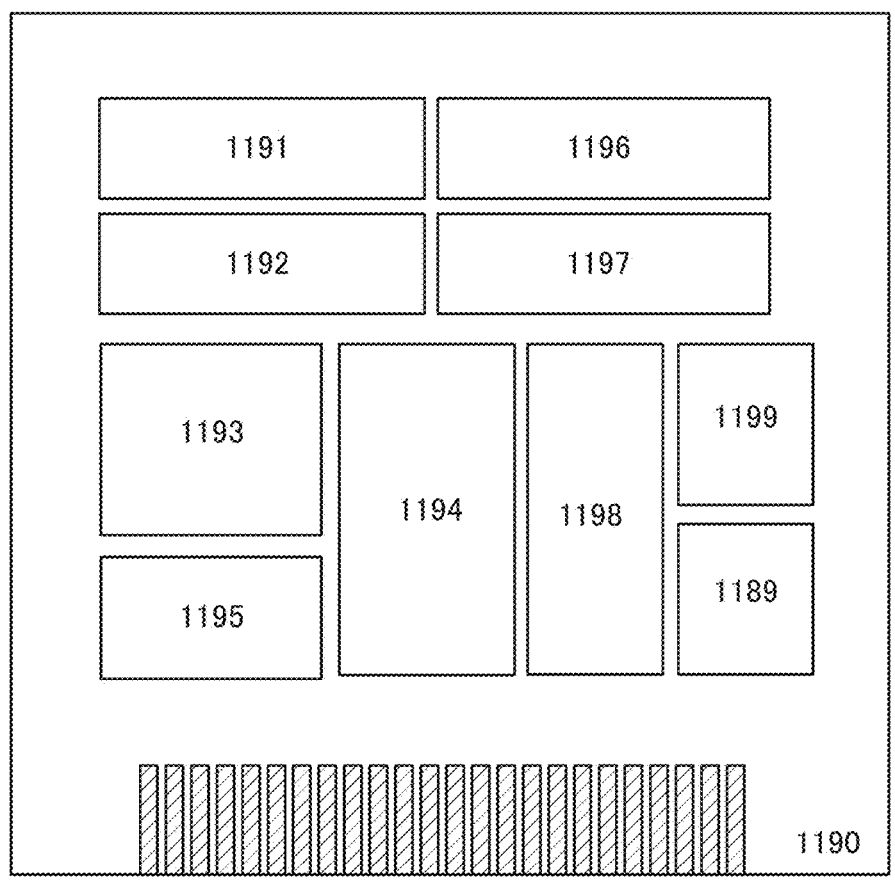
FIG. 29 is a block diagram illustrating a structure example of a CPU.

Next, an example of a CPU including any of the above-described transistors will be described. FIG. 29 is a block diagram illustrating a structure example of a CPU including any of the above-described transistors as a component.

The CPU illustrated in FIG. 29 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 29 is just an example in which the structure is simplified, and an actual CPU may have a variety of configurations depending on the application. For example, the CPU may have the following configuration: a structure including the CPU illustrated in FIG. 29 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit on the basis of its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 29, a memory cell is provided in the register 1196. For the memory cell of the register 1196, any of the above-described transistors, the above-described memory device, or the like can be used.

In the CPU illustrated in FIG. 29, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to a memory element in the register 1196. When data retaining by the capacitor is selected, the data is rewritten in the capacitor, and supply of power supply voltage to the memory cell in the register 1196 can be stopped.

Figure 30:
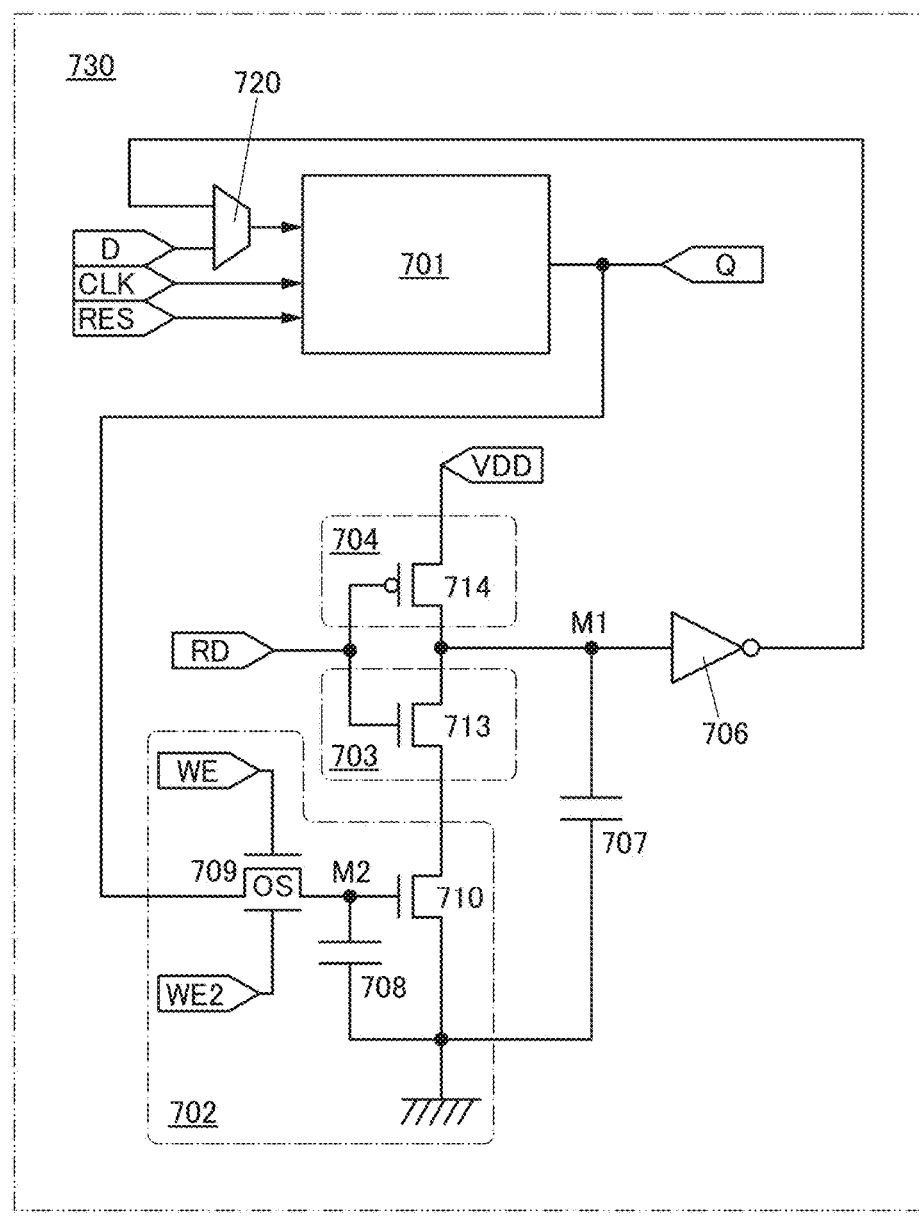
FIG. 30 is a circuit diagram illustrating an example of a memory element.

FIG. 30 is an example of a circuit diagram of a memory element that can be used as the register 1196. A memory element 730 includes a circuit 701 in which stored data is volatile when power supply is stopped, a circuit 702 in which stored data is nonvolatile even when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 730 may further include another element such as a diode, a resistor, or an inductor, as needed.

Here, the above-described memory device can be used as the circuit 702. When supply of a power supply voltage to the memory element 730 is stopped, a ground potential (0 V) or a potential at which the transistor 709 in the circuit 702 is turned off continues to be input to a gate of the transistor 709. For example, the gate of the transistor 709 is grounded through a load such as a resistor.

Shown here is an example in which the switch 703 is a transistor 713 having one conductivity type (e.g., an n-channel transistor) and the switch 704 is a transistor 714 having a conductivity type opposite to the one conductivity type (e.g., a p-channel transistor). A first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a wiring which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a wiring which can supply a power supply potential VDD. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the wiring which can supply a low power supply potential (e.g., a GND line). The other of the pair of electrodes of the capacitor 708 can be supplied with a constant potential. For example, the other of the pair of electrodes of the capacitor 708 can be supplied with a low power supply potential (e.g., GND) or a high power supply potential (e.g., VDD). The other of the pair of electrodes of the capacitor 708 is electrically connected to the wiring which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to the gate electrode of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 701 is input to the other of the source and the drain of the transistor 709. FIG. 30 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 30, a signal output from the second terminal of the switch 703 (the other of the source and the drain of the transistor 713) is input to the circuit 701 through the logic element 706 and the circuit 720; however, one embodiment of the present invention is not limited thereto. The signal output from the second terminal of the switch 703 (the other of the source and the drain of the transistor 713) may be input to the circuit 701 without its logic value being inverted. For example, in the case where the circuit 701 includes a node in which a signal obtained by inversion of the logic value of a signal input from the input terminal is retained, the signal output from the second terminal of the switch 703 (the other of the source and the drain of the transistor 713) can be input to the node.

As the transistor 709 in FIG. 30, the transistor 100 described in the above embodiment can be used. The control signal WE can be input to the gate electrode and a control signal WE2 can be input to the back gate electrode. The control signal WE2 is a signal having a constant potential. As the constant potential, for example, a ground potential or a potential lower than a source potential of the transistor 709 is selected. The control signal WE2 is a potential signal for controlling the threshold voltage of the transistor 709, and a drain current of the transistor 709 at a gate voltage of 0 V can be further reduced. Note that as the transistor 709, a transistor without a second gate may be used.

In FIG. 30, the transistors included in the memory element 730 except for the transistor 709 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 730 may be transistors in which a channel is formed in an oxide semiconductor layer. Further alternatively, in the memory element 730, a transistor in which a channel is formed in an oxide semiconductor layer and a transistor in which a channel is formed in a layer formed using a semiconductor other than an oxide semiconductor or in the substrate 1190 can be used in combination as the transistors other than the transistor 709.

As the circuit 701 in FIG. 30, for example, a flip-flop circuit can be used. As the logic element 706, for example, an inverter or a clocked inverter can be used.

In a period during which the memory element 730 is not supplied with the power supply voltage, the semiconductor device of one embodiment of the present invention can retain data stored in the circuit 701 at the node M2 by the capacitor 708 which is provided in the circuit 702.

As described above, the off-state current of an OS transistor is extremely low. For example, the off-state current of an OS transistor is significantly lower than that of a transistor in which a channel is formed in silicon having crystallinity. Thus, when the transistor is used as the transistor 709, a signal retained by the capacitor 708 is retained for a long time also in a period during which the power supply voltage is not supplied to the memory element 730. The memory element 730 can accordingly retain the stored content (data) also in a period during which the supply of the power supply voltage is stopped.

Since the switch 703 and the switch 704 are provided, the time required for the circuit 701 to retain original data again after the supply of the power supply voltage is restarted can be shortened.

In the circuit 702, a signal retained at the node M2 is input to the gate of the transistor 710. Therefore, after supply of the power supply voltage to the memory element 730 is restarted, the state (the on state or the off state) of the transistor 710 is determined in accordance with the signal retained at the node M2 and can be read from the circuit 702. Consequently, an original signal can be accurately read even when a potential corresponding to the signal retained at the node M2 varies to some degree.

By applying the above-described memory element 730 to a memory device such as a register or a cache memory included in the CPU, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time at an increased frequency in the CPU or one or a plurality of logic circuits included in the CPU, resulting in lower power consumption.

Although the memory element 730 is used in a CPU in this embodiment, the memory element 730 can also be used in an LSI such as a digital signal processor (DSP), a custom LSI, or a programmable logic device (PLD), and a radio frequency identification (RF-ID).

<Example of Display Device>

Figure 31A:
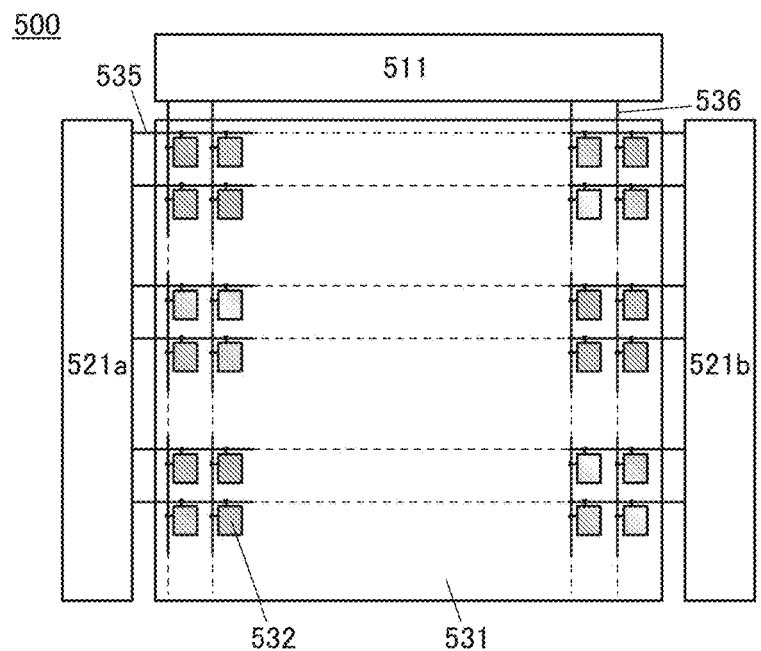
FIGS. 31A to 31C illustrate examples of a display device.

Next, an example of a display device including any of the above-described transistors will be described. FIG. 31A is a block diagram illustrating a structure example of a display device 500.

The display device 500 in FIG. 31A includes driver circuits 511, 521a, and 521b, and a display region 531. Note that the driver circuits 511, 521a, and 521b are collectively referred to as a driver circuit or a peripheral driver circuit in some cases.

The driver circuits 521a and 521b can function as, for example, scan line driver circuits. The driver circuit 511 can function as, for example, a signal line driver circuit. Note that one of the driver circuits 521a and 521b may be omitted. Alternatively, some sort of circuit facing the driver circuit 511 with the display region 531 provided therebetween may be provided.

The display device 500 illustrated as an example in FIG. 31A includes p wirings 535 which are arranged substantially parallel to each other and whose potentials are controlled by the driver circuit 521a and/or the driver circuit 521b, and q wirings 536 which are arranged substantially parallel to each other and whose potentials are controlled by the driver circuit 511. The display region 531 includes a plurality of pixels 532 arranged in a matrix. The pixel 532 includes a pixel circuit 534 and a display element.

When every three pixels 532 function as one pixel, full-color display can be provided. The three pixels 532 each control the transmittance, reflectance, amount of emitted light, or the like of red light, green light, or blue light. The light colors controlled by the three pixels 532 are not limited to the combination of red, green, and blue, and may be yellow, cyan, and magenta.

A pixel 532 that controls white light may be added to the pixels controlling red light, green light, and blue light so that the four pixels 532 will collectively serve as one pixel. The addition of the pixel 532 controlling white light can heighten the luminance of the display region. When the number of the pixels 532 functioning as one pixel is increased to use red, green, blue, yellow, cyan, and magenta in appropriate combination, the range of color reproduction can be widened.

Using the pixels arranged in a matrix of 1920×1080, the display device 500 can display an image with "full high definition" (also referred to as "2K resolution", "2K1K", "2K", and the like). Using the pixels arranged in a matrix of 3840×2160, the display device 500 can display an image with "ultra high definition" (also referred to as "4K resolution", "4K2K", "4K", and the like). Using the pixels arranged in a matrix of 7680×4320, the display device 500 can display an image with "super high definition" (also referred to as "8K resolution", "8K4K", "8K", and the like). Using a larger number of pixels, the display device 500 can display an image with 16K or 32K resolution.

A wiring 535_g on the g-th row (g is a natural number larger than or equal to 1 and smaller than or equal to p) is electrically connected to q pixels 532 on the g-th row among the plurality of pixels 532 arranged in p rows and q columns (p and q are each a natural number larger than or equal to 1) in the display region 531. A wiring 536_h on the h-th column (h is a natural number larger than or equal to 1 and smaller than or equal to q) is electrically connected to p pixels 532 on the h-th column among the plurality of pixels 532 arranged in p rows and q columns.

[Display Element]

The display device 500 can employ various modes and include various display elements. Examples of the display element include a display medium whose contrast, luminance, reflectance, transmittance, or the like is changed by electrical or magnetic effect, such as an electroluminescence (EL) element (e.g., an organic EL element, an inorganic EL element, or an EL element including organic and inorganic materials), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, or a display element using a carbon nanotube. Alternatively, quantum dots may be used as the display element.

Note that examples of display devices having EL elements include an EL display. Examples of display devices including electron emitters are a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. For example, the display device may be a plasma display panel (PDP). The display device may be a retina scanning type projection device.

In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

FIGS. 31B and 31C and FIGS. 32A and 32B illustrate circuit structure examples that can be used for the pixel 532.

[Example of Pixel Circuit for Light-Emitting Display Device]

Figure 31B:
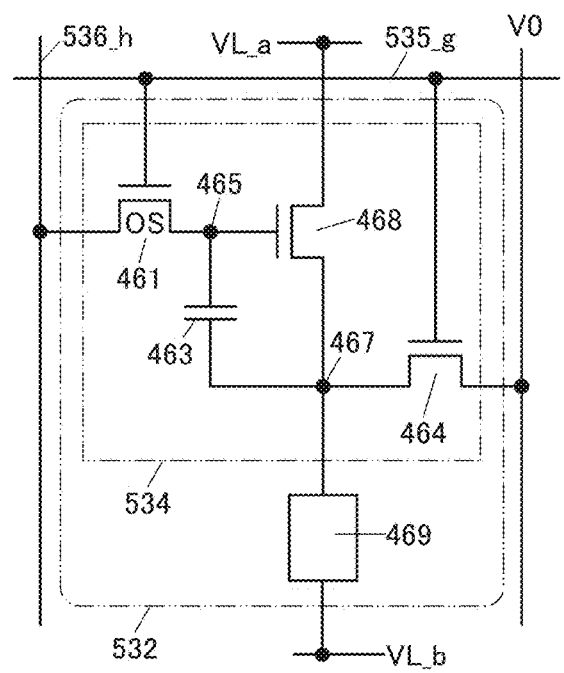

The pixel circuit 534 in FIG. 31B includes transistors 461, 468, and 464, and a capacitor 463. The pixel circuit 534 in FIG. 31B is electrically connected to a light-emitting element 469 that can function as a display element.

The transistors 461, 468, and 464 can be OS transistors. It is particularly preferable to use an OS transistor as the transistor 461.

One of a source electrode and a drain electrode of the transistor 461 is electrically connected to the wiring 536_*h*. A gate electrode of the transistor 461 is electrically connected to the wiring 535_*g*. The wiring 536_*h* supplies a video signal.

The transistor 461 has a function of controlling writing of a video signal to a node 465.

One of a pair of electrodes of the capacitor 463 is electrically connected to the node 465, and the other is electrically connected to a node 467. The other of the source electrode and the drain electrode of the transistor 461 is electrically connected to the node 465.

The capacitor 463 has a function as a storage capacitor for storing data written to the node 465.

One of a source electrode and a drain electrode of the transistor 468 is electrically connected to a potential supply line VL_a, and the other of the source electrode and the drain electrode of the transistor 468 is electrically connected to the node 467. A gate electrode of the transistor 468 is electrically connected to the node 465.

One of a source electrode and a drain electrode of the transistor 464 is electrically connected to a potential supply line V0, and the other of the source electrode and the drain electrode of the transistor 464 is electrically connected to the node 467. A gate electrode of the transistor 464 is electrically connected to the wiring 535_*g*.

One of an anode and a cathode of the light-emitting element 469 is electrically connected to a potential supply line VL_b, and the other is electrically connected to the node 467.

As the light-emitting element 469, an organic electroluminescence element (also referred to as an organic EL element) or the like can be used, for example. Note that the light-emitting element 469 is not limited thereto and may be an inorganic EL element containing an inorganic material, for example.

A high power supply potential $V_{DD}$ is supplied to one of the potential supply line VL_a and the potential supply line VL_b, and a low power supply potential $V_{SS}$ is supplied to the other, for example.

In the display device 500 including the pixel circuits 534 in FIG. 31B, the pixels 532 are sequentially selected row by row by the driver circuit 521*a* and/or the driver circuit 521*b*, so that the transistors 461 and 464 are turned on and a video signal is written to the node 465.

The pixel 532 in which the data has been written to the node 465 is brought into a holding state when the transistors 461 and 464 are turned off. The amount of current flowing between the source electrode and the drain electrode of the transistor 468 is controlled in accordance with the potential of the data written to the node 465. The light-emitting element 469 emits light with a luminance corresponding to the amount of flowing current. This operation is sequentially performed row by row; thus, an image can be displayed.

Figure 32A:
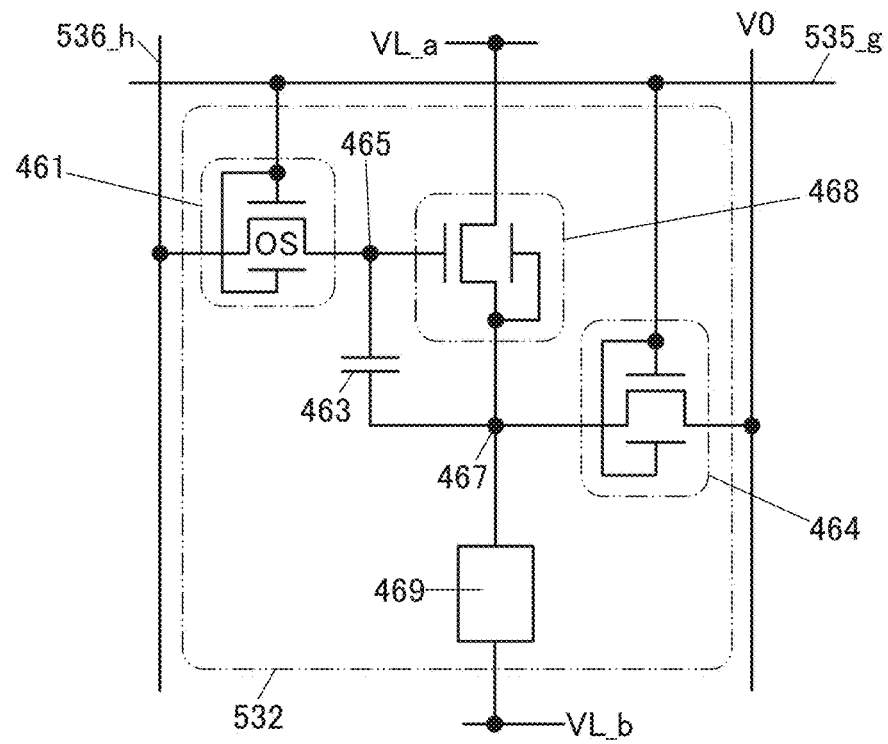
FIGS. 32A and 32B each illustrate an example of a display device.

As shown in FIG. 32A, the transistors 461, 464, and 468 may be transistors with back gates. In each of the transistors 461 and 464 in FIG. 32A, the gate is electrically connected to the back gate. Thus, the gate and the back gate always have the same potential. The back gate of the transistor 468 is electrically connected to the node 467. Therefore, the back gate always has the same potential as the node 467.

[Example of Pixel Circuit for Liquid Crystal Display Device]

Figure 31C:
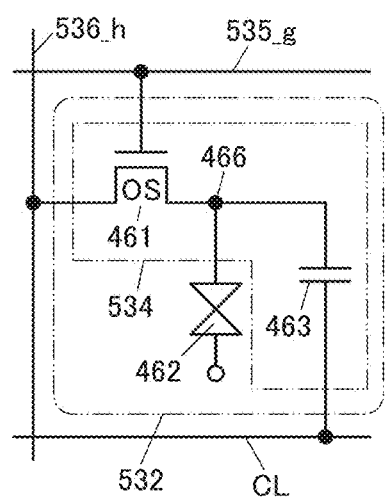

The pixel circuit 534 in FIG. 31C includes the transistor 461 and the capacitor 463. The pixel circuit 534 in FIG. 31C is electrically connected to a liquid crystal element 462 that can function as a display element. It is preferable to use an OS transistor as the transistor 461.

The potential of one of a pair of electrodes of the liquid crystal element 462 is set as appropriate according to the specifications of the pixel circuit 534. For example, one of the pair of electrodes of the liquid crystal element 462 may be supplied with a common potential, or may have the same potential as a capacitor line CL. Further, the potential applied to one of the pair of electrodes of the liquid crystal element 462 may be different among the pixels 532. The other of the pair of electrodes of the liquid crystal element 462 is electrically connected to a node 466. The alignment state of the liquid crystal element 462 depends on data written to the node 466.

As a driving method of the display device including the liquid crystal element 462, any of the following modes can be used, for example: a twisted nematic (TN) mode, a super-twisted nematic (STN) mode, a vertical alignment (VA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, a multi-domain vertical alignment (MVA) mode, a patterned vertical alignment (PVA) mode, an in-plane switching (IPS) mode, a fringe field switching (FFS) mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that one embodiment of the present invention is not limited thereto, and various liquid crystal elements and driving methods can be used.

In the case where a liquid crystal element is used as the display element, thermotropic liquid crystal, low-molecular liquid crystal, high-molecular liquid crystal, polymer-dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which 5 wt. % or more of a chiral material is mixed is used for a liquid crystal layer in order to improve the temperature range. The liquid crystal composition that includes the liquid crystal exhibiting a blue phase and a chiral material has a short response time of 1 msec or less, and has optical isotropy, which makes the alignment process unnecessary and the viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, productivity of the liquid crystal display device can be improved.

Furthermore, it is possible to use a method called domain multiplication or multi-domain design, in which a pixel is divided into some regions (subpixels) and molecules are aligned in different directions in their respective regions.

The specific resistivity of the liquid crystal material is greater than or equal to $1 \times 10^9$ Ω·cm, preferably greater than or equal to $1\times10^{11}$ Ω·cm, still preferably greater than or equal to $1\times10^{12}$ Ω·cm. Note that the specific resistance in this specification is measured at 20° C.

In the pixel circuit 534 on the g-th row and the h-th column, one of the source electrode and the drain electrode of the transistor 461 is electrically connected to the wiring 536_h, and the other of the source electrode and the drain electrode of the transistor 461 is electrically connected to the node 466. The gate electrode of the transistor 461 is electrically connected to the wiring 535_g. The wiring 536_h supplies a video signal. The transistor 461 has a function of controlling writing of a video signal to the node 466.

One of a pair of electrodes of the capacitor 463 is electrically connected to a wiring to which a particular potential is supplied (hereinafter referred to as a capacitor line CL), and the other is electrically connected to the node 466. The potential of the capacitor line CL is set in accordance with the specifications of the pixel circuit 534 as appropriate. The capacitor 463 has a function as a storage capacitor for storing data written to the node 466.

For example, in the display device 500 including the pixel circuit 534 in FIG. 31C, the pixel circuits 534 are sequentially selected row by row by the driver circuit 521a and/or the driver circuit 521b, so that the transistors 461 are turned on and a video signal is written to the node 466.

The pixel circuit 534 in which the video signal has been written to the node 466 is brought into a holding state when the transistor 461 is turned off. This operation is sequentially performed row by row; thus, an image can be displayed on the display region 531.

Figure 32B:
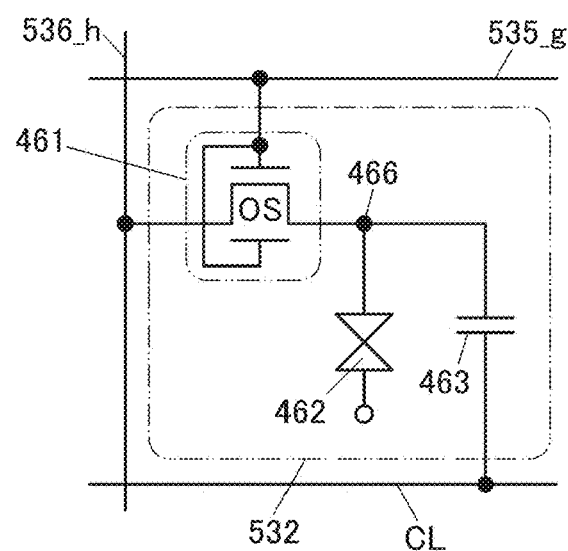

As shown in FIG. 32B, the transistor 461 may be a transistor with a back gate. In the transistor 461 in FIG. 32B, the gate is electrically connected to the back gate. Thus, the gate and the back gate always have the same potential.

[Structure Example of Peripheral Circuit]

Figure 33A:
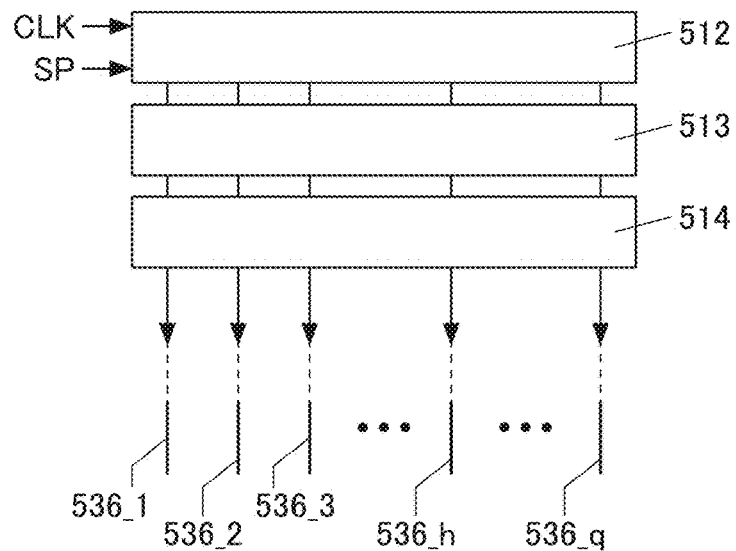
FIGS. 33A and 33B each illustrate a configuration example of a driver circuit.
Figure 33B:
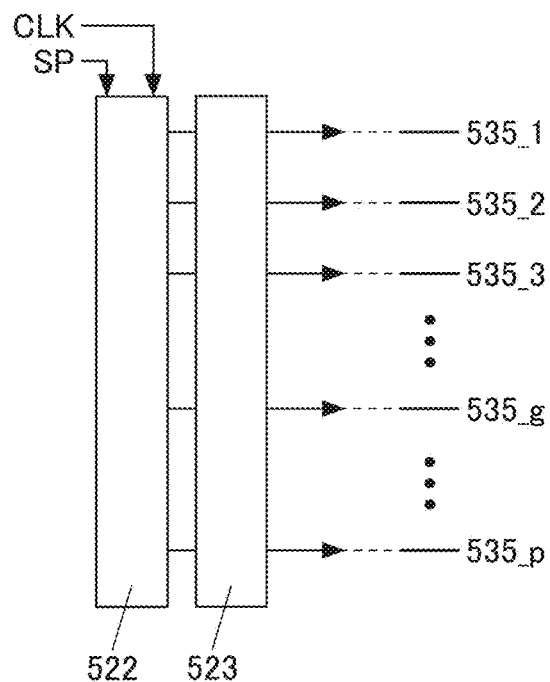

FIG. 33A shows a structure example of the driver circuit 511. The driver circuit 511 includes a shift register 512, a latch circuit 513, and a buffer 514. FIG. 33B shows a structure example of the driver circuit 521a. The driver circuit 521a includes a shift register 522 and a buffer 523. The structure of the driver circuit 521b can be similar to that of the driver circuit 521a.

A start pulse SP, a clock signal CLK, and the like are input to the shift register 512 and the shift register 522.

This embodiment can be implemented in appropriate combination with any of the structures described in the other embodiments and the like.

(Embodiment 3)

In this embodiment, specific structure examples of the display device described in Embodiment 2 will be described with reference to drawings. With use of any of the transistors of one embodiment of the present invention, some or all of driver circuits which include shift registers can be formed over a substrate where a pixel portion is formed, whereby a system-on-panel can be obtained.

<Liquid Crystal Display Device and EL Display Device>

A display device including a liquid crystal element and a display device including an EL element are described as examples of the display device. In FIG. 34A, a sealant 4005 is provided so as to surround a pixel portion 4002 provided over a first substrate 4001, and the pixel portion 4002 is sealed with a second substrate 4006. In FIG. 34A, a signal line driver circuit 4003 and a scan line driver circuit 4004 each are formed using a single crystal semiconductor or a polycrystalline semiconductor over another substrate, and mounted in a region different from the region surrounded by the sealant 4005 over the first substrate 4001. Various signals and potentials are supplied to the signal line driver circuit 4003, the scan line driver circuit 4004, and the pixel portion 4002 from flexible printed circuits (FPCs) 4018a and 4018b.

In FIGS. 34B and 34C, the sealant 4005 is provided so as to surround the pixel portion 4002 and the scan line driver circuit 4004 that are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. Furthermore, in FIGS. 34B and 34C, the signal line driver circuit 4003 that is formed using a single crystal semiconductor or a polycrystalline semiconductor over another substrate is mounted in a region that is different from the region surrounded by the sealant 4005 over the first substrate 4001. In FIGS. 34B and 34C, various signals and potentials are supplied to the signal line driver circuit 4003, the scan line driver circuit 4004, and the pixel portion 4002 through an FPC 4018.

Although FIGS. 34B and 34C each illustrate an example in which the signal line driver circuit 4003 is formed separately and mounted on the first substrate 4001, one embodiment of the present invention is not limited to this structure. The scan line driver circuit may be separately formed and then mounted, or only part of the signal line driver circuit or part of the scan line driver circuit may be separately formed and then mounted.

The connection method of a separately formed driver circuit is not particularly limited; wire bonding, a chip on glass (COG), a tape carrier package (TCP), a chip on film (COF), or the like can be used. FIG. 34A illustrates an example in which the signal line driver circuit 4003 and the scan line driver circuit 4004 are mounted by a COG. FIG. 34B illustrates an example in which the signal line driver circuit 4003 is mounted by a COG. FIG. 34C illustrates an example in which the signal line driver circuit 4003 is mounted by a TCP.

In some cases, the display device encompasses a panel in which a display element is sealed, and a module in which an IC or the like including a controller is mounted on the panel.

The pixel portion and the scan line driver circuit provided over the first substrate include a plurality of transistors and any of the transistors which are described in the above embodiments can be applied thereto.

FIGS. 35A and 35B correspond to cross-sectional views taken along chain line N1-N2 in FIG. 34B. As shown in FIGS. 35A and 35B, the display device has an electrode 4015, and the electrode 4015 is electrically connected to a terminal included in the FPC 4018 through an anisotropic conductive layer 4019. The electrode 4015 is electrically connected to a wiring 4014 in an opening formed in insulating layers 4112 and 4111.

The electrode 4015 is formed using the same conductive layer as an electrode 4030, and the wiring 4014 is formed using the same conductive layer in the same step as an electrode 4108.

Each of the pixel portion 4002 and the scan line driver circuit 4004 provided over the first substrate 4001 includes a plurality of transistors. In FIGS. 35A and 35B, a transistor 4010 included in the pixel portion 4002 and a transistor 4011 included in the scan line driver circuit 4004 are shown as an example. Insulating layers 4106 and 4107 and the insulating layers 4111 and 4112 are provided over the transistors 4010 and 4011 in FIG. 35A. The electrode 4108 and an electrode 4109 are provided between the insulating layer 4107 and the insulating layer 4111. The electrode 4108 is electrically connected to the transistor 4011 through a contact plug. The electrode 4109 is electrically connected to the transistor 4010 through a contact plug. A bank 4510 is further provided over the insulating layer 4112 in FIG. 35B.

The transistors 4010 and 4011 are provided over insulating layers 4102 and 4103. The transistors 4010 and 4011 each include an insulating layer 4110 and an electrode 4017 over the insulating layer 4103. An insulating layer 4104 is formed over the insulating layer 4110 and the electrode 4017. The electrode 4017 can serve as a back gate electrode.

Any of the transistors described in the above embodiments can be applied to the transistors 4010 and 4011. A change in the electrical characteristics of any of the transistors described in the above embodiments is suppressed and thus the transistors are electrically stable. Accordingly, the display devices of this embodiment illustrated in FIGS. 35A and 35B can be highly reliable display devices.

The display devices illustrated in FIGS. 35A and 35B each include a capacitor 4020. The capacitor 4020 includes a region where part of an electrode formed at the same time as a gate electrode of the transistor 4010 overlaps with an electrode 4021 with the insulating layer 4104 interposed therebetween. The electrode 4021 is formed using the same conductive layer in the same step as the electrode 4017.

In general, the capacitance of a capacitor provided in a display device is set in consideration of leakage current or the like of transistors provided in a pixel portion so that charges can be held for a predetermined period. The capacitance of the capacitor may be set considering off-state current of the transistor or the like.

For example, when an OS transistor is used in a pixel portion of a liquid crystal display device, the capacitance of the capacitor can be one-third or less, or one-fifth or less, of the capacitance of a liquid crystal. Using an OS transistor can omit the formation of a capacitor.

The transistor 4010 included in the pixel portion 4002 is electrically connected to the display element. An example of a liquid crystal display device using a liquid crystal element as a display element is illustrated in FIG. 35A. In FIG. 35A, a liquid crystal element 4013 that is the display element includes the electrode 4030, an electrode 4031, and a liquid crystal layer 4008. Note that an insulating layer 4032 and an insulating layer 4033 functioning as alignment films are provided so that the liquid crystal layer 4008 is provided therebetween. The electrode 4031 is provided on the second substrate 4006 side, and the electrode 4030 and the electrode 4031 overlap with each other with the liquid crystal layer 4008 positioned therebetween.

A spacer 4035 is a columnar spacer obtained by selective etching of an insulating layer and is provided in order to control the distance between the electrode 4030 and the electrode 4031 (a cell gap). Alternatively, a spherical spacer may be used.

As described above, OS transistors are preferably used as the transistors 4010 and 4011. In the OS transistor, the current in an off state (the off-state current) can be made small. Accordingly, an electrical signal such as an image signal can be held for a longer period, and a writing interval can be set longer in an on state. Accordingly, the frequency of refresh operation can be reduced, which leads to an effect of suppressing power consumption.

In the OS transistor, relatively high field-effect mobility can be obtained, whereby high-speed operation is possible. Consequently, when the above transistor is used in a driver circuit portion or a pixel portion of a display device, high-quality images can be obtained. Since the driver circuit portion and the pixel portion can be formed over one substrate with use of the above transistor, the number of components of the display device can be reduced.

In the display device, a black matrix (a light-blocking layer), an optical member (an optical substrate) such as a polarizing member, a retardation member, or an anti-reflection member, and the like may be provided as appropriate. For example, circular polarization may be employed by using a polarizing member and a retardation member. In addition, a backlight, a sidelight, or the like may be used as a light source.

As the display element included in the display device, a light-emitting element utilizing electroluminescence (also referred to as an "EL element") can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer, so that a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The carriers (electrons and holes) are recombined; thus, the light-emitting organic compound is excited. The light-emitting organic compound returns to a ground state from the excited state, thereby emitting light. Based on such a mechanism, such a light-emitting element is referred to as a current-excitation type light-emitting element.

In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron-transport property and a hole-transport property), and the like.

The EL layer can be formed by an evaporation method (including a vacuum evaporation method), a transfer method, a printing method, an inkjet method, a coating method, or the like.

Inorganic EL elements are classified as a dispersion-type inorganic EL element and a thin-film inorganic EL element depending on their element structures. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is given here using an organic EL element as a light-emitting element.

In order to extract light emitted from the light-emitting element, it is acceptable as long as at least one of a pair of electrodes is transparent. The transistor and the light-emitting element are formed over a substrate. The light-emitting element can have a top emission structure in which light emission is extracted from the side opposite to the substrate; a bottom emission structure in which light emission is extracted from the substrate side; or a dual emission structure in which light emission is extracted from both the side opposite to the substrate and the substrate side.

FIG. 35B illustrates an example of a light-emitting display device (also referred to as an "EL display device") using a light-emitting element as a display element. A light-emitting element 4513 which is the display element is electrically connected to the transistor 4010 provided in the pixel portion 4002. The structure of the light-emitting element 4513 is the stacked-layer structure including the electrode 4030, a light-emitting layer 4511, and the electrode 4031; however, this embodiment is not limited to this structure. The structure of the light-emitting element 4513 can be changed as appropriate depending on a direction in which light is extracted from the light-emitting element 4513, or the like.

The bank 4510 is formed using an organic insulating material or an inorganic insulating material. It is particularly preferable that the bank 4510 be formed using a photosensitive resin material to have an opening over the electrode 4030 so that a side surface of the opening slopes with continuous curvature.

The light-emitting layer 4511 may be formed using a single layer or a plurality of layers stacked.

A protective layer may be formed over the electrode 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, in a space which is enclosed by the first substrate 4001, the second substrate 4006, and the sealant 4005, a filler 4514 is provided for sealing. It is preferable that, in this manner, the display device be packaged (sealed) with a protective film (such as a laminate film or an ultraviolet curable resin film) or a cover member with high air-tightness and little degasification so that the display device is not exposed to the outside air.

As the filler 4514, an ultraviolet curable resin or a thermosetting resin can be used as well as an inert gas such as nitrogen or argon; for example, polyvinyl chloride (PVC), an acrylic resin, polyimide, an epoxy resin, a silicone resin, polyvinyl butyral (PVB), ethylene vinyl acetate (EVA), or the like can be used. A drying agent may be contained in the filler 4514.

A glass material such as a glass frit, or a resin that is curable at room temperature such as a two-component-mixture-type resin, a light curable resin, a thermosetting resin, and the like can be used for the sealant 4005. A drying agent may be contained in the sealant 4005.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (also called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The electrode 4030 and the electrode 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The electrode 4030 and the electrode 4031 each can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also called conductive polymer) can be used for the electrode 4030 and the electrode 4031. As the conductive high molecule, a so-called π-electron conjugated conductive high molecule can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken due to static electricity or the like, a protection circuit for protecting the driver circuit is preferably provided. The protection circuit is preferably formed using a nonlinear element.

With use of the shift registers described in the above embodiment, a highly reliable display device can be provided. With use of any of the transistors described in the above embodiments, a highly reliable display device can be provided. With use of any of the transistors described in the above embodiments, a display device that has a high resolution, a large size, and high display quality can be provided. Furthermore, a display device with low power consumption can be provided.

<Display Module>

Figure 36:
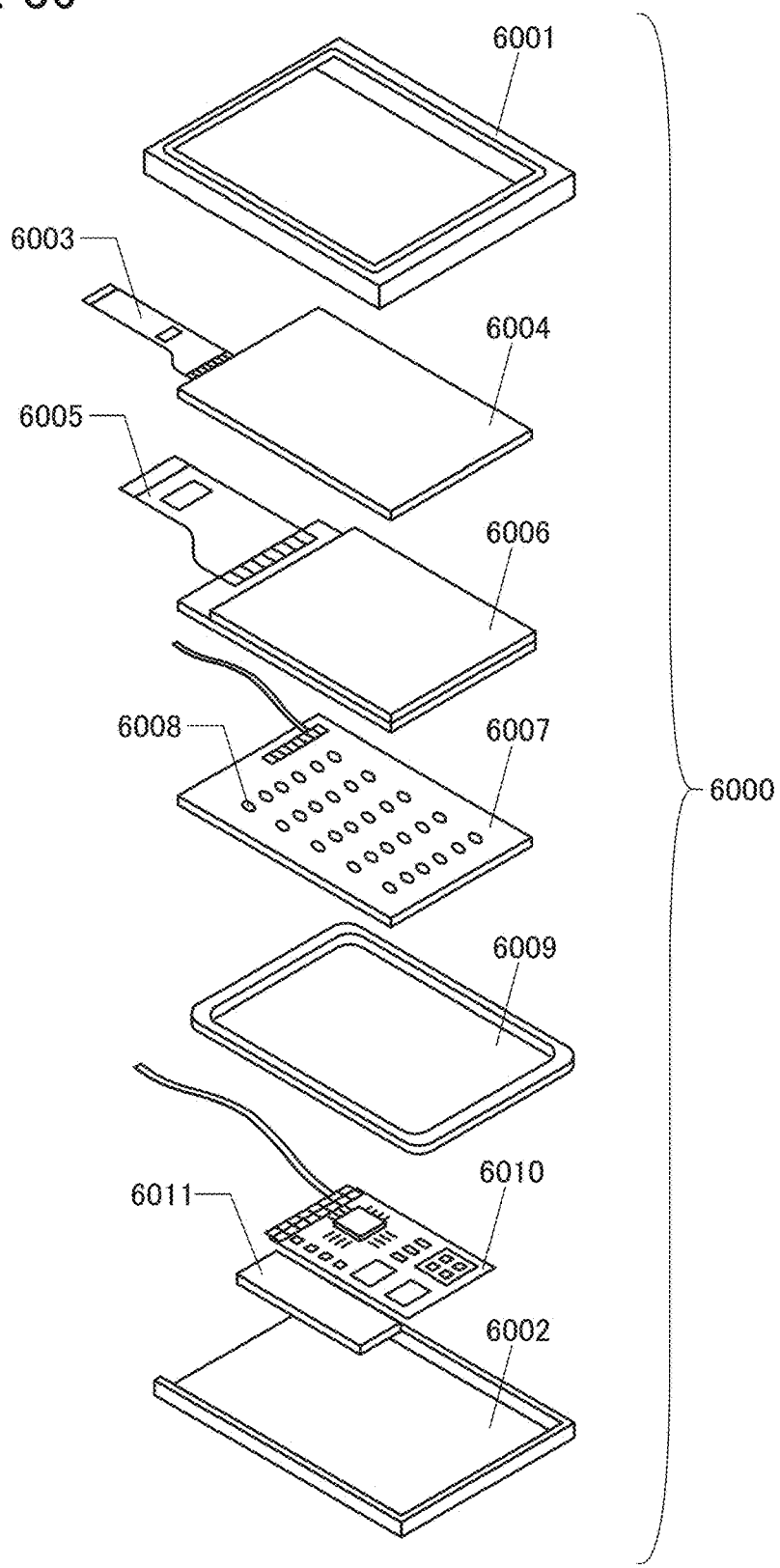
FIG. 36 illustrates an example of a display module.

A display module is described as an example of a semiconductor device using any of the above-described shift registers or transistors. In a display module 6000 in FIG. 36, a touch sensor 6004 connected to an FPC 6003, a display panel 6006 connected to an FPC 6005, a backlight unit 6007, a frame 6009, a printed circuit board 6010, and a battery 6011 are provided between an upper cover 6001 and a lower cover 6002. Note that the backlight unit 6007, the battery 6011, the touch sensor 6004, and the like are not provided in some cases.

The semiconductor device of one embodiment of the present invention can be used for, for example, the touch sensor 6004, the display panel 6006, an integrated circuit mounted on the printed circuit board 6010, and the like. For example, the above-described display device can be used in the display panel 6006.

The shapes and sizes of the upper cover 6001 and the lower cover 6002 can be changed as appropriate in accordance with the sizes of the touch sensor 6004, the display panel 6006, and the like.

The touch sensor 6004 can be a resistive touch sensor or a capacitive touch sensor and may be formed to overlap with the display panel 6006. The display panel 6006 can have a touch sensor function. For example, an electrode for a touch sensor may be provided in each pixel of the display panel 6006 so that a capacitive touch panel function is added. Alternatively, a photosensor may be provided in each pixel of the display panel 6006 so that an optical touch sensor function is added. In the case where the touch sensor 6004 is not necessarily provided, the touch sensor 6004 can be omitted.

The backlight unit 6007 includes a light source 6008. The light source 6008 may be provided at an end portion of the backlight unit 6007 and a light diffusing plate may be used. When a light-emitting display device or the like is used for the display panel 6006, the backlight unit 6007 can be omitted.

The frame 6009 protects the display panel 6006 and also functions as an electromagnetic shield for blocking electromagnetic waves generated from the printed circuit board 6010 side. The frame 6009 may function as a radiator plate.

The printed circuit board 6010 has a power supply circuit, a signal processing circuit for outputting a video signal and a clock signal, and the like. As a power source for supplying power to the power supply circuit, the battery 6011 or a commercial power source may be used. Note that the battery 6011 can be omitted in the case where a commercial power source is used as the power source.

The display module 6000 can be additionally provided with a member such as a polarizing plate, a retardation plate, or a prism sheet.

This embodiment can be implemented in appropriate combination with any of the structures described in the other embodiments and the like.

(Embodiment 4)

Figure 37A:
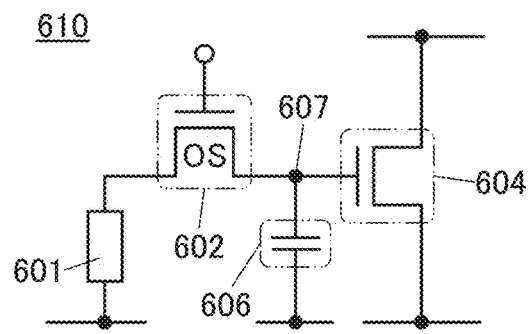
FIGS. 37A to 37C are each a circuit diagram illustrating an example of an imaging device.
Figure 37B:
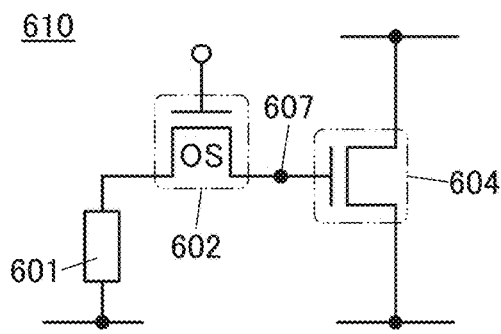
Figure 37C:
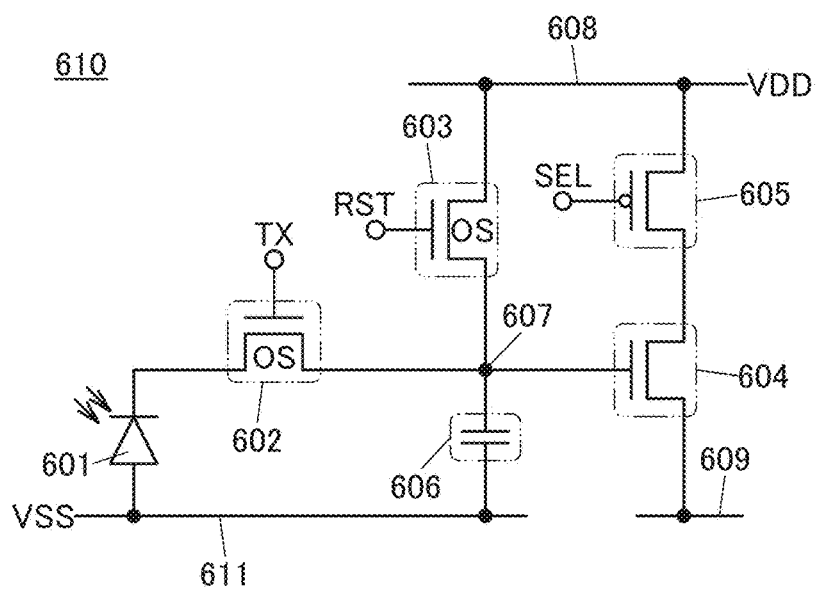

In this embodiment, an imaging device will be described as an example of a semiconductor device including any of the transistors disclosed in this specification and the like. FIGS. 37A to 37C each illustrate a circuit configuration example of an imaging device.

<Imaging Device>

An imaging device 610 including the circuit illustrated in FIG. 37A includes a photoelectric conversion element 601, a transistor 602, a transistor 604, and a capacitor 606. One of a source and a drain of the transistor 602 is electrically connected to the photoelectric conversion element 601, and the other of the source and the drain of the transistor 602 is electrically connected to a gate of the transistor 604 through a node 607 (a charge accumulation portion).

An OS transistor is preferably used as the transistor 602. Since the off-state current of the OS transistor is extremely low, the capacitor 606 can be small. Alternatively, the capacitor 606 can be omitted as illustrated in FIG. 37B. Furthermore, when the transistor 602 is an OS transistor, the potential of the node 607 is less likely to be changed. Thus, an imaging device which is less likely to be affected by noise can be provided. For example, the transistor 100 disclosed in the above embodiment can be used as the transistor 602. Note that the transistor 604 may be an OS transistor.

A diode element formed using a silicon substrate with a PN junction or a PIN junction can be used as the photoelectric conversion element 601. Alternatively, a PIN diode element formed using an amorphous silicon film, a microcrystalline silicon film, or the like may be used. Alternatively, a diode-connected transistor may be used. Further alternatively, a variable resistor or the like utilizing a photoelectric effect may be formed using silicon, germanium, selenium, or the like.

The photoelectric conversion element may be formed using a material capable of generating charges by absorbing radiation. Examples of the material capable of generating charges by absorbing radiation include lead iodide, mercury iodide, gallium arsenide, CdTe, and CdZn.

In the imaging device 610 including the circuit illustrated in FIG. 37C, a photodiode is used as the photoelectric conversion element 601. The imaging device 610 illustrated in FIG. 37C includes the photoelectric conversion element 601, the transistor 602, a transistor 603, the transistor 604, a transistor 605, and the capacitor 606. One of the source and the drain of the transistor 602 is electrically connected to a cathode of the photoelectric conversion element 601. The other of the source and the drain of the transistor 602 is electrically connected to the node 607. An anode of the photoelectric conversion element 601 is electrically connected to a wiring 611. One of a source and a drain of the transistor 603 is electrically connected to the node 607. The other of the source and the drain of the transistor 603 is electrically connected to a wiring 608. The gate of the transistor 604 is electrically connected to the node 607. One of a source and a drain of the transistor 604 is electrically connected to a wiring 609. The other of the source and the drain of the transistor 604 is electrically connected to one of a source and a drain of the transistor 605. The other of the source and the drain of the transistor 605 is electrically connected to the wiring 608. One electrode of the capacitor 606 is electrically connected to the node 607. The other electrode of the capacitor 606 is electrically connected to the wiring 611.

The transistor 602 can function as a transfer transistor. A gate of the transistor 602 is supplied with a transfer signal TX. The transistor 603 can function as a reset transistor. A gate of the transistor 603 is supplied with a reset signal RST. The transistor 604 can function as an amplifier transistor. The transistor 605 can function as a selection transistor. A gate of the transistor 605 is supplied with a selection signal SEL. Moreover, $V_{DD}$ is supplied to the wiring 608 and $V_{SS}$ is supplied to the wiring 611.

Next, operations of the imaging device 610 including the circuit illustrated in FIG. 37C will be described. First, the transistor 603 is turned on so that $V_{DD}$ is supplied to the node 607 (reset operation). Then, the transistor 603 is turned off so that $V_{DD}$ is retained at the node 607. Next, the transistor 602 is turned on so that the potential of the node 607 is changed in accordance with the amount of light received by the photoelectric conversion element 601 (accumulation operation). After that, the transistor 602 is turned off so that the potential of the node 607 is retained. Next, the transistor 605 is turned on so that a potential corresponding to the potential of the node 607 is output to the wiring 609 (selection operation). Measuring the potential of the wiring 609 can determine the amount of light received by the photoelectric conversion element 601.

An OS transistor is preferably used as each of the transistors 602 and 603. Since the off-state current of the OS transistor is extremely low as described above, the capacitor 606 can be small or omitted. Furthermore, when the transistors 602 and 603 are OS transistors, the potential of the node 607 is less likely to be changed. Thus, an imaging device which is less likely to be affected by noise can be provided.

A high-resolution imaging device can be obtained when the imaging devices 610 including any of the circuits illustrated in FIGS. 37A to 37C are arranged in a matrix.

For example, using the imaging devices 610 arranged in a 1920×1080 matrix, an imaging device can be obtained which can take an image with "full high definition" (also referred to as "2K resolution", "2K1K", "2K", and the like). Using the imaging devices 610 arranged in a 4096×2160 matrix, an imaging device can be obtained which can take an image with "ultra high definition" (also referred to as "4K resolution", "4K2K", "4K", and the like). Using the imaging devices 610 arranged in a 8192×4320 matrix, an imaging device can be obtained which can take an image with "super high definition" (also referred to as "8K resolution", "8K4K", "8K", and the like). Using a larger number of display elements, an imaging device can be obtained which can take an image with 16K or 32K resolution.

Figure 38:
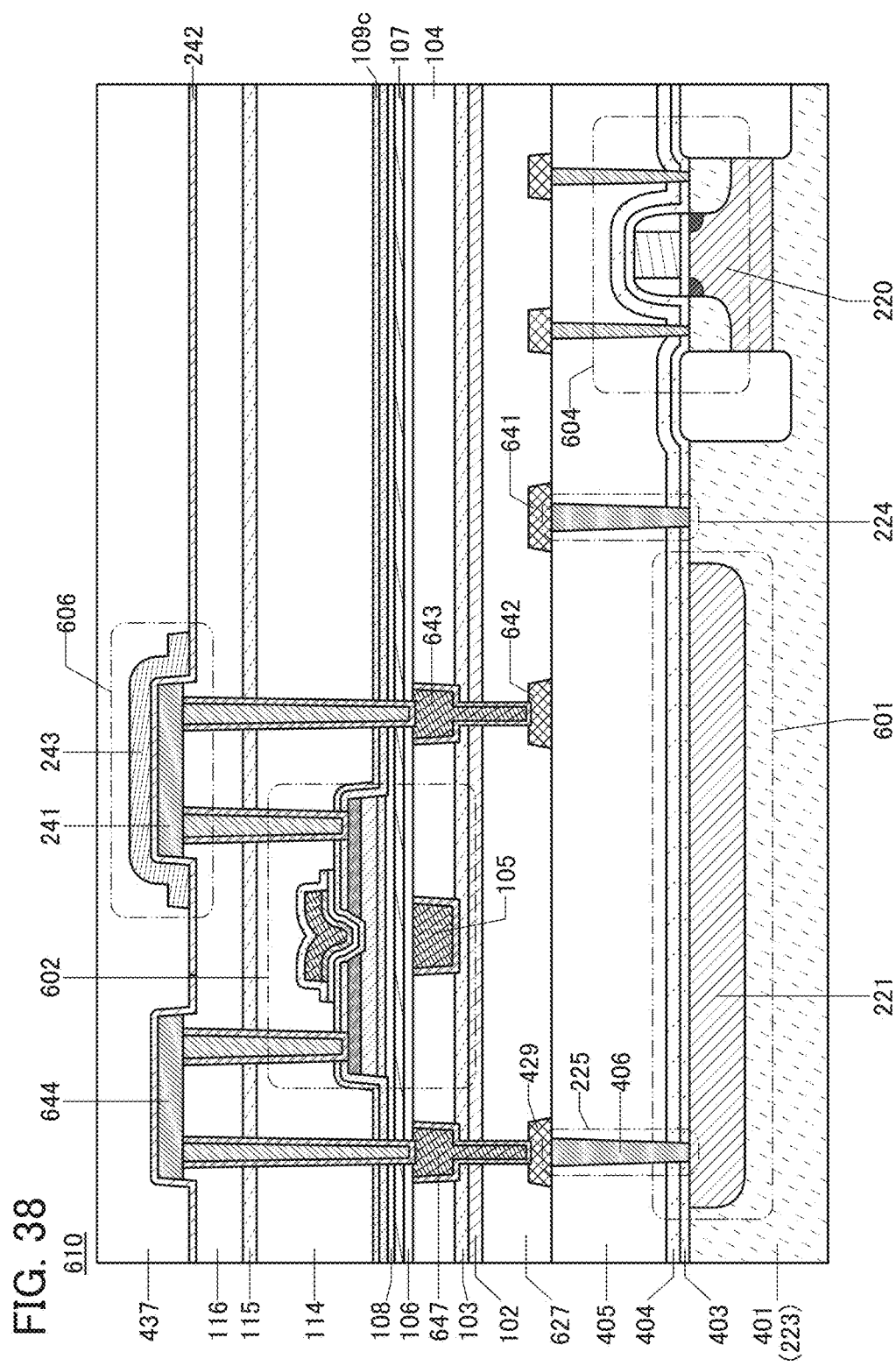
FIG. 38 illustrates a structure example of an imaging device.

FIG. 38 illustrates a structure example of the imaging device 610 including any of the above-described transistors. FIG. 38 is a cross-sectional view of the imaging device 610.

In the imaging device 610 illustrated in FIG. 38, an n-type semiconductor is used for the substrate 401. A p-type semiconductor 221 of the photoelectric conversion element 601 is provided in the substrate 401. A portion of the substrate 401 functions as an n-type semiconductor 223 of the photoelectric conversion element 601.

The transistor 604 is provided on the substrate 401. The transistor 604 can function as an n-channel transistor. A well 220 of a p-type semiconductor is provided in a portion of the substrate 401. The well 220 can be provided by a method similar to that for forming the p-type semiconductor 221. The well 220 and the p-type semiconductor 221 can be formed at the same time. Note that the transistor 282 described above can be used as the transistor 604, for example.

The insulating layer 403, the insulating layer 404, and the insulating layer 405 are formed over the photoelectric conversion element 601 and the transistor 604.

In a region of the insulating layers 403 to 405 which overlaps with the substrate 401 (the n-type semiconductor 223), an opening 224 is formed, and in a region of the insulating layers 403 to 405 which overlaps with the p-type semiconductor 221, an opening 225 is formed. Contact plugs 406 are formed in the opening 224 and the opening 225. The contact plugs 406 can be provided in a manner similar to that of the above-described contact plug. The number of openings (224 and 225) to be formed or their arrangement are not particularly limited. Thus, an imaging device with high layout flexibility can be provided.

An electrode 641, the electrode 429, and an electrode 642 are formed over the insulating layer 405. The electrode 641 is electrically connected to the n-type semiconductor 223 (the substrate 401) via the contact plug 406 provided in the opening 224. The electrode 429 is electrically connected to the p-type semiconductor 221 via the contact plug 406 provided in the opening 225. The electrode 642 can function as an electrode of the capacitor 606.

An insulating layer 627 is formed so as to cover the electrode 641, the electrode 642, and the electrode 429. The insulating layer 627 can be formed using a material and a method which are similar to those of the insulating layer 405. A surface of the insulating layer 627 may be subjected to CMP treatment. By the CMP treatment, unevenness of the surface can be reduced, and coverage with an insulating layer or a conductive layer formed later can be increased. The electrode 641, the electrode 642, and the electrode 429 can be formed using a material and a method which are similar to those of the above-described electrode.

The insulating layer 102 and the insulating layer 103 are formed over the insulating layer 627, and an electrode 647, the electrode 105, and an electrode 643 are formed over the insulating layer 103. The electrode 647 is electrically connected to the electrode 429.

An electrode 644 and the electrode 241 are formed over the insulating layer 116. The insulating layer 242 is formed to cover the electrode 644 and the electrode 241. The electrode 243 is formed to cover the electrode 241 with the insulating layer 242 provided therebetween. A region where the electrode 241, the insulating layer 242, and the electrode 243 overlap with each other functions as the capacitor 606.

The electrode 644 is electrically connected to one of the source and the drain of the transistor 602. The electrode 644 is electrically connected to the electrode 647.

[Modification Example 1]

Figure 39:
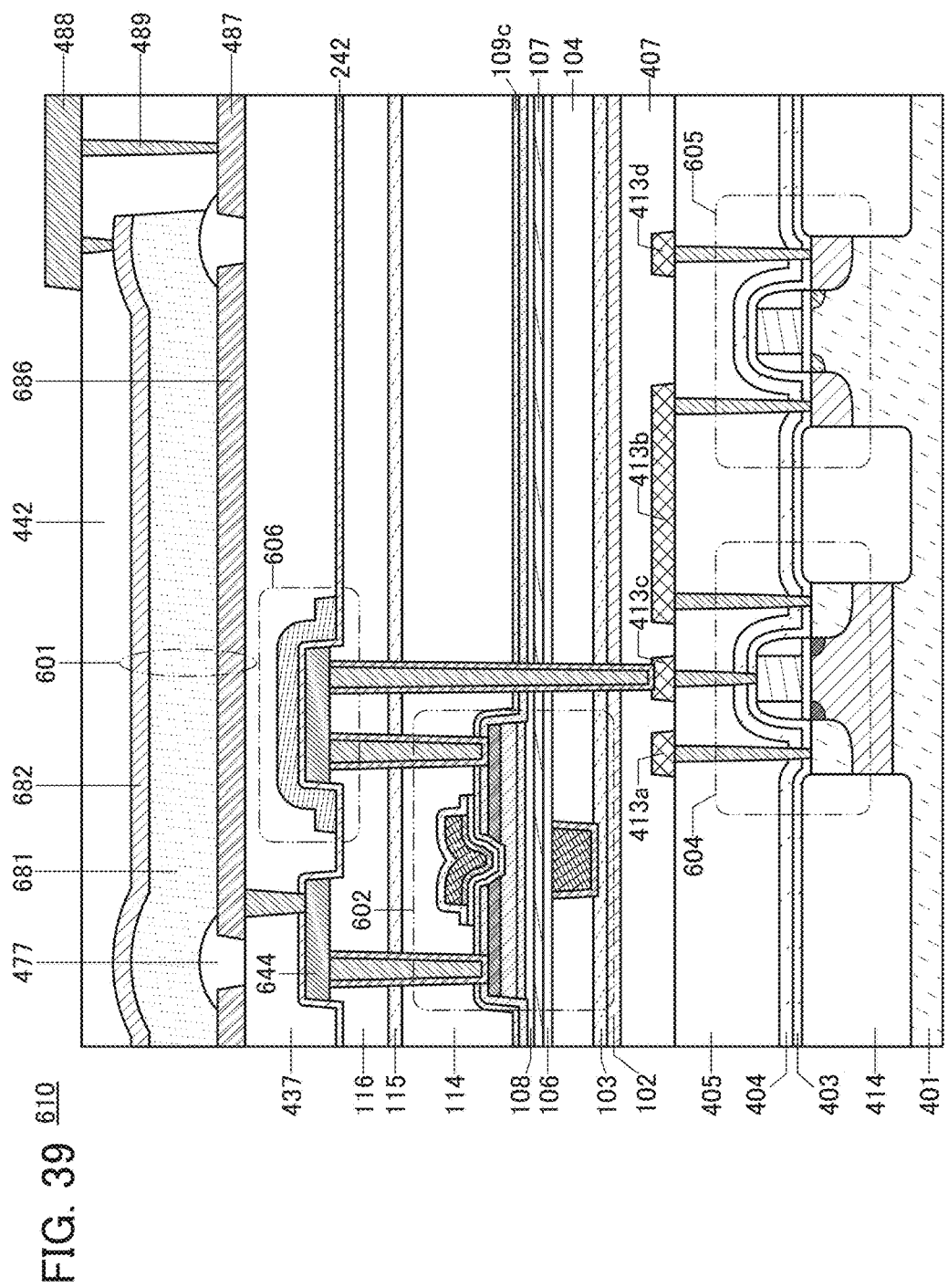
FIG. 39 illustrates a structure example of an imaging device.

FIG. 39 illustrates a structural example of the imaging device 610 which is different from that in FIG. 38.

In the imaging device 610 illustrated in FIG. 39, the transistor 604 and the transistor 605 are provided on the substrate 401. The transistor 604 can function as an n-channel transistor. The transistor 605 can function as a p-channel transistor. Note that the transistor 282 described above can be used as the transistor 604, for example. The transistor 281 described above can be used as the transistor 605, for example.

The electrode 413a, the electrode 413b, the electrode 413c, and an electrode 413d are formed over the insulating layer 405. The electrode 413a is electrically connected to one of the source and the drain of the transistor 604, and the electrode 413b is electrically connected to the other of the source and the drain of the transistor 604. The electrode 413c is electrically connected to the gate of the transistor 604. The electrode 413b is electrically connected to one of the source and the drain of the transistor 605, and the electrode 413d is electrically connected to the other of the source and the drain of the transistor 605.

In the imaging device 610 illustrated in FIG. 39, the photoelectric conversion element 601 is provided over the insulating layer 437. An insulating layer 442 is provided over the photoelectric conversion element 601, and an electrode 488 is provided over the insulating layer 442. The insulating layer 442 can be formed using a material and a method which are similar to those of the insulating layer 437.

The photoelectric conversion element 601 illustrated in FIG. 39 includes a photoelectric conversion layer 681 between an electrode 686 formed with a metal material or the like and a light-transmitting conductive layer 682. FIG. 39 illustrates the photoelectric conversion element 601 including a selenium-based material for the photoelectric conversion layer 681. The photoelectric conversion element 601 including a selenium-based material has high external quantum efficiency with respect to visible light. Moreover, the use of the photoelectric conversion element can achieve a highly sensitive sensor in which the amplification of electrons with respect to the amount of incident light is large owing to an avalanche phenomenon. Furthermore, the selenium-based material has a high light-absorption coefficient, which leads to an advantage that the photoelectric conversion layer 681 can be formed thin.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity and light-absorption coefficient for visible light than amorphous selenium.

Although the photoelectric conversion layer 681 is illustrated as a single layer, gallium oxide, cerium oxide, or the like as a hole blocking layer may be provided on the light reception side of the selenium-based material, and nickel oxide, antimony sulfide, or the like as an electron injection blocking layer may be provided on the electrode 686 side.

Furthermore, the photoelectric conversion layer 681 may be a layer including a compound of copper, indium, and selenium (CIS). Alternatively, a layer including a compound of copper, indium, gallium, and selenium (CIGS) may be used. With CIS or CIGS, a photoelectric conversion element that can utilize an avalanche phenomenon as in the case of using a single layer of selenium can be formed.

Furthermore, CIS and CIGS are p-type semiconductors, and an n-type semiconductor such as cadmium sulfide or zinc sulfide may be provided in contact with the p-type semiconductor in order to form a junction.

It is preferable to apply a relatively high voltage (e.g., 10 V or higher) to the photoelectric conversion element in order to cause the avalanche phenomenon. Since the OS transistor has higher drain withstand voltage than a Si transistor, the application of a relatively high voltage to the photoelectric conversion element is easy. Thus, by combination of the OS transistor having high drain withstand voltage and a photoelectric conversion element including the selenium-based material in the photoelectric conversion layer, a highly sensitive and highly reliable imaging device can be obtained.

For the light-transmitting conductive layer 682, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 682 is not limited to a single layer, and may be a stacked layer of different films. Although the light-transmitting conductive layer 682 and a wiring 487 are electrically connected to each other through the electrode 488 and a contact plug 489 in the structure illustrated in FIG. 39, the light-transmitting conductive layer 682 and the wiring 487 may be in direct contact with each other.

The electrode 686, the wiring 487, and the like may each have a structure in which a plurality of conductive layers are stacked. For example, the electrode 686 can include a first conductive layer and a second conductive layer and the wiring 487 can include a third conductive layer and a fourth conductive layer. For example, the first conductive layer and the third conductive layer may be made of a low-resistance metal or the like, and the second conductive layer and the fourth conductive layer may be made of a metal or the like that exhibits an excellent contact property with the photoelectric conversion layer 681. Such a structure improves the electrical properties of the photoelectric conversion element. Furthermore, even when the third conductive layer contains a metal that causes electrolytic corrosion, which occurs when some kinds of metal are in contact with the light-transmitting conductive layer 682, electrolytic corrosion can be prevented because the fourth conductive layer is placed between the third conductive layer and the light-transmitting conductive layer 682.

The second conductive layer and the fourth conductive layer can be formed using, for example, molybdenum, tungsten, or the like. The first conductive layer and the third conductive layer can be formed using, for example, aluminum, titanium, or a stack of titanium, aluminum, and titanium that are layered in that order.

The insulating layer 442 may be a multilayer. Note that a partition wall 477 can be formed using an inorganic insulator, an insulating organic resin, or the like. The partition wall 477 may be colored black or the like in order to shield the transistors and the like from light and/or to determine the area of a light-receiving portion in each pixel.

Alternatively, a PIN diode element or the like formed using an amorphous silicon film, a microcrystalline silicon film, or the like may be used as the photoelectric conversion element 601. In the photodiode, an n-type semiconductor layer, an i-type semiconductor layer, and a p-type semiconductor layer are stacked in that order. The i-type semiconductor layer is preferably formed using amorphous silicon. The p-type semiconductor layer and the n-type semiconductor layer can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

Note that a PN or PIN diode element is preferably provided such that the p-type semiconductor layer serves as a light-receiving surface, in which case the output current of the photoelectric conversion element 601 can be increased.

The photoelectric conversion element 601 formed using the selenium-based material, amorphous silicon, or the like can be formed through general semiconductor manufacturing processes such as a deposition process, a lithography process, and an etching process This embodiment can be implemented in appropriate combination with any of the structures described in the other embodiments and the like.

(Embodiment 5)

In this embodiment, an RF tag will be described as an example of a semiconductor device including any of the transistors disclosed in this specification and the like.

<RF Tag>

The RF tag of one embodiment of the present invention includes a memory circuit (a memory device), stores data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have high reliability in order to be used for this purpose.

Figure 40:
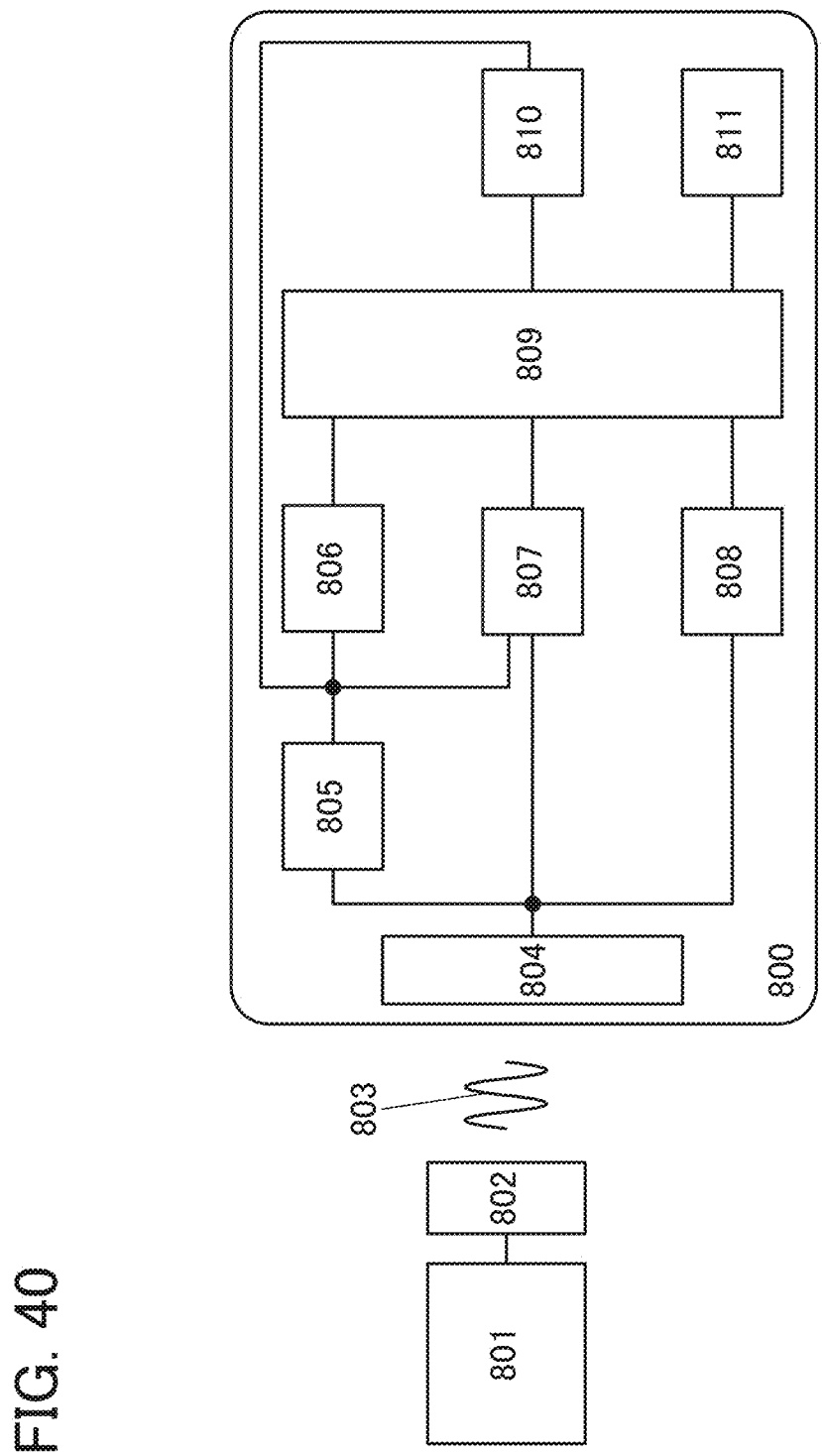
FIG. 40 is a block diagram of an RF tag of one embodiment of the present invention.
Figure 41A:
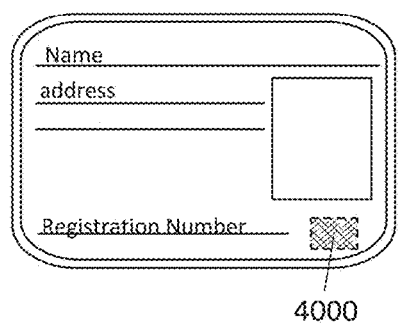
FIGS. 41A to 41F illustrate usage examples of an RF tag of one embodiment of the present invention.
Figure 41B:
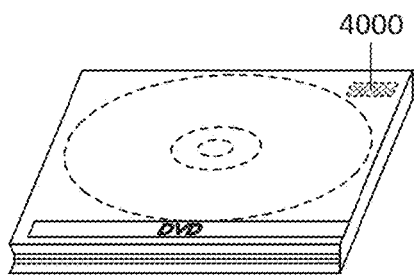
Figure 41C:
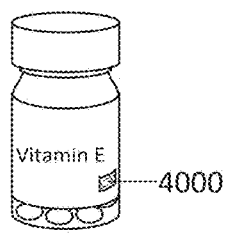
Figure 41D:
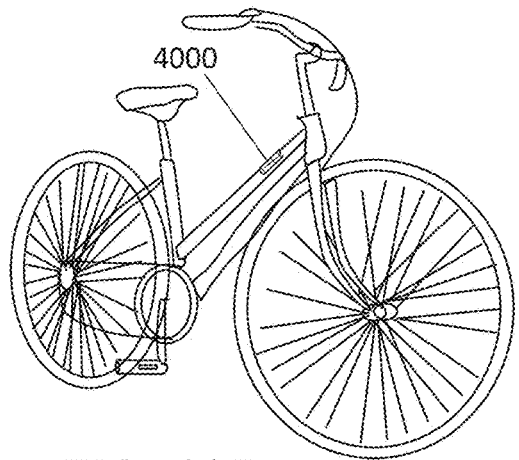
Figure 41E:
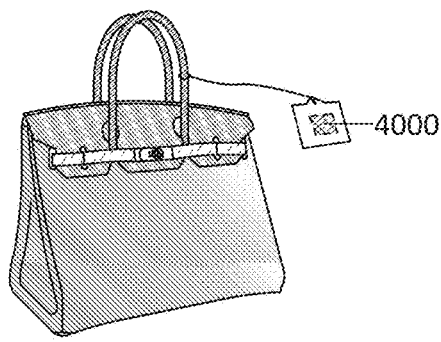
Figure 41F:
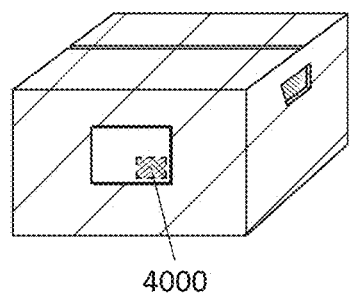

A configuration of the RF tag will be described with reference to FIG. 40. FIG. 40 is a block diagram illustrating a configuration example of an RF tag.

As shown in FIG. 40, an RF tag 800 includes an antenna 804 which receives a radio signal 803 that is transmitted from an antenna 802 connected to a communication device 801 (also referred to as an interrogator, a reader/writer, or the like). Any of the above-described transistors may be used in the communication device 801. The RF tag 800 includes a rectifier circuit 805, a constant voltage circuit 806, a demodulation circuit 807, a modulation circuit 808, a logic circuit 809, a memory circuit 810, and a ROM 811. A semiconductor of a transistor having a rectifying function included in the demodulation circuit 807 may be a material which enables a reverse current to be low enough, for example, an oxide semiconductor. This can suppress the phenomenon of a rectifying function becoming weaker due to generation of reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Furthermore, the ROM 811 stores an identification number (ID) or the like and outputs it in accordance with processing.

Note that the decision whether each circuit described above is provided or not can be made as appropriate.

The memory device described above can be used as the memory circuit 810. Since the memory device of one embodiment of the present invention can retain data even when not powered, the memory circuit can be favorably used for an RF tag. Furthermore, the memory device of one embodiment of the present invention needs less power (voltage) for data writing than a conventional nonvolatile memory; thus, it is possible to prevent a difference between the maximum communication range in data reading and that in data writing. In addition, it is possible to suppress a malfunction or incorrect writing which is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

Application examples of an RF tag of one embodiment of the present invention will be described with reference to FIGS. 41A to 41F. The RF tag is widely used and can be provided for, for example, products, e.g., bills, coins, securities, bearer bonds, documents such as driver's licenses or resident's cards (see FIG. 41A), recording media such as DVD software or video tapes (see FIG. 41B), containers such as plates, cups, or bottles (see FIG. 41C), packaging containers such as wrapping paper, boxes, or ribbon, moving objects such as bicycles (see FIG. 41D), personal belongings such as bags or glasses, plants, animals, human bodies, clothing, household goods, medical supplies such as medicine and chemicals, and electronic devices (e.g., liquid crystal display devices, EL display devices, television sets, or cellular phones), or tags on products (see FIGS. 41E and 41F).

The RF tag 800 of one embodiment of the present invention is fixed to a product by being attached to a surface thereof or embedded therein. For example, the RF tag 800 is fixed to each product by being embedded in paper of a book, or embedded in an organic resin of a package. Since the RF tag 800 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 800 of one embodiment of the present invention, and the identification function can be utilized to prevent counterfeiting. Moreover, the efficiency of a system such as an inspection system can be improved by providing the RF tag 800 of one embodiment of the present invention for packaging containers, recording media, personal belongings, clothing, household goods, electronic devices, or the like. Moving objects can also have higher security against theft or the like by being provided with the RF tag 800 of one embodiment of the present invention. As described above, the RF tag 800 of one embodiment of the present invention can be used for each application described above.

This embodiment can be implemented in appropriate combination with any of the structures described in the other embodiments.

(Embodiment 6)

In this embodiment, examples of an electronic device that uses the semiconductor device of one embodiment of the present invention will be described.

Specific examples of the electronic device that uses the semiconductor device of one embodiment of the present invention are as follows: display devices of televisions, monitors, and the like, lighting devices, desktop and laptop personal computers, word processors, image reproduction devices that reproduce still images and moving images stored in recording media such as digital versatile discs (DVDs), portable CD players, radios, tape recorders, headphone stereos, stereos, table clocks, wall clocks, cordless phone handsets, transceivers, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Further examples include the following industrial equipment: guide lights, traffic lights, belt conveyors, elevators, escalators, industrial robots, power storage systems, and power storage devices for leveling the amount of power supply and smart grid. In addition, moving objects and the like driven by fuel engines and electric motors using power from power storage units, and the like may also be included in the range of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like.

Figure 42A:
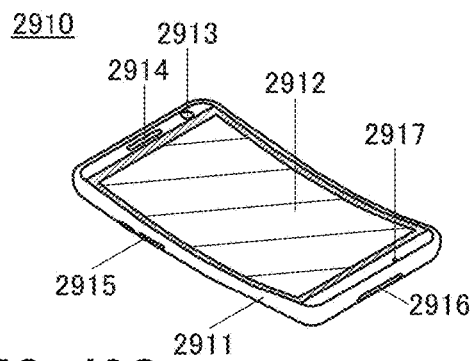
FIGS. 42A to 42G each illustrate an electronic device of one embodiment of the present invention.

An information terminal 2910 illustrated in FIG. 42A includes a housing 2911, a display portion 2912, a microphone 2917, a speaker portion 2914, a camera 2913, an external connection portion 2916, an operation button 2915, and the like. A display panel and a touch screen that use a flexible substrate are provided in the display portion 2912. The information terminal 2910 can be used as, for example, a smartphone, a mobile phone, a tablet information terminal, a tablet personal computer, or an e-book reader.

Figure 42B:
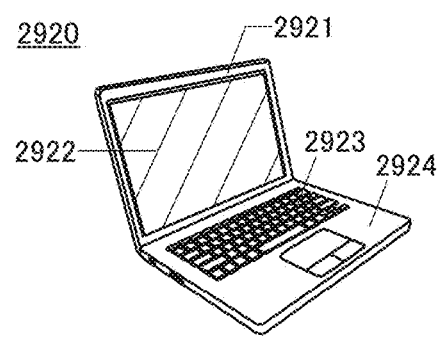

A notebook personal computer 2920 illustrated in FIG. 42B includes a housing 2921, a display portion 2922, a keyboard 2923, a pointing device 2924, and the like.

Figure 42C:
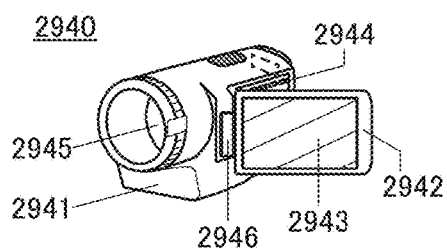

A video camera 2940 illustrated in FIG. 42C includes a housing 2941, a housing 2942, a display portion 2943, operation keys 2944, a lens 2945, a joint 2946, and the like. The operation keys 2944 and the lens 2945 are provided for the housing 2941, and the display portion 2943 is provided for the housing 2942. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image may be switched depending on the angle between the housings 2941 and 2942.

Figure 42D:
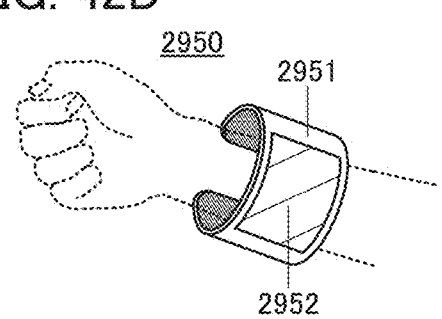

FIG. 42D illustrates an example of a bangle-type information terminal. An information terminal 2950 includes a housing 2951, a display portion 2952, and the like. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 42E:
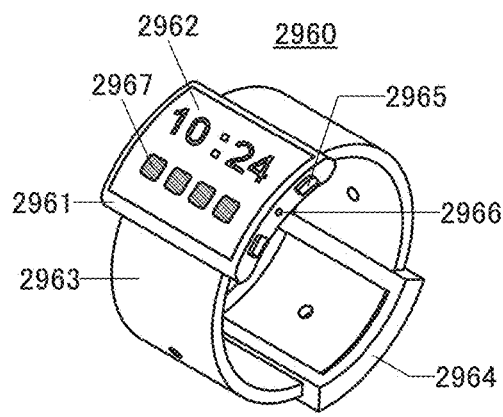

FIG. 42E illustrates an example of a watch-type information terminal. An information terminal 2960 includes a housing 2961, a display portion 2962, a band 2963, a buckle 2964, an operation button 2965, an input/output terminal 2966, and the like. The information terminal 2960 is capable of executing a variety of applications such as mobile phone calls, e-mailing, text viewing and editing, music reproduction, Internet communication, and computer games.

The display surface of the display portion 2962 is bent, and images can be displayed on the bent display surface. Furthermore, the display portion 2962 includes a touch sensor, and operation can be performed by touching the screen with a finger, a stylus, or the like. For example, an application can be started by touching an icon 2967 displayed on the display portion 2962. With the operation button 2965, a variety of functions such as time setting, ON/OFF of the power, ON/OFF of wireless communication, setting and cancellation of a silent mode, and setting and cancellation of a power saving mode can be performed. For example, the functions of the operation button 2965 can be set by setting the operating system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is possible. Note that the charging operation may be performed by wireless power feeding without using the input/output terminal 2966.

Figure 42F:
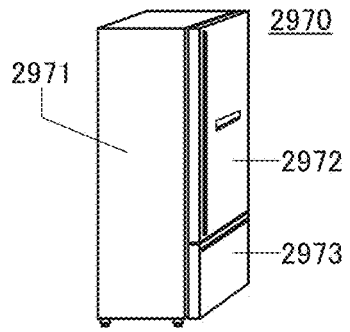

FIG. 42F illustrates an electric refrigerator-freezer as an example of a home electric device. An electric refrigerator-freezer 2970 includes a housing 2971, a refrigerator door 2972, a freezer door 2973, and the like.

Figure 42G:
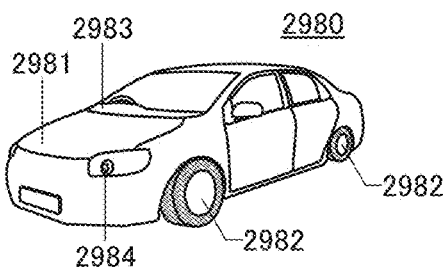

FIG. 42G is an external view illustrating an example of a car. A car 2980 includes a car body 2981, wheels 2982, a dashboard 2983, lights 2984, and the like.

The electronic devices described in this embodiment include any of the above-described transistors, semiconductor devices, or the like.

This embodiment can be implemented in appropriate combinations with any of the other embodiments.

(Embodiment 7)

In this embodiment, a deposition apparatus (a sputtering apparatus) including a deposition chamber in which a sputtering target can be placed will be described below. The deposition apparatus described in this embodiment can be used as a parallel-plate-type sputtering apparatus, a facing-targets sputtering apparatus, or the like.

Deposition using a facing-targets sputtering apparatus causes less damage to a formation surface and thus facilitates the formation of a film with high crystallinity. For this reason, a facing-targets sputtering apparatus is preferably used for the deposition of the CAAC-OS or the like in some cases.

Note that deposition using a parallel-plate-type sputtering apparatus can also be referred to as parallel electrode sputtering (PESP), and deposition using a facing-targets sputtering apparatus can also be referred to as vapor deposition sputtering (VDSP).

First, a structure of a deposition apparatus that hardly allows the entry of impurities into a film during deposition or the like will be described with reference to FIG. 43 and FIGS. 44A to 44C.

Figure 43:
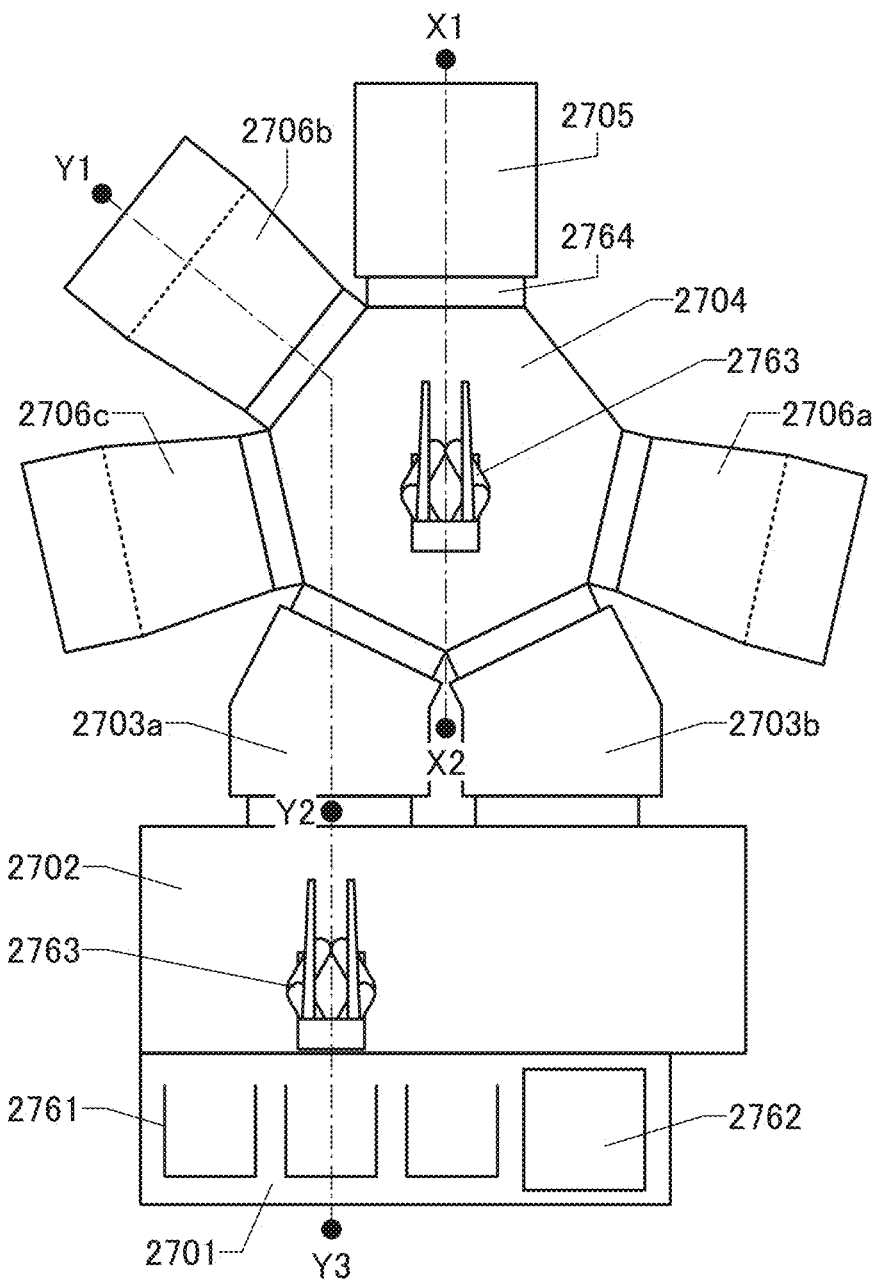
FIG. 43 illustrates an example of a deposition apparatus.

FIG. 43 is a schematic top view of a single wafer multi-chamber deposition apparatus 2700. The deposition apparatus 2700 includes an atmosphere-side substrate supply chamber 2701 including a cassette port 2761 for storing substrates and an alignment port 2762 for performing alignment of substrates, an atmosphere-side substrate transfer chamber 2702 through which a substrate is transferred from the atmosphere-side substrate supply chamber 2701, a load lock chamber 2703a where a substrate is carried in and the pressure is switched from atmospheric pressure to reduced pressure or from reduced pressure to atmospheric pressure, an unload lock chamber 2703b where a substrate is carried out and the pressure is switched from reduced pressure to atmospheric pressure or from atmospheric pressure to reduced pressure, a transfer chamber 2704 where a substrate is transferred in a vacuum, a substrate heating chamber 2705 where a substrate is heated, and deposition chambers 2706a, 2706b, and 2706c in each of which a target is placed for deposition. Note that for the deposition chambers 2706a, 2706b, and 2706c, the structure of a deposition chamber which will be described later can be referred to.

The atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the substrate heating chamber 2705 and the deposition chambers 2706a, 2706b, and 2706c.

Note that gate valves 2764 are provided in connecting portions between the chambers so that each chamber excluding the atmosphere-side substrate supply chamber 2701 and the atmosphere-side substrate transfer chamber 2702 can be independently kept in a vacuum state. In each of the atmosphere-side substrate transfer chamber 2702 and the transfer chamber 2704, a transfer robot 2763 is provided, which is capable of transferring substrates.

It is preferable that the substrate heating chamber 2705 also serve as a plasma treatment chamber. In the deposition apparatus 2700, substrates can be transferred without being exposed to the air between treatments, and adsorption of impurities to substrates can be suppressed. In addition, the order of deposition, heat treatment, or the like can be freely determined. Note that the number of transfer chambers, the number of deposition chambers, the number of load lock chambers, the number of unload lock chambers, and the number of substrate heating chambers are not limited to the above, and the numbers thereof can be set as appropriate depending on the space for installation or the process conditions.

Figure 44A:
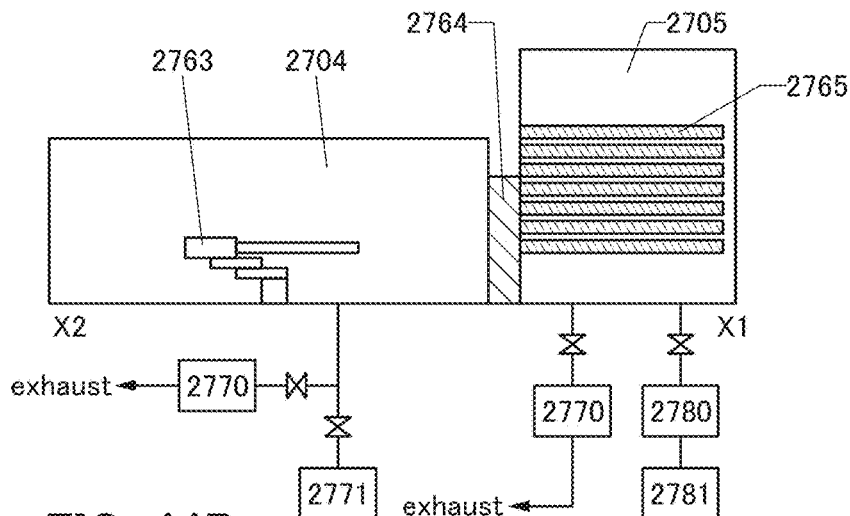
FIGS. 44A to 44C illustrate examples of a deposition apparatus.
Figure 44B:
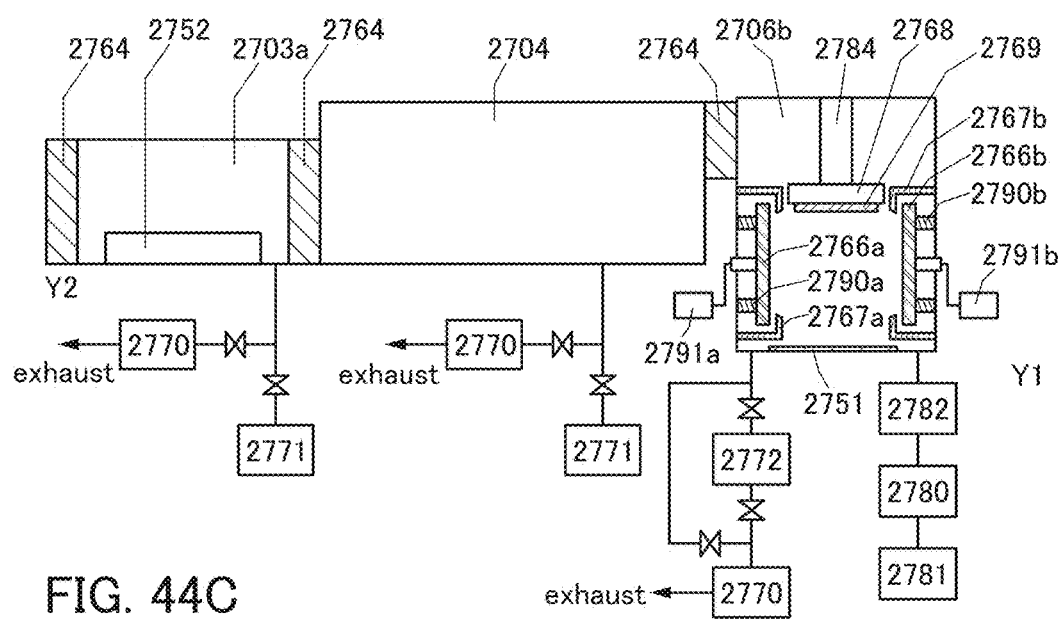
Figure 44C:
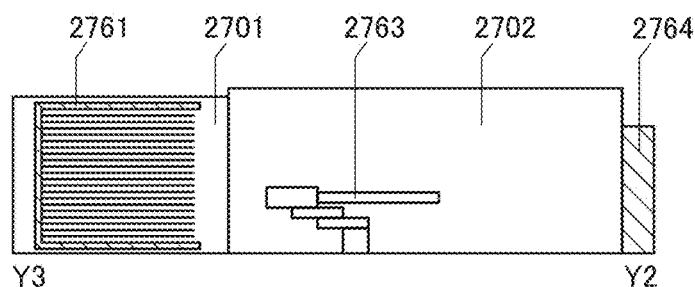

Next, FIG. 44A, FIG. 44B, and FIG. 44C are a cross-sectional view taken along dashed-dotted line X1-X2, a cross-sectional view taken along dashed-dotted line Y1-Y2, and a cross-sectional view taken along dashed-dotted line Y2-Y3, respectively, in the deposition apparatus 2700 illustrated in FIG. 43.

FIG. 44A illustrates a cross section of the substrate heating chamber 2705 and the transfer chamber 2704, and the substrate heating chamber 2705 includes a plurality of heating stages 2765 which can hold a substrate. Note that the substrate heating chamber 2705 is connected to a vacuum pump 2770 through a valve. As the vacuum pump 2770, a dry pump and a mechanical booster pump can be used, for example.

As a heating mechanism which can be used for the substrate heating chamber 2705, a resistance heater may be used for heating, for example. Alternatively, heat conduction or heat radiation from a medium such as a heated gas may be used as the heating mechanism. For example, rapid thermal annealing (RTA) such as gas rapid thermal annealing (GRTA) or lamp rapid thermal annealing (LRTA) can be used. The LRTA is a method for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA, heat treatment is performed using a high-temperature gas. An inert gas is used as the gas.

Moreover, the substrate heating chamber 2705 is connected to a refiner 2781 through a mass flow controller 2780. Note that although the mass flow controller 2780 and the refiner 2781 can be provided for each of a plurality of kinds of gases, only one mass flow controller 2780 and one refiner 2781 are provided for easy understanding. As the gas introduced to the substrate heating chamber 2705, a gas whose dew point is −80° C. or lower, preferably −100° C. or lower can be used; for example, an oxygen gas, a nitrogen gas, and a rare gas (e.g., an argon gas) are used.

The transfer chamber 2704 includes the transfer robot 2763. The transfer robot 2763 can transfer a substrate to each chamber. Furthermore, the transfer chamber 2704 is connected to the vacuum pump 2770 and a cryopump 2771 through valves. Owing to such a structure, exhaust is performed using the vacuum pump 2770 from the atmospheric pressure to low or medium vacuum (approximately 0.1 Pa to several hundred pascals) and then the valves are switched and exhaust is performed using the cryopump 2771 from the medium vacuum to high or ultra-high vacuum (approximately 0.1 Pa to $1\times10^{-7}$ Pa).

Alternatively, two or more cryopumps 2771 may be connected in parallel to the transfer chamber 2704. With such a structure, even when one of the cryopumps is in regeneration, exhaust can be performed using any of the other cryopumps. Note that the above regeneration refers to treatment for discharging molecules (or atoms) entrapped in the cryopump. When molecules (or atoms) are entrapped too much in a cryopump, the exhaust capability of the cryopump is lowered; therefore, regeneration is performed regularly.

FIG. 44B illustrates a cross section of the deposition chamber 2706b, the transfer chamber 2704, and the load lock chamber 2703a.

Figure 45A:
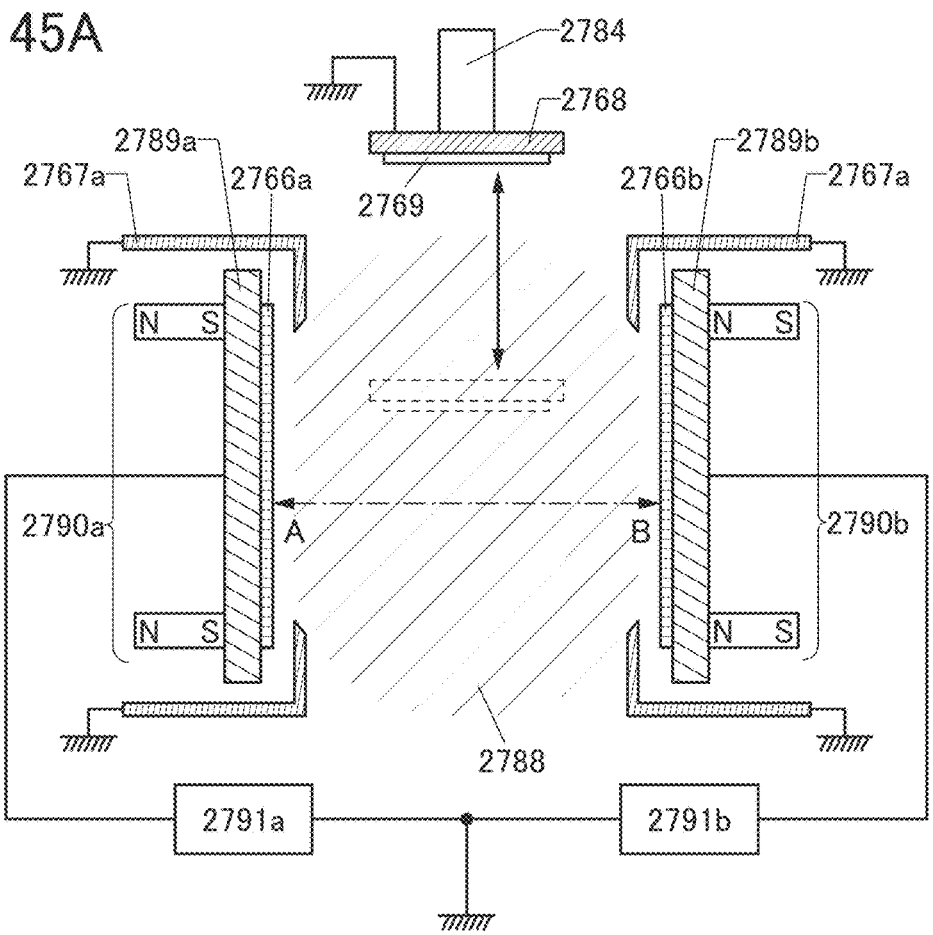
FIGS. 45A to 45C illustrate an example of a deposition apparatus.

Here, the details of the deposition chamber (sputtering chamber) are described with reference to FIG. 44B and FIGS. 45A to 45C. FIG. 45A illustrates the inside of the deposition chamber 2706b. The deposition chamber 2706b includes a target 2766a, a target 2766b, a target shield 2767a, a target shield 2767b, a magnet unit 2790a, a magnet unit 2790b, a substrate holder 2768, a power source 2791a, and a power source 2791b. The target 2766a is provided over a backing plate 2789a (not illustrated in FIG. 44B). The target 2766b is provided over a backing plate 2789b (not illustrated in FIG. 44B). The power source 2791 is electrically connected to each of the target 2766a and the target 2766b. The magnet unit 2790a is provided on a back side of the target 2766a with the backing plate 2789a positioned therebetween. The magnet unit 2790b is provided on a back side of the target 2766b with the backing plate 2789b positioned therebetween. The target shield 2767a is provided so as to surround an end portion of the target 2766a and the target shield 2767b is provided so as to surround an end portion of target 2766b.

As the power sources 2791a and 2791b, an RF power source, a DC power source, an AC power source, or the like can be used. The power sources 2791a and 2791b may be different kinds of power sources.

Figure 45B:
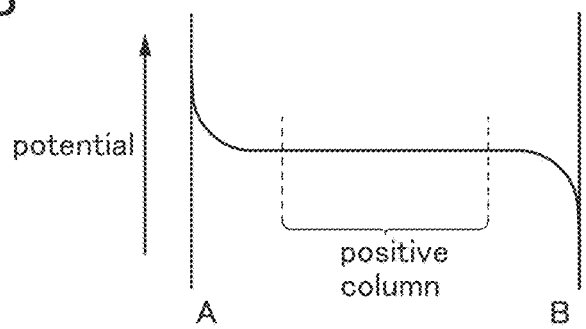
Figure 45C:
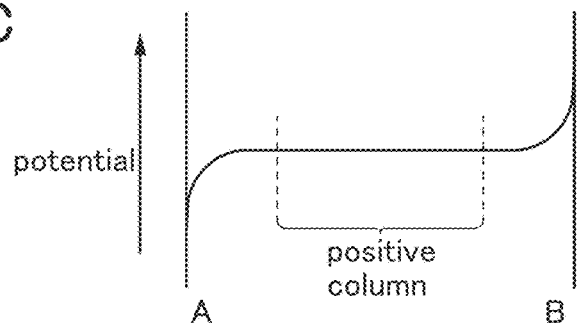

FIGS. 45B and 45C each show potential distribution of the plasma 2788 along dashed-dotted line A-B in FIG. 45A. FIG. 45B shows the potential distribution in the case where a high potential is applied to the backing plate 2789a and a low potential is applied to the backing plate 2789b. In that case, a cation is accelerated toward the target 2766b. FIG.

45C shows the potential distribution in the case where a low potential is applied to the backing plate 2789a and a high potential is applied to the backing plate 2789b. In that case, a cation is accelerated toward the target 2766a. To deposit the oxide semiconductor of one embodiment of the present invention, the state in FIG. 45B and the state in FIG. 45C are alternated.

Note that a substrate 2769 is supported by the substrate holder 2768. The substrate holder 2768 is preferably connected to GND. The substrate holder 2768 may be in a floating state. The substrate holder 2768 is fixed to the deposition chamber 2706b by an movable member 2784. Owing to the movable member 2784, the substrate holder 2768 can move to a region between the targets 2766a and 2766b (a region between targets).

Providing the substrate holder 2768 supporting the substrate 2769 in the region between targets can reduce damage due to plasma in some cases, for example. It is particularly preferable that the substrate holder 2768 and the substrate 2769 be placed in a positive column of the plasma 2788. The positive column of the plasma 2788 is, in each of FIGS. 45B and 45C, a region around the midpoint of A and B where the gradient of the potential distribution is small. When the substrate 2769 is placed in the positive column of the plasma 2788, the substrate 2769 is not exposed to a high electric field portion in the plasma 2788; thus, damage to the plasma 2788 can be reduced.

The substrate holder 2768 and the substrate 2769 may be placed outside the plasma 2788. In that case, the surface of the substrate 2769 is not exposed to a high electric field region of the plasma 2788, leading to a reduction in damage due to the plasma 2788. Note that the utilization efficiencies of the targets 2766a and 2766b are decreased as the distance between the plasma 2788 and the substrate 2769 is increased.

The substrate holder 2768 may include a substrate holding mechanism which holds the substrate 2769, a heater which heats the substrate 2769 from the back side, or the like.

The target shields 2767 can suppress deposition of a particle which is sputtered from the target 2766 on a region where deposition is not needed. Moreover, the target shields 2767 are preferably processed to prevent accumulated sputtered particles from being separated. For example, blasting treatment which increases surface roughness may be performed, or roughness may be formed on the surfaces of the target shields 2767.

The deposition chamber 2706b is connected to the mass flow controller 2780 through a gas heating mechanism 2782, and the gas heating mechanism 2782 is connected to the refiner 2781 through the mass flow controller 2780. With the gas heating mechanism 2782, a gas which is introduced to the deposition chamber 2706b can be heated to a temperature higher than or equal to 40° C. and lower than or equal to 400° C., preferably higher than or equal to 50° C. and lower than or equal to 200° C. Note that although the gas heating mechanism 2782, the mass flow controller 2780, and the refiner 2781 can be provided for each of a plurality of kinds of gases, only one gas heating mechanism 2782, one mass flow controller 2780, and one refiner 2781 are provided for easy understanding. As the gas introduced to the deposition chamber 2706b, a gas whose dew point is −80° C. or lower, preferably −100° C. or lower can be used; for example, an oxygen gas, a nitrogen gas, and a rare gas (e.g., an argon gas) are used.

In the case where the refiner is provided near a gas inlet, the length of a pipe between the refiner and the deposition chamber 2706b is less than or equal to 10 m, preferably less than or equal to 5 m, further preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with iron fluoride, aluminum oxide, chromium oxide, or the like can be used. With the above pipe, the amount of released gas containing impurities is made small and the entry of impurities into the gas can be reduced as compared with a SUS316L-EP pipe, for example. Furthermore, a high-performance ultra-compact metal gasket joint (UPG joint) may be used as a joint of the pipe. A structure where all the materials of the pipe are metals is preferable because the effect of the generated released gas or the external leakage can be reduced as compared with a structure where a resin or the like is used.

The deposition chamber 2706b is connected to a turbo molecular pump 2772 and the vacuum pump 2770 through valves.

In addition, the deposition chamber 2706b is provided with a cryotrap 2751.

The cryotrap 2751 is a mechanism which can adsorb a molecule (or an atom) having a relatively high melting point, such as water. The turbo molecular pump 2772 is capable of stably removing a large-sized molecule (or atom), needs low frequency of maintenance, and thus enables high productivity, whereas it has a low capability in removing hydrogen and water. Hence, the cryotrap 2751 is connected to the deposition chamber 2706b so as to have a high capability in removing water or the like. The temperature of a refrigerator of the cryotrap 2751 is set to be lower than or equal to 100 K, preferably lower than or equal to 80 K. In the case where the cryotrap 2751 includes a plurality of refrigerators, it is preferable to set the temperatures of the refrigerators at different temperatures because efficient exhaust is possible. For example, the temperature of a first-stage refrigerator may be set to be lower than or equal to 100 K and the temperature of a second-stage refrigerator may be set to be lower than or equal to 20 K. Note that when a titanium sublimation pump is used instead of the cryotrap, a higher vacuum can be achieved in some cases. Using an ion pump instead of a cryopump or a turbo molecular pump can also achieve higher vacuum in some cases.

Note that the exhaust method of the deposition chamber 2706b is not limited to the above, and a structure similar to that in the exhaust method described above for the transfer chamber 2704 (the exhaust method using the cryopump and the vacuum pump) may be employed. Needless to say, the exhaust method of the transfer chamber 2704 may have a structure similar to that of the deposition chamber 2706b (the exhaust method using the turbo molecular pump and the vacuum pump).

Note that in each of the transfer chamber 2704, the substrate heating chamber 2705, and the deposition chamber 2706b which are described above, the back pressure (total pressure) and the partial pressure of each gas molecule (atom) are preferably set as follows. In particular, the back pressure and the partial pressure of each gas molecule (atom) in the deposition chamber 2706b need to be noted because impurities might enter a film to be formed.

In each of the above chambers, the back pressure (total pressure) is less than or equal to $1\times10^{-4}$ Pa, preferably less than or equal to $3\times10^{-5}$ Pa, further preferably less than or equal to $1\times10^{-5}$ Pa. In each of the above chambers, the partial pressure of a gas molecule (atom) having a mass-to-charge ratio (m/z) of 18 is less than or equal to $3\times10^{-5}$ Pa, preferably less than or equal to $1\times10^{-5}$ Pa, further preferably less than or equal to $3\times10^{-6}$ Pa. Moreover, in each of the above chambers, the partial pressure of a gas molecule (atom) having a mass-to-charge ratio (m/z) of 28 is less than or equal to $3\times10^{-5}$ Pa, preferably less than or equal to $1\times10^{-5}$ Pa, further preferably less than or equal to $3\times10^{-6}$ Pa. Furthermore, in each of the above chambers, the partial pressure of a gas molecule (atom) having a mass-to-charge ratio (m/z) of 44 is less than or equal to $3\times10^{-5}$ Pa, preferably less than or equal to $1\times10^{-5}$ Pa, further preferably less than or equal to $3\times10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. may be used.

Moreover, the transfer chamber 2704, the substrate heating chamber 2705, and the deposition chamber 2706b which are described above preferably have a small amount of external leakage or internal leakage.

For example, in each of the transfer chamber 2704, the substrate heating chamber 2705, and the deposition chamber 2706b which are described above, the leakage rate is less than or equal to $3\times10^{-6}$ Pa·m$^3$/s, preferably less than or equal to $1\times10^{-6}$ Pa·m$^3$/s. The leakage rate of a gas molecule (atom) having a mass-to-charge ratio (m/z) of 18 is less than or equal to $1\times10^{-7}$ Pa·m$^3$/s, preferably less than or equal to $3\times10^{-8}$ Pa·m$^3$/s. The leakage rate of a gas molecule (atom) having a mass-to-charge ratio (m/z) of 28 is less than or equal to $1\times10^{-5}$ Pa·m$^3$/s, preferably less than or equal to $1\times10^{-6}$ Pa·m$^3$/s. The leakage rate of a gas molecule (atom) having a mass-to-charge ratio (m/z) of 44 is less than or equal to $3\times10^{-6}$ Pa·m$^3$/s, preferably less than or equal to $1\times10^{-6}$ Pa·m$^3$/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate can be set to be less than or equal to the above value.

For example, an open/close portion of the deposition chamber 2706b can be sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the deposition apparatus 2700, aluminum, chromium, titanium, zirconium, nickel, or vanadium, which releases a smaller amount of gas containing impurities, is used. Alternatively, for the above member, an alloy containing iron, chromium, nickel, and the like covered with the above material may be used. The alloy containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the deposition apparatus 2700 may be covered with iron fluoride, aluminum oxide, chromium oxide, or the like.

The member of the deposition apparatus 2700 is preferably formed using only metal when possible. For example, in the case where a viewing window formed with quartz or the like is provided, it is preferable that the surface of the viewing window be thinly covered with iron fluoride, aluminum oxide, chromium oxide, or the like so as to suppress release of gas.

When an adsorbed substance is present in the deposition chamber, the adsorbed substance does not affect the pressure in the deposition chamber because it is adsorbed onto an inner wall or the like; however, the adsorbed substance causes gas to be released when the inside of the deposition chamber is evacuated. Therefore, although there is no correlation between the leakage rate and the exhaust rate, it is important that the adsorbed substance present in the deposition chamber be desorbed as much as possible and exhaust be performed in advance with the use of a pump with high exhaust capability. Note that the deposition chamber may be subjected to baking to promote desorption of the adsorbed substance. By the baking, the desorption rate of the adsorbed substance can be increased about tenfold. The baking can be performed at a temperature in the range of 100° C. to 450° C. At this time, when the adsorbed substance is removed while an inert gas is introduced to the deposition chamber, the desorption rate of water or the like, which is difficult to desorb simply by exhaust, can be further increased. Note that when the inert gas which is introduced is heated to substantially the same temperature as the baking temperature, the desorption rate of the adsorbed substance can be further increased. Here, a rare gas is preferably used as an inert gas. Depending on the kind of a film to be deposited, oxygen or the like may be used instead of an inert gas. For example, in deposition of an oxide, the use of oxygen which is a main component of the oxide is preferable in some cases. The baking is preferably performed using a lamp.

Alternatively, treatment for evacuating the inside of the deposition chamber is preferably performed a certain period of time after heated oxygen, a heated inert gas such as a heated rare gas, or the like is introduced to increase a pressure in the deposition chamber. The introduction of the heated gas can desorb the adsorbed substance in the deposition chamber, and the impurities present in the deposition chamber can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the deposition chamber, so that the pressure therein can be kept to be greater than or equal to 0.1 Pa and less than or equal to 10 kPa, preferably greater than or equal to 1 Pa and less than or equal to 1 kPa, further preferably greater than or equal to 5 Pa and less than or equal to 100 Pa in the time range of 1 minute to 300 minutes, preferably 5 minutes to 120 minutes. After that, the inside of the deposition chamber is evacuated in the time range of 5 minutes to 300 minutes, preferably 10 minutes to 120 minutes.

The desorption rate of the adsorbed substance can be further increased also by dummy deposition. Here, the dummy deposition refers to deposition on a dummy substrate by a sputtering method or the like, in which a film is deposited on the dummy substrate and the inner wall of the deposition chamber so that impurities in the deposition chamber and an adsorbed substance on the inner wall of the deposition chamber are confined in the film. As the dummy substrate, a substrate which releases a smaller amount of gas is preferably used. By performing dummy deposition, the concentration of impurities in a film to be formed later can be reduced. Note that the dummy deposition may be performed at the same time as the baking of the deposition chamber.

Next, the details of the transfer chamber 2704 and the load lock chamber 2703a illustrated in FIG. 44B and the atmosphere-side substrate transfer chamber 2702 and the atmosphere-side substrate supply chamber 2701 illustrated in FIG. 44C are described. Note that FIG. 44C illustrates a cross section of the atmosphere-side substrate transfer chamber 2702 and the atmosphere-side substrate supply chamber 2701.

For the transfer chamber 2704 illustrated in FIG. 44B, the description of the transfer chamber 2704 illustrated in FIG. 44A can be referred to.

The load lock chamber 2703a includes a substrate delivery stage 2752. When a pressure in the load lock chamber 2703a becomes atmospheric pressure by being increased from reduced pressure, the substrate delivery stage 2752 receives a substrate from the transfer robot 2763 provided in the atmosphere-side substrate transfer chamber 2702. After that, the load lock chamber 2703a is evacuated into vacuum so that the pressure therein becomes reduced pressure and then the transfer robot 2763 provided in the transfer chamber 2704 receives the substrate from the substrate delivery stage 2752.

Furthermore, the load lock chamber 2703a is connected to the vacuum pump 2770 and the cryopump 2771 through valves. For a method for connecting exhaust systems such as the vacuum pump 2770 and the cryopump 2771, the description of the method for connecting the transfer chamber 2704 can be referred to, and the description thereof is omitted here. Note that the unload lock chamber 2703b illustrated in FIG. 43 can have a structure similar to that of the load lock chamber 2703a.

The atmosphere-side substrate transfer chamber 2702 includes the transfer robot 2763. The transfer robot 2763 can deliver a substrate from the cassette port 2761 to the load lock chamber 2703a or deliver a substrate from the load lock chamber 2703a to the cassette port 2761. Furthermore, a mechanism for suppressing entry of dust or a particle, such as a high-efficiency particulate air (HEPA) filter, may be provided above the atmosphere-side substrate transfer chamber 2702 and the atmosphere-side substrate supply chamber 2701.

The atmosphere-side substrate supply chamber 2701 includes a plurality of cassette ports 2761. The cassette port 2761 can hold a plurality of substrates.

The surface temperature of the target is set to be lower than or equal to 100° C., preferably lower than or equal to 50° C., further preferably about room temperature (typified by 25° C.). In a sputtering apparatus for a large substrate, a large target is often used. However, it is difficult to form a target for a large substrate without a juncture. In fact, a plurality of targets are arranged so that there is as little space as possible therebetween to obtain a large shape; however, a slight space is inevitably generated. When the surface temperature of the target increases, in some cases, zinc or the like is volatilized from such a slight space and the space might be expanded gradually. When the space expands, a metal of a backing plate or a metal of a bonding material used for adhesion between the backing plate and the target might be sputtered and might cause an increase in impurity concentration. Thus, it is preferable that the target be cooled sufficiently.

Specifically, to efficiently cool the target, a metal having high conductivity and a high heat dissipation property (specifically copper) is used for the backing plate, or a sufficient amount of cooling water is made to flow through a water channel formed in the backing plate.

Note that in the case where the target includes zinc, plasma damage is alleviated by the deposition in an oxygen gas atmosphere; thus, an oxide in which zinc is unlikely to be volatilized can be obtained.

The above-described deposition apparatus enables deposition of an oxide semiconductor whose hydrogen concentration measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$.

Furthermore, an oxide semiconductor whose nitrogen concentration measured by SIMS is lower than $5\times10^{19}$ atoms/cm$^3$, preferably lower than or equal to $1\times10^{19}$ atoms/cm$^3$, further preferably lower than or equal to $5\times10^{18}$ atoms/cm$^3$, still further preferably lower than or equal to $1\times10^{18}$ atoms/cm$^3$ can be deposited.

Moreover, an oxide semiconductor whose carbon concentration measured by SIMS is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ can be deposited.

Furthermore, an oxide semiconductor can be deposited in which the released amount of each of the following gas molecules (atoms) measured by thermal desorption spectroscopy (TDS) is less than or equal to $1\times10^{19}$/cm$^3$, preferably less than or equal to $1\times10^{18}$/cm$^3$: a gas molecule (atom) having a mass-to-charge ratio (m/z) of 2 (e.g., a hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

With the above deposition apparatus, entry of impurities into the oxide semiconductor can be suppressed. Furthermore, when a film in contact with the oxide semiconductor is formed with the use of the above deposition apparatus, the entry of impurities into the oxide semiconductor from the film in contact therewith can be suppressed.

This embodiment can be implemented in appropriate combination with any of the structures described in the other embodiments.

(Embodiment 8)

In this embodiment, an oxide semiconductor will be described with reference to FIGS. 48A to 48E, FIGS. 49A to 49E, FIGS. 50A to 50D, FIGS. 51A and 51B, and FIG. 52.

<Structure of Oxide Semiconductor>

The structure of an oxide semiconductor will be described below.

Oxide semiconductors are classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, oxide semiconductors are classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is an oxide semiconductor having a plurality of c-axis aligned crystal parts (also referred to as pellets).

Figure 48A:
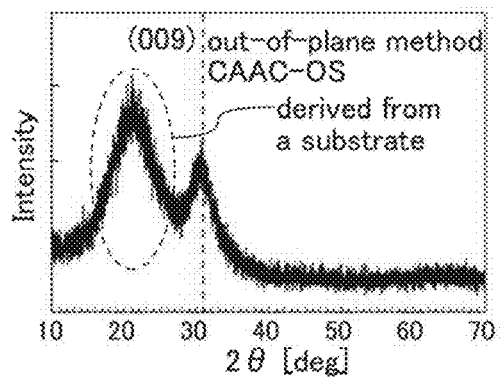
FIGS. 48A to 48E show structural analysis of a CAAC-OS and a single crystal oxide semiconductor by XRD and selected-area electron diffraction patterns of a CAAC-OS.

Analysis of a CAAC-OS by X-ray diffraction (XRD) will be described. For example, when the structure of a CAAC-OS including an InGaZnO$_4$ crystal that is classified as the space group R-3m is analyzed by an out-of-plane method, a peak appears at a diffraction angle (2θ) of around 31° as shown in FIG. 48A. This peak is derived from the (009) plane of the InGaZnO$_4$ crystal, which indicates that crystals in the CAAC-OS have c-axis alignment, and that the c-axes are aligned in the direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 48B:
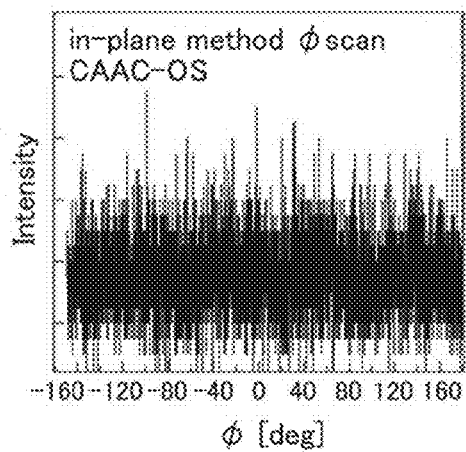
Figure 48C:
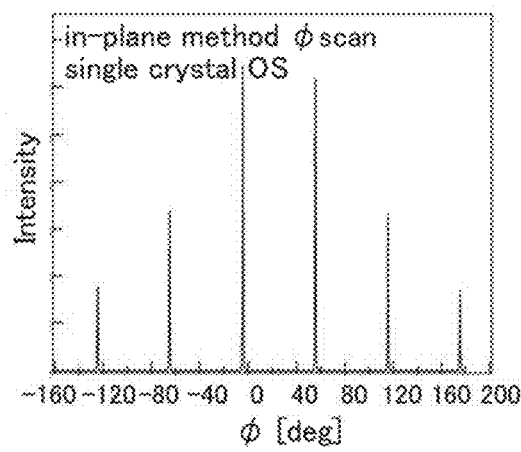

On the other hand, in structural analysis of the CAAC-OS by an in-plane method in which an X-ray is incident on the CAAC-OS in the direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), a peak is not clearly observed as shown in FIG. 48B. In contrast, in the case where single crystal InGaZnO$_4$ is subjected to φ scan with 2θ fixed at around 56°, six peaks which are derived from crystal planes equivalent to the (110) plane are observed as shown in FIG. 48C. Accordingly, the structural analysis using XRD shows that the directions of a-axes and b-axes are irregularly oriented in the CAAC-OS.

Figure 48D:
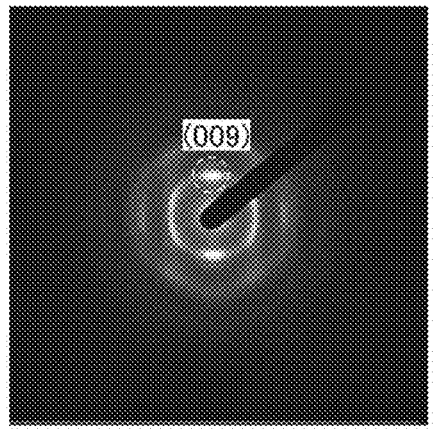
Figure 48E:
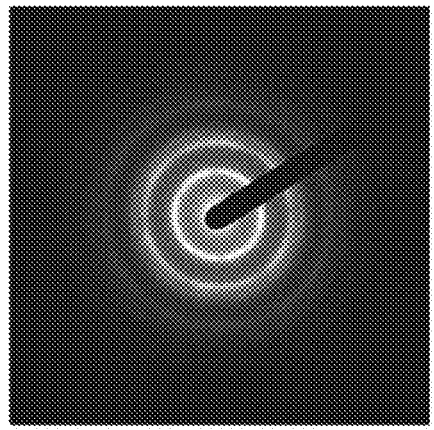

Next, a CAAC-OS analyzed by electron diffraction will be described. For example, when an electron beam with a probe diameter of 300 nm is incident on a CAAC-OS including an InGaZnO$_4$ crystal in the direction parallel to the formation surface of the CAAC-OS, such a diffraction pattern (also referred to as a selected-area transmission electron diffraction pattern) as is shown in FIG. 48D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 48E shows a diffraction pattern obtained in such a manner that an electron beam with a probe diameter of 300 nm is incident on the same sample in the direction perpendicular to the sample surface. As shown in FIG. 48E, a ring-like diffraction pattern is observed. Thus, the electron diffraction using an electron beam with a probe diameter of 300 nm also indicates that the a-axes and b-axes of the pellets included in the CAAC-OS do not have regular alignment. The first ring in FIG. 48E is considered to be derived from the (010) plane, the (100) plane, and the like of the InGaZnO$_4$ crystal. The second ring in FIG. 48E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 49A:
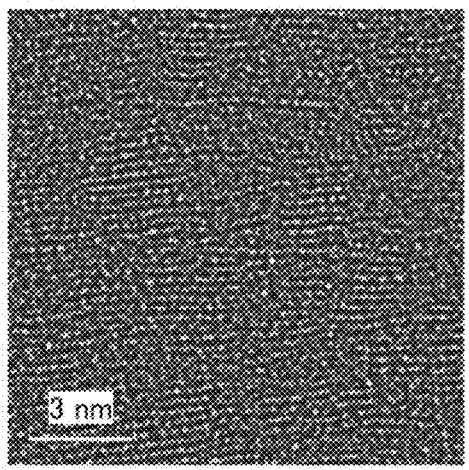
FIGS. 49A to 49E show a cross-sectional TEM image and plan-view TEM images of a CAAC-OS and images obtained through analysis thereof.

FIG. 49A shows a high-resolution TEM image of a cross section of the CAAC-OS observed from the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 49A shows pellets in which metal atoms are arranged in a layered manner. FIG. 49A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 49B:
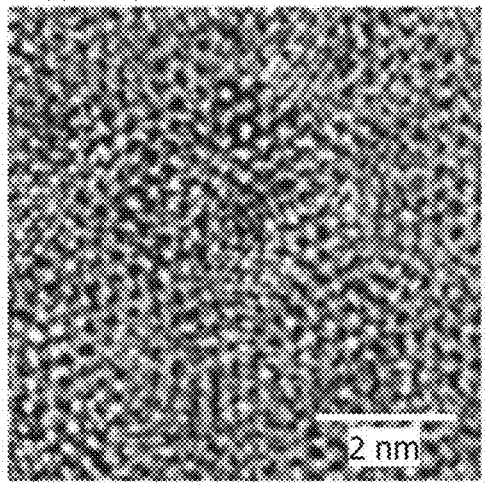
Figure 49C:
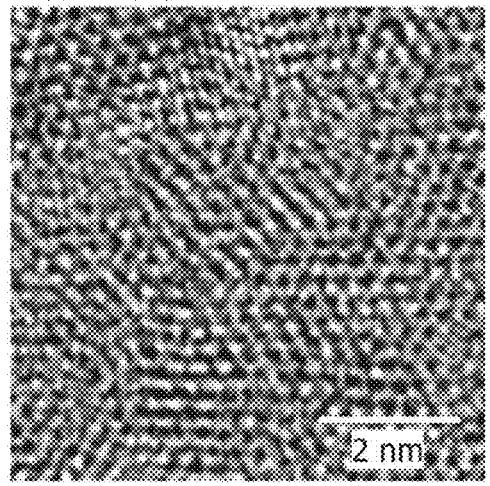
Figure 49D:
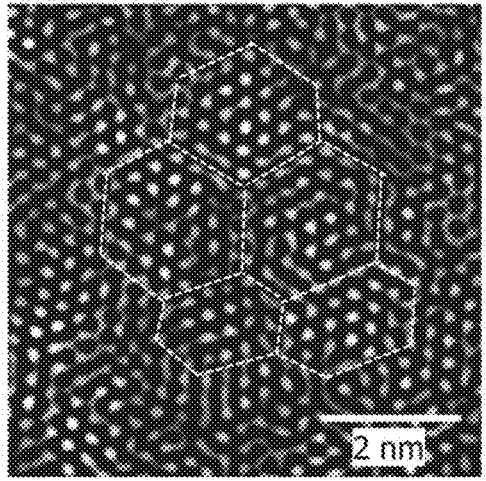
Figure 49E:
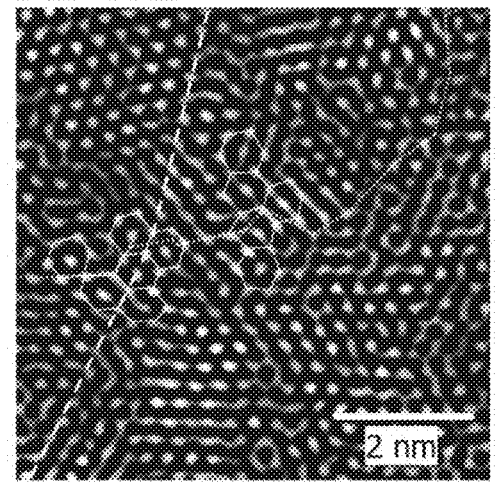

FIGS. 49B and 49C show Cs-corrected high-resolution TEM images of a plane of the CAAC-OS observed from the direction substantially perpendicular to the sample surface. FIGS. 49D and 49E are images obtained through image processing of FIGS. 49B and 49C. The method of image processing is as follows. The image in FIG. 49B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 49D, a portion where a lattice arrangement is broken is shown by dashed lines. A region surrounded by dashed lines is one pellet. The portion denoted by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 49E, a dotted line denotes a portion where the direction of a lattice arrangement changes between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of atomic arrangement in the a-b plane direction, an interatomic bond distance changed by substitution of a metal element, and the like.

As described above, the CAAC-OS has c-axis alignment, its pellets (nanocrystals) are connected in the a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, the impurity contained in the oxide semiconductor might serve as a carrier trap or serve as a carrier generation source. For example, oxygen vacancies in the oxide semiconductor might serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}$/cm$^3$, preferably lower than $1\times10^{11}$/cm$^3$, more preferably lower than $1\times10^{10}$/cm$^3$, and higher than or equal to $1\times10^{-9}$/cm$^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

Analysis of an nc-OS by XRD will be described. When the structure of an nc-OS is analyzed by an out-of-plane method, a peak indicating orientation does not appear. That is, a crystal of an nc-OS does not have orientation.

Figure 50A:
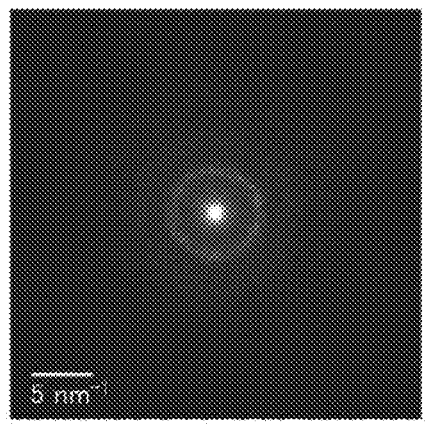
FIGS. 50A to 50D show electron diffraction patterns and a cross-sectional TEM image of an nc-OS.
Figure 50B:
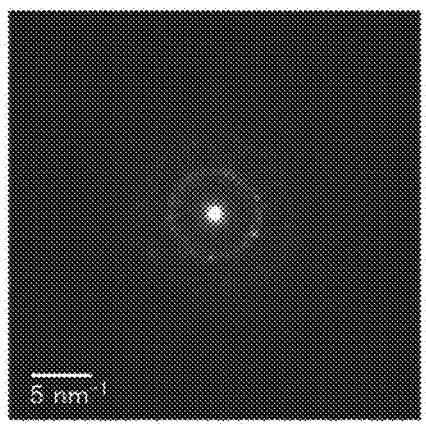

For example, when an electron beam with a probe diameter of 50 nm is incident on a 34-nm-thick region of thinned nc-OS including an InGaZnO$_4$ crystal in the direction parallel to the formation surface, a ring-shaped diffraction pattern (a nanobeam electron diffraction pattern) shown in FIG. 50A is observed. FIG. 50B shows a diffraction pattern obtained when an electron beam with a probe diameter of 1 nm is incident on the same sample. As shown in FIG. 50B, a plurality of spots are observed in a ring-like region. In other words, ordering in an nc-OS is not observed with an electron beam with a probe diameter of 50 nm but is observed with an electron beam with a probe diameter of 1 nm.

Figure 50C:
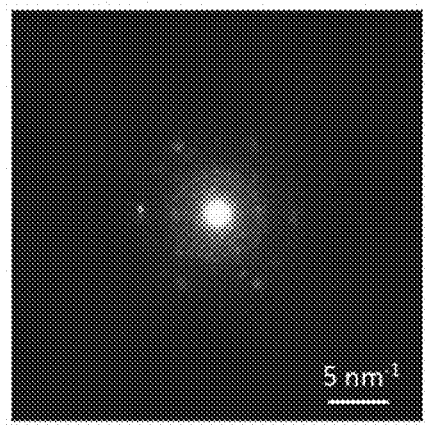

Furthermore, an electron diffraction pattern in which spots are arranged in an approximately regular hexagonal shape is observed in some cases as shown in FIG. 50C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 50D:
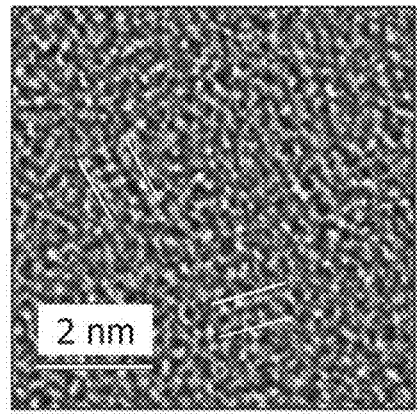

FIG. 50D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 50D, and a region in which a crystal part is not clearly observed. In most cases, the size of a crystal part included in the nc-OS is greater than or equal to 1 nm and less than or equal to 10 nm, in particular, greater than or equal to 1 nm and less than or equal to 3 nm. An oxide semiconductor including a crystal part whose size is greater than 10 nm and less than or equal to 100 nm can be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

FIGS. 51A and 51B are high-resolution cross-sectional TEM images of an a-like OS. FIG. 51A is the high-resolution cross-sectional TEM image of the a-like OS at the start of the electron irradiation. FIG. 51B is the high-resolution cross-sectional TEM image of the a-like OS after the electron (e) irradiation at $4.3 \times 10^8$ e$^-$/nm$^2$. FIGS. 51A and 51B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 52:
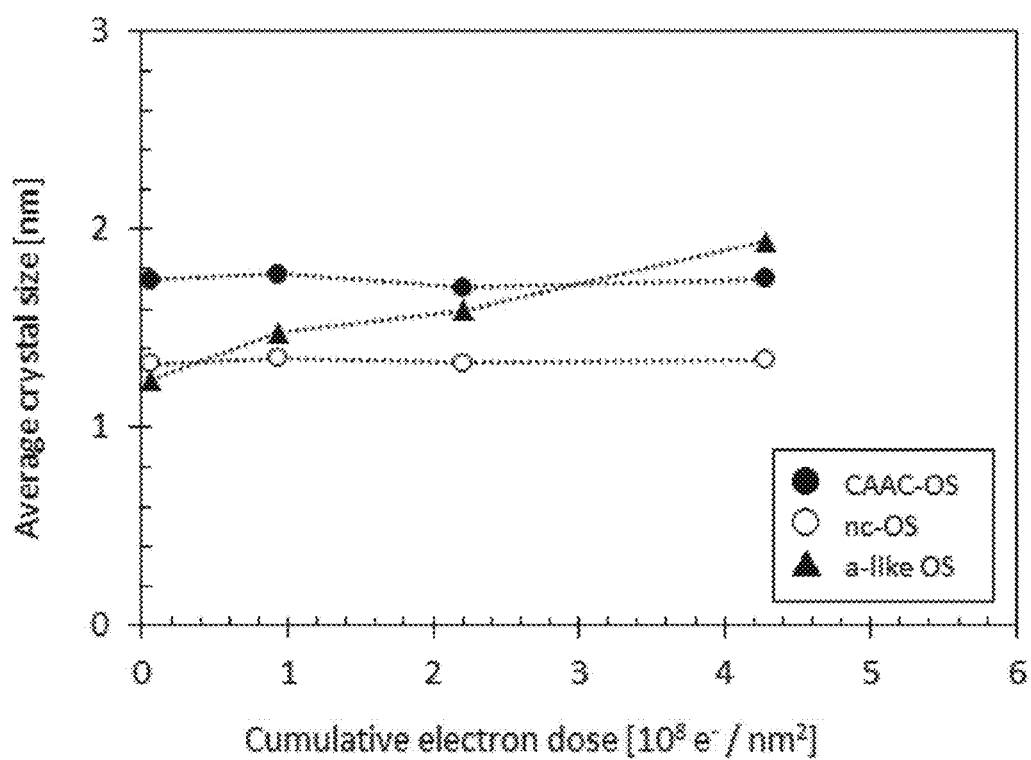
FIG. 52 shows change in crystal parts of an In—Ga—Zn oxide induced by electron irradiation.

FIG. 52 shows change in the average size of crystal parts (at 22 points to 30 points) in each sample. Note that the crystal part size corresponds to the length of a lattice fringe. FIG. 52 indicates that the crystal part size in the a-like OS increases with an increase in the cumulative electron dose in obtaining TEM images, for example. As shown in FIG. 52, a crystal part of approximately 1.2 nm (also referred to as an initial nucleus) at the start of TEM observation grows to a size of approximately 1.9 nm at a cumulative electron (e$^-$) dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. As shown in FIG. 52, the average size of crystal parts in an nc-OS and a CAAC-OS are approximately 1.3 nm and approximately 1.8 nm, respectively, regardless of the cumulative electron dose. For observation of electron beam irradiation and TEM, a Hitachi H-9000NAR transmission electron microscope was used. The conditions of electron beam irradiations are as follows: the accelerating voltage is 300 kV; the current density is $6.7 \times 10^5$ e$^-$/(nm$^2 \cdot$s); and the diameter of an irradiation region is 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to estimate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stack including two or more of an amorphous oxide semiconductor, an a-like OS, an nc-OS, and a CAAC-OS, for example.

This application is based on Japanese Patent Application serial no. 2015-245021 filed with Japan Patent Office on Dec. 16, 2015, the entire contents of which are hereby incorporated by reference.

What is claimed is:

1. A transistor comprising:
    a first oxide semiconductor layer;
    a second oxide semiconductor layer;
    a third oxide semiconductor layer;
    a first electrode;
    a second electrode;
    a third electrode;
    a first insulating layer; and
    a first layer,
    wherein the first oxide semiconductor layer has an island-like shape,
    wherein the second oxide semiconductor layer has an island-like shape,
    wherein the first oxide semiconductor layer and the second oxide semiconductor layer overlap with each other in a region,
    wherein the second oxide semiconductor layer comprises a first region, a second region, and a third region,
    wherein the third region is located between the first region and the second region,
    wherein the first electrode is located over the first region,
    wherein the second electrode is located over the second region,
    wherein the first layer does not cover a side surface of the first electrode on the third region side,
    wherein the first layer does not cover a side surface of the second electrode on the third region side, wherein the first layer comprises:
a region in contact with an upper surface of the first electrode;
a region in contact with a side surface of the first electrode on a side opposite to the third region side;
a region in contact with an upper surface of the second electrode; and
a region in contact with a side surface of the second electrode on a side opposite to the third region side,
wherein the third oxide semiconductor layer comprises:
a region overlapping with the first layer; and
a region in contact with the third region,
wherein the third oxide semiconductor layer covers a side surface of the second oxide semiconductor layer with the first layer located between the third oxide semiconductor layer and the side surface of the second oxide semiconductor layer,
wherein the first insulating layer is located over the third oxide semiconductor layer,
wherein the third electrode is located over the first insulating layer, and
wherein the third electrode comprises a region overlapping with the third region with the first insulating layer located between the region and the third region.

2. The transistor according to claim 1, wherein the first layer comprises a region in contact with the side surface of the second oxide semiconductor layer.

3. The transistor according to claim 1, wherein the first layer comprises a region in contact with a side surface of the first oxide semiconductor layer.

4. The transistor according to claim 1, further comprising:
a second insulating layer; and
a fourth electrode,
wherein the second insulating layer is located under the first oxide semiconductor layer,
wherein the fourth electrode is located under the second insulating layer, and
wherein the fourth electrode comprises a region overlapping with the third region with the second insulating layer located between the region and the third region.

5. The transistor according to claim 1, wherein a channel is formed in the third region.

6. The transistor according to claim 1, wherein the second oxide semiconductor layer comprises at least one of In and Zn.

7. The transistor according to claim 1, wherein the first oxide semiconductor layer and the third oxide semiconductor layer contain a metal element that is the same kind as at least one metal element contained in the second oxide semiconductor layer.

8. The transistor according to claim 1, wherein the first layer contains a metal element that is the same kind as at least one metal element contained in the second oxide semiconductor layer.

9. The transistor according to claim 1, wherein the first layer comprises an oxide semiconductor.

10. A semiconductor device comprising:
the transistor according to claim 1; and
a capacitor or a resistor.

11. An electronic device comprising:
the transistor according to claim 1; and
an antenna, a battery, an operation switch, a microphone, or a speaker.

12. A transistor comprising:
a first oxide semiconductor layer;
a second oxide semiconductor layer;
a third oxide semiconductor layer;
a first electrode; and
a first layer,
wherein the first oxide semiconductor layer and the second oxide semiconductor layer overlap with each other,
wherein the second oxide semiconductor layer comprises a first region, a second region, and a third region,
wherein the third region is located between the first region and the second region,
wherein the first electrode is located over the first region,
wherein the first layer does not cover a side surface of the first electrode on the third region side,
wherein the first layer comprises:
a region in contact with an upper surface of the first electrode; and
a region in contact with a side surface of the first electrode on a side opposite to the third region side,
wherein the third oxide semiconductor layer comprises:
a region overlapping with the first layer; and
a region in contact with the third region, and
wherein the third oxide semiconductor layer covers a side surface of the second oxide semiconductor layer with the first layer located between the third oxide semiconductor layer and the side surface of the second oxide semiconductor layer.

13. The transistor according to claim 12, wherein the first layer comprises a region in contact with the side surface of the second oxide semiconductor layer.

14. The transistor according to claim 12, wherein the first layer comprises a region in contact with a side surface of the first oxide semiconductor layer.

15. The transistor according to claim 12, wherein the second oxide semiconductor layer comprises at least one of In and Zn.

16. The transistor according to claim 12, wherein the first oxide semiconductor layer and the third oxide semiconductor layer contain a metal element that is the same kind as at least one metal element contained in the second oxide semiconductor layer.

17. The transistor according to claim 12, wherein the first layer contains a metal element that is the same kind as at least one metal element contained in the second oxide semiconductor layer.

18. The transistor according to claim 12, wherein the first layer comprises an oxide semiconductor.

19. A semiconductor device comprising:
the transistor according to claim 12; and
a capacitor or a resistor.

20. An electronic device comprising:
the transistor according to claim 12; and
an antenna, a battery, an operation switch, a microphone, or a speaker.

* * * * *